(12) United States Patent
Funatsuki et al.

(10) Patent No.: US 11,967,371 B2
(45) Date of Patent: Apr. 23, 2024

(54) SEMICONDUCTOR MEMORY DEVICE

(71) Applicant: Kioxia Corporation, Tokyo (JP)

(72) Inventors: Rieko Funatsuki, Yokohama (JP);
Takashi Maeda, Yokohama (JP);
Hidehiro Shiga, Yokohama (JP)

(73) Assignee: Kioxia Corporation, Tokyo (JP)

( * ) Notice: Subject to any disclaimer, the term of this patent is extended or adjusted under 35 U.S.C. 154(b) by 146 days.

(21) Appl. No.: 17/806,346

(22) Filed: Jun. 10, 2022

(65) Prior Publication Data

US 2023/0197148 A1 Jun. 22, 2023

(30) Foreign Application Priority Data

Dec. 22, 2021 (JP) ................................. 2021-208661

(51) Int. Cl.
| | |
|---|---|
| G11C 11/56 | (2006.01) |
| G11C 16/04 | (2006.01) |
| G11C 16/08 | (2006.01) |
| G11C 16/10 | (2006.01) |
| G11C 16/26 | (2006.01) |
| G11C 16/34 | (2006.01) |

(52) U.S. Cl.
CPC ...... *G11C 11/5642* (2013.01); *G11C 11/5628* (2013.01); *G11C 11/5671* (2013.01); *G11C 16/0483* (2013.01); *G11C 16/08* (2013.01); *G11C 16/10* (2013.01); *G11C 16/26* (2013.01); *G11C 16/3459* (2013.01)

(58) Field of Classification Search
CPC . G11C 16/3459; G11C 16/26; G11C 11/5628; G11C 11/5642

USPC .................................................... 365/185.03
See application file for complete search history.

(56) References Cited

U.S. PATENT DOCUMENTS

| | | | |
|---|---|---|---|
| 2003/0147278 A1 | 8/2003 | Tanaka et al. | |
| 2017/0271021 A1 | 9/2017 | Futatsuyama et al. | |
| 2017/0337969 A1* | 11/2017 | Shikata | G11C 11/5628 |
| 2018/0254087 A1* | 9/2018 | Yamaoka | G11C 16/3427 |
| 2018/0277565 A1* | 9/2018 | Futatsuyama | G11C 16/10 |
| 2019/0080772 A1 | 3/2019 | Yanagidaira | |

FOREIGN PATENT DOCUMENTS

| | | |
|---|---|---|
| JP | 2003-196988 A | 7/2003 |
| JP | 2017-168163 A | 9/2017 |
| JP | 2018-164070 A | 10/2018 |
| JP | 2019-53797 A | 4/2019 |

* cited by examiner

*Primary Examiner* — Anthan Tran
(74) *Attorney, Agent, or Firm* — Oblon, McClelland, Maier & Neustadt, L.L.P.

(57) ABSTRACT

A semiconductor memory device includes i first word lines connected to the i first memory cells, i second word lines connected to the i second memory cells, a driver capable of supplying voltage to each of the i first word lines and each of the i second word lines, and a logic control circuit controlling both a write operation including a verify operation and a read operation including a verify operation. In the semiconductor memory device, when an order of performing a sense operation for determining whether or not a threshold voltage of the k-th first memory cell has reached a j-th threshold voltage in the verify operation is different from that of in the read operation, a voltage applied to the k-th first word line in the verify operation is different from a voltage applied to the k-th first word line in the read operation.

14 Claims, 38 Drawing Sheets

FIG. 20

| state of memory cell transistor MT | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|
| verify operation | 1VR | 2VR | 3VR | 4VR | 5VR | 6VR | 7VR | 8VR | 9VR | AVR | BVR | CVR | DVR | EVR | FVR |
| sense operation order at the time of verify operation | …… | | | | | | can be all of 6 to 1 | | | | | | | 1 | 1 |
| example of sense operation order at the time of verify operation (continuous verify of verify operations 9VR to 7VR) | | | | | | | 3 | 2 | 1 | | | …… | | | |

FIG. 21

| state of memory cell transistor MT | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|
| read operation | 1R | 2R | 3R | 4R | 5R | 6R | 7R | 8R | 9R | AR | BR | CR | DR | ER | FR |
| sense operation order at the time of read operation — top page read operation | 4 |  | 3 |  |  |  | 2 |  |  |  |  |  | 1 |  |  |
| sense operation order at the time of read operation — upper page read operation |  | 4 |  |  |  |  |  | 3 |  | 2 |  | 1 |  |  |  |
| sense operation order at the time of read operation — middle page read operation |  |  |  | 4 |  | 3 |  |  | 2 |  |  |  |  |  | 1 |
| sense operation order at the time of read operation — lower page read operation |  |  |  |  | 3 |  |  |  |  |  | 2 |  |  | 1 |  |

1st operation period

2nd operation period

3rd operation period

4th operation period

5th operation period and 6th operation period

7th operation period

SEMICONDUCTOR MEMORY DEVICE

CROSS-REFERENCE TO RELATED APPLICATION(S)

This application is based upon and claims the benefit of priority from the prior Japanese Patent Application No. 2021-208661, filed on Dec. 22, 2021, the entire contents of which are incorporated herein by reference.

FIELD

Embodiments described herein relate generally to a semiconductor memory device.

BACKGROUND

A NAND flash memory is known as a non-volatile semiconductor memory device.

BRIEF DESCRIPTION OF DRAWINGS

FIG. 20 is a diagram showing an example of an order of a sense operation corresponding to a verify operation of a semiconductor memory device according to the first embodiment.

FIG. 21 is a diagram showing an example of an order of a sense operation corresponding to a read operation of a semiconductor memory device according to the first embodiment.

DETAILED DESCRIPTION

Figure 1:
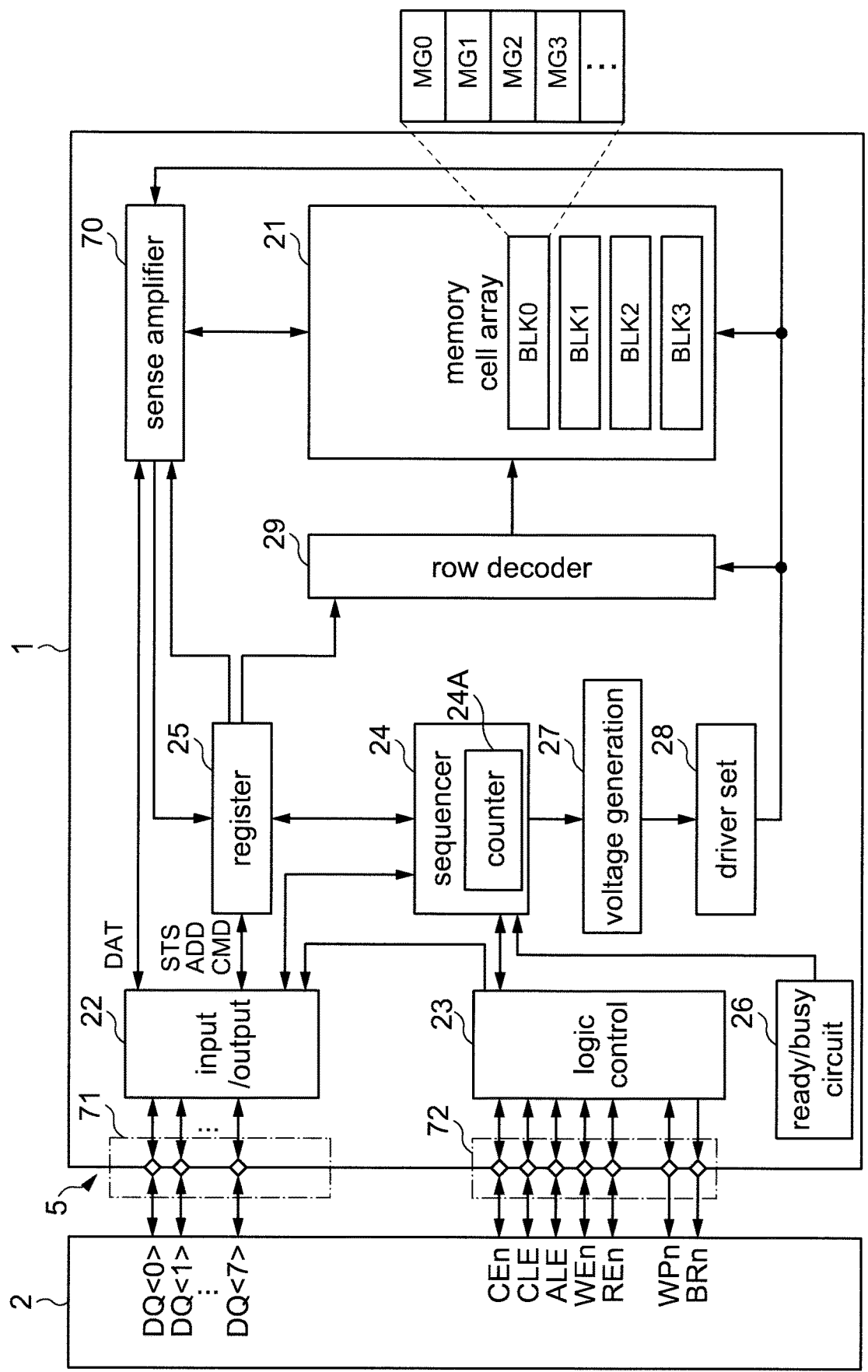
FIG. 1 is a block diagram showing a configuration of a memory system including a semiconductor memory device according to a first embodiment of the present invention.

It is an object of the present disclosure to provide a semiconductor memory device that enables suppressing erroneous reading of a memory cell.

A semiconductor memory device according to an embodiment includes a plurality of bit lines arranged in first direction and each of the plurality of bit lines extending in second direction intersecting the first direction, the plurality of bit lines including a first bit line, and a first semiconductor pillar extending in third direction intersecting the first direction and the second direction. The first semiconductor pillar has i first memory cells (i is an integer of 4 or more) arranged along the third direction at one side of the first semiconductor pillar in the second direction, electrically connected to the first bit line, electrically connected in series and each capable of being set at a threshold voltage of m or more (m is an integer of 4 or more), and i second memory cells arranged along the third direction at the other side of the first semiconductor pillar in the second direction, electrically connected in series and each capable of being set at a threshold voltage of m or more. In addition, the semiconductor memory device includes i first word lines stacked in the third direction and extending in first direction to be electrically connected to the i first memory cells, respectively, and i second word lines stacked in the third direction and extending in first direction to be electrically connected to the i second memory, respectively. In addition, the semiconductor memory device includes a driver capable of supplying voltage to each of the i first word lines and each of the i second word lines, and a logic control circuit capable of executing a write operation to the i first memory cells and the i second memory cells and a read operation to the i first memory cells and the i second memory cells. Moreover, in the semiconductor memory device, the write operation includes a plurality of loops, each loop includes a program operation and a verify operation, on executing the write operation to the k-th first memory cell (k is an integer smaller than i and larger than 1), in each loop, when an order of performing a sense operation for determining whether or not the threshold voltage of the k-th first memory cell has reached a j-th threshold voltage (j is an integer of 1 or more and m or less) in the verify operation is different from an order of performing the sense operation for determining whether or not the threshold voltage of the k-th first memory cell exceeds the j-th threshold voltage in the read operation, a first voltage is applied to the k-th first word line during the sense operation for the j-th threshold, and when the order of performing the sense operation for determining whether or not the threshold voltage of the k-th first memory cell has reached the j-th threshold voltage in the verify operation is the same with the order of performing the sense operation for determining whether or not the threshold voltage of the k-th first memory cell exceeds the j-th threshold voltage in the read operation, a second voltage different from the first voltage is applied to the k-th first word line during the sense operation for the j-th threshold voltage.

Hereinafter, referring to the drawings, a semiconductor memory device according to an embodiment will be described. In the following description, components having the same or similar functions and configurations are denoted by common reference numerals. When distinguishing multiple components having a common reference numeral, the common reference numeral is distinguished by a subscript (e.g., uppercase or lowercase alphabet, number, hyphens and uppercase letters and numbers).

In the following description, a signal X<n:0> (n is a natural number) is a (n+1) bits signal, and means a set of signals X<0>, X<1>, ..., and X<n>, each of which is a 1-bit signal. A component Y<n:0> means a set of components Y<0>, Y<1>, ..., and Y<1> corresponding one-to-one to an input or output of the signal X<0>.

First Embodiment

Hereinafter, a semiconductor memory device 1 according to the first embodiment will be described.

1. Configuration Example 1-1-1. Memory System

FIG. 1 is a block diagram showing an example of a configuration of a memory system 3 including the semiconductor memory device 1 according to the first embodiment. As shown in FIG. 1, the memory system 3 includes the semiconductor memory device 1 and a memory controller 2. The memory system 3 may be, for example, an SSD (solid state drive) or a memory card such as an SD™ card, or the like. The memory system 3 may include a host device (not shown).

The semiconductor memory device 1 is connected to, for example, the memory controller 2. The semiconductor memory device 1 is controlled using the memory controller 2. The memory controller 2 receives, for example, an instruction required for the operation of the semiconductor memory device 1 from the host device and transmits the instruction to the semiconductor memory device 1. The memory controller 2 transmits the instruction to the semiconductor memory device 1 and controls reading of data from the semiconductor memory device 1, writing of data to the semiconductor memory device 1, or erasing of data in the semiconductor memory device 1. In an embodiment, the semiconductor memory device 1 is, for example, a NAND flash memory.

1-1-2. Configuration of Semiconductor Memory Device

As shown in FIG. 1, the semiconductor memory device 1 includes a memory cell array 21, an input/output circuit 22, a logic control circuit 23, a sequencer 24, a register 25, a ready/busy control circuit 26, a voltage generation circuit 27, a driver set 28, a row decoder 29, a sense amplifier 70, an input/output pad group 71, and a logic control pad group 72. In the semiconductor memory device 1, various operations such as a write operation for storing the write data DAT in the memory cell array 21 and a read operation for reading the read data DAT from the memory cell array 21, and the like are executed.

The memory cell array 21 is connected to, for example, the sense amplifier 70, the row decoder 29, and the driver set 28. The memory cell array 21 includes blocks BLK0, BLK1, ..., BLKn (n is an integer higher than or equal to 1). As will be described in detail later, each of the blocks BLK includes a plurality of memory groups MG (MG0, MG1, MG2, ...). Each of the memory groups MG contains a plurality of non-volatile memory cells associated with a bit line and a word line. The block BLK is, for example, an erasure unit of data. The data held in the memory cell transistors MT (FIG. 2) included in the same block BLK is collectively erased.

In the semiconductor memory device 1, for example, a QLC (Quadruple Level Cell) method can be applied. In the QLC method, 4-bit data is held in each memory cell. Each memory cell may hold 3-bit data (8 levels), 2-bit data (4 levels) or less or 5-bit data or more.

The input/output circuit 22 is connected to, for example, the register 25, the logic control circuit 23, and the sense amplifier 70. The input/output circuit 22 controls the transmission and reception of a data signal DQ<7:0> between the memory controller 2 and the semiconductor memory device 1.

The data signal DQ<7:0> is an 8-bit signal. The data signal DQ<7:0> is an entity of data transmitted and received between the semiconductor memory device 1 and the memory controller 2. The data signal DQ<7:0> includes a command CMD, data DAT, address information ADD, and status information STS. The command CMD includes, for example, an instruction for executing the instruction sent from the host device (the memory controller 2) to the semiconductor memory device 1. The data DAT includes the write data DAT to the semiconductor memory device 1 or the read data DAT from the semiconductor memory device 1. The address information ADD includes, for example, a column address and a row address for selecting the plurality of non-volatile memory cells associated with the bit line and the word line. The status information STS includes, for example, information on the status of the semiconductor memory device 1 regarding the write operation and the read operation.

Specifically, the input/output circuit 22 includes an input circuit and an output circuit which perform the processing described below. The input circuit receives the write data DAT, the address information ADD, and the command CMD from the memory controller 2. The input circuit transmits the received write data DAT to the sense amplifier 70 and transmits the received address information ADD and the command CMD to the register 25. On the other hand, the output circuit receives the status information STS from the register 25 and receives the read data DAT from the sense amplifier 70. The output circuit transmits the received status information STS and the read data DAT to the memory controller 2.

The logic control circuit 23 is connected to, for example, the memory controller 2 and the sequencer 24. The logic control circuit 23 receives, for example, a chip enable signal CEn, a command latch enable signal CLE, an address latch enable signal ALE, a write enable signal WEn, a read enable signal REn, and a write protect signal WPn from the memory controller 2. The logic control circuit 23 controls the input/output circuit 22 and the sequencer 24 based on the receiving signal.

The chip enable signal CEn is a signal for enabling the semiconductor memory device 1. The command latch enable signal CLE is a signal for notifying the input/output circuit 22 that the signal DQ input to the semiconductor memory device 1 is the command CMD. The address latch enable signal ALE is a signal for notifying the input/output circuit 22 that the signal DQ input to the semiconductor memory device 1 is the address data ADD. The write enable signal WEn and the read enable signal REn are, for example, signals for instructing the input and output of the data signal DQ to the input/output circuit 22. The write protect signal WPn is a signal for instructing the semiconductor memory device 1 to prohibit writing and erasing of data.

The sequencer 24 is connected to, for example, the ready/busy control circuit 26, the sense amplifier 70, and the driver set 28. The sequencer 24 controls the operation of the entire semiconductor memory device 1 based on the command CMD held in a command register. For example, the sequencer 24 controls the sense amplifier 70, the row decoder 29, the voltage generation circuit 27, and the driver set 28, etc., to execute various operations such as the write operation and the read operation. In addition, although the details will be described later, the sequencer 24 has a counter circuit 24A, counts an order of the verify operation (what number of the verify operation is the verify operation in a program loop) for each program loop, and recognizes the order of the verify operation. Further, although the details will be described later, the sequencer 24 uses the internal signal generated in the sequencer 24 to recognize which states of the verify operation started at that time, and the sequencer 24 uses a table in the sequencer 24 to recognize the order of the state of the verify operation started at that time.

The register 25 includes, for example, a status register (not shown), an address register (not shown), and a command register (not shown) and the like. The status register receives and holds the status information STS from the sequencer 24 and transmits the status information STS to the input/output circuit 22 based on an instruction from the sequencer 24. The address register receives and holds the address information ADD from the input/output circuit 22. The address register transmits the column address in the address information ADD to the sense amplifier 70 and transmits the row address in the address information ADD to the row decoder 29. The command register receives and holds the command CMD from the input/output circuit 22 and transmits the command CMD to the sequencer 24.

The ready/busy control circuit 26 generates a ready/busy signal R/Bn under the control of the sequencer 24 and transmits the generated ready/busy signal R/Bn to the memory controller 2. The ready/busy signal R/Bn is a signal for notifying whether the semiconductor memory device 1 is in a ready state to accept an instruction from the memory controller 2 or in a busy state to not accept an instruction from the memory controller 2.

The voltage generation circuit 27 is connected to, for example, the driver set 28 or the like. The voltage generation circuit 27 generates a voltage used for the write operation and the read operation or the like based on the control by the sequencer 24 and supplies the generated voltage to the driver set 28.

Figure 7:
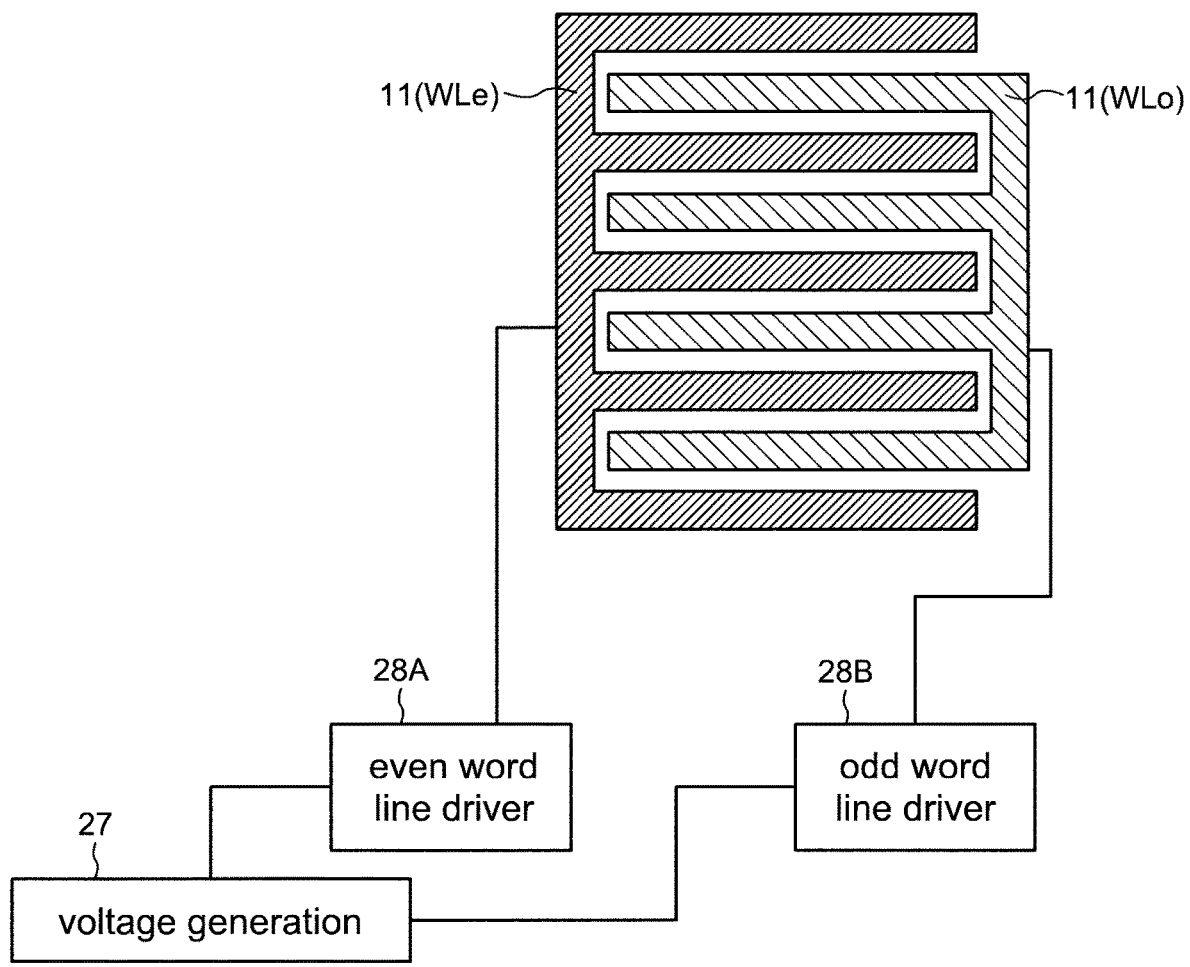
FIG. 7 is a diagram for explaining electric connections of a voltage generation circuit, a driver set, a select gate line, or a word line according to the first embodiment.

The driver set 28 includes, for example, an even word line driver 28A (FIG. 7) and an odd word line driver 28B (FIG. 7). The driver set 28 is connected to the memory cell array 21, the sense amplifier 70, and the row decoder 29. Based on the voltage supplied from the voltage generation circuit 27, the driver set 28 generates, for example, various voltages to be applied to a select gate line SGD (FIG. 2), a word line WL (FIG. 2), and a source line SL (FIG. 2) or the like in various operations such as the read operation and write operation. The driver set 28 supplies the generated voltage to the even word line driver 28A, the odd word line driver 28B, the sense amplifier 70, the row decoder 29, and the source line SL, or the like.

The row decoder 29 receives the row address from the address register and decodes the received row address. Based on the decoded result, the row decoder 29 selects the block BLK on which various operations such as the read operation and write operation are to be executed. The row decoder 29 can supply the selected block BLK with the voltage supplied from the driver set 28.

The sense amplifier 70 receives, for example, the column address from the address register and decodes the received column address. The sense amplifier 70 executes the transmission and reception operation of the data DAT between the memory controller 2 and the memory cell array 21 based on the decoded result. The sense amplifier includes, for example, a sense amplifier unit (not shown) provided for each bit line. The sense amplifier 70 makes it possible to supply a voltage to a bit line BL by using the sense amplifier unit. For example, the sense amplifier 70 may use the sense amplifier unit to supply a voltage to the bit line. The sense amplifier 70 senses the data read from the memory cell array 21 and generates the read data DAT. Furthermore, the sense amplifier 70 transmits the generated read data DAT to the memory controller 2 via the input/output circuit 22. Further, the sense amplifier 70 receives the write data DAT from the memory controller 2 via the input/output circuit 22. Further, the sense amplifier transmits the received write data DAT to the memory cell array 21.

The input/output pad group 71 transmits the data signal DQ<7:0> received from the memory controller 2 to the input/output circuit 22. The input/output pad group 71 transmits the data signal DQ<7:0> received from the input/output circuit 22 to the memory controller 2.

The logic control pad group 72 transfers the chip enable signal CEn, the command latch enable signal CLE, the address latch enable signal ALE, the write enable signal WEn, and the read enable signal REn received from the memory controller 2 to the logic control circuit 23. The logic control pad group 72 transfers the ready/busy signal R/Bn received from the ready/busy control circuit 26 to the memory controller 2.

1-1-3. Memory Cell Array

Figure 2:
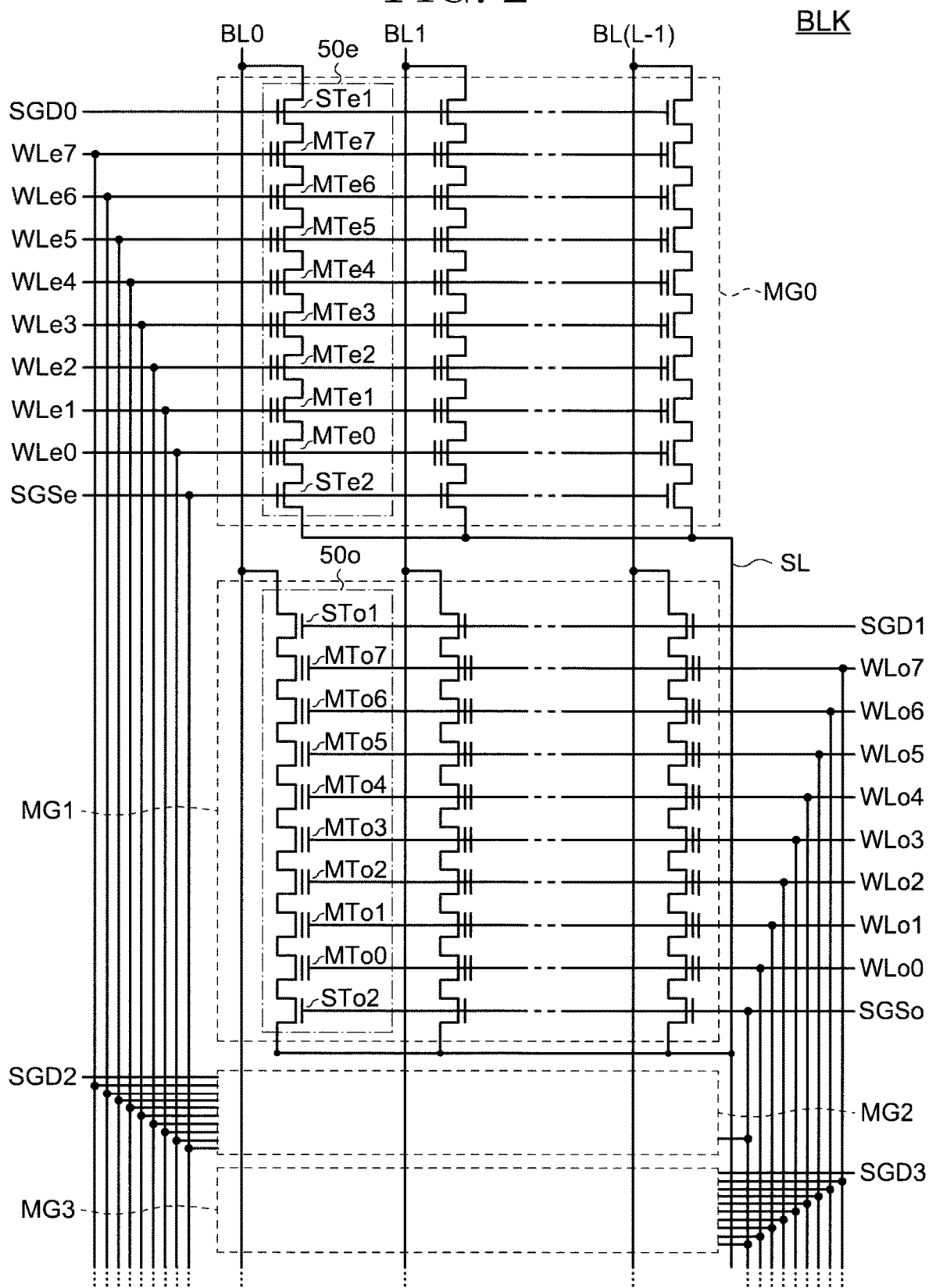
FIG. 2 is a diagram showing a circuit configuration of a memory cell array in a semiconductor memory device according to the first embodiment.

FIG. 2 shows an example of a circuit configuration of the memory cell array 21 shown in FIG. 1. FIG. 2 is a diagram showing a circuit configuration of one block BLK among a plurality of blocks BLK included in the memory cell array 21. For example, each of the plurality of blocks BLK included in the memory cell array 21 has the circuit configuration shown in FIG. 2. In the description of FIG. 2, descriptions of the same or similar components as those of FIG. 1 may be omitted.

As shown in FIG. 2, the block BLK includes the plurality of memory groups MG (MG0, MG1, MG2, MG3). In an embodiment, each of the memory groups MG includes a plurality of NAND strings 50. For example, the memory groups MG0 and MG2 include a plurality of NAND strings 50e, and the memory groups MG1 and MG3 include a plurality of NAND strings 50o.

Each of the NAND strings 50 includes, for example, eight memory cell transistors MT (MT0 to MT7) and select transistors ST1 and ST2. The memory cell transistor MT includes a control gate and a charge storage layer to hold the data in a non-volatile manner. The memory cell transistor MT is connected in series between the source of the select transistor ST1 and a drain of the select transistor ST2.

Gates of the select transistor ST1 in each of the memory groups MG are respectively connected to the select gate lines SGD (SGD0, SGD1, . . . ). The select gate line SGD is independently controlled by the row decoder 29. Gates of the select transistor ST2 in each of even-numbered memory groups MGe (MG0, MG2, . . . ) are connected to, for example, even select gate lines SGSe. Gates of the select transistor ST2 in each of odd-numbered memory groups MGo (MG1, MG3, . . . ) are connected to, for example, odd select gate lines SGSo. The even select gate line SGSe and the odd select gate line SGSo may be connected to each other and controlled similarly, for example. The even select gate line SGSe and the odd select gate line SGSo may be provided independently and can be controlled independently, for example.

The control gates of the memory cell transistors MT (MT0 to MT7) included in the memory groups MGe in the same block BLK are respectively commonly connected to word lines WLe (WLe0 to WLe7). The control gates of the memory cell transistors MT (MT0 to MT7) included in the memory groups MGo in the same block BLK are respectively commonly connected to word lines WLo (WLo0 to WLo7). The select gate line WLe and the select gate line WLo are independently controlled by the row decoder 29.

Each memory group MG includes a plurality of pages corresponding to a plurality of word line WLs. For example, in the memory group MG0 or the memory group MG2, a plurality of memory cell transistors MT in which a control gate is commonly connected to any of the even word lines WLe0 to WLe7 correspond to the page. Further, in the memory group MG1 or the memory group MG3, a plurality of memory cell transistors MT in which a control gate is commonly connected to any one of odd word lines WLo0 to WLo7 correspond to a page. The write operation and the read operation are executed in units of pages.

A drain of the select transistor ST1 of the NAND string 50 in the same column in the memory cell array 21 is commonly connected to the bit lines BL (BL0 to BL (L-1), where (L-1) is a natural number of 2 or higher). That is, the bit line BL is commonly connected to the NAND string 50 among the plurality of memory groups MG. The source of the plurality of select transistors ST2 is commonly connected to the source line SL. The source line SL is electrically connected to the driver set 28, for example. Under the control of the voltage generation circuit 27 and the driver set 28 using the sequencer 24, the source line SL is supplied with a voltage from the voltage generation circuit 27 or the driver set 28. The semiconductor memory device 1 according to an embodiment may include a plurality of source lines SL. For example, each of the plurality of source lines SL is electrically connected to the driver set 28. Under the control of the voltage generation circuit 27 and the driver set 28 using the sequencer 24, each of the plurality of source lines SL may be supplied with different voltages from each other from the voltage generation circuit 27 or the driver set 28.

The memory group MG includes the plurality of NAND strings 50 connected to different bit lines BL and to the same select gate line SGD. The block BLK includes the plurality of memory groups MG sharing the word line WL. The memory cell array 21 includes a plurality of blocks BLK sharing the bit line BL. In the memory cell array 21, the above-described select gate line SGS, the word line WL, and the select gate line SGD are stacked on a source wire layer, and the memory cell transistor MT is three-dimensionally laminated in three dimensions.

1-1-4. Planar Layout of Memory Cell Array

Figure 3:
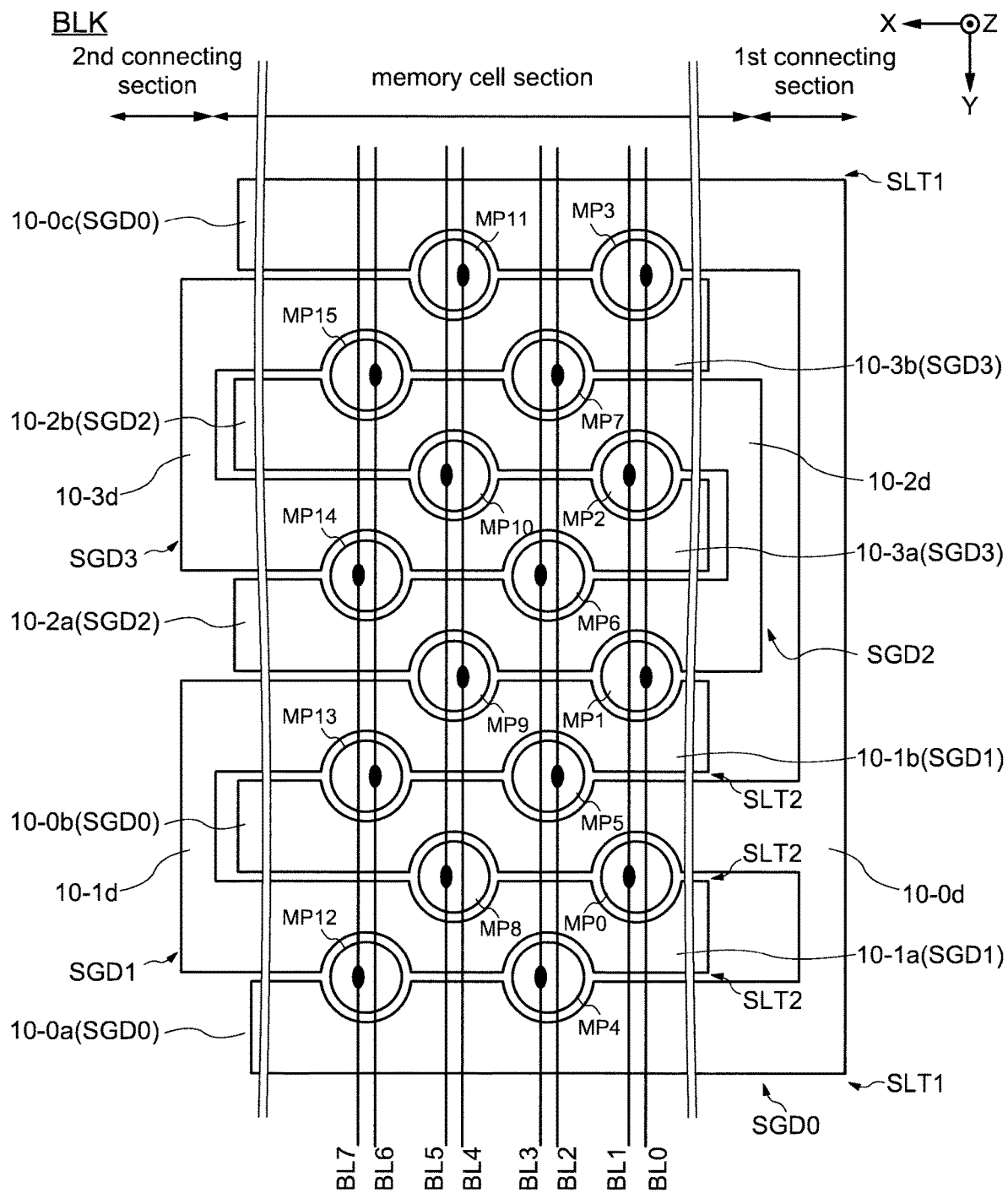
FIG. 3 is a diagram showing a planar layout of a select gate line, a bit line, and a memory pillar according to the first embodiment.

FIG. 3 is a diagram showing a planer layout of the select gate line SGD in a plane parallel to the source wire layer of a block BLK (X-Y plane). As shown in FIG. 3, in the semiconductor memory device 1, for example, four select gate lines SGD are included in one block BLK. In the description of FIG. 3, descriptions of the same or similar components as those of FIG. 1 and FIG. 2 may be omitted.

As shown in FIG. 3, in the semiconductor memory device 1 according to an embodiment, for example, three wiring layers 10-0a, 10-0b, and 10-0c extending in the X-direction are connected using a first connecting section 10-0d extending in the Y-direction. The wiring layer and the wiring layer 10-0c are located at both ends in the Y-direction. The wiring layer 10-0a and the wiring layer 10-0b are adjacent to each other in the Y-direction with one other wiring layer (a wiring layer 10-1a) sandwiched between them. The first connecting section 10-0d is located at one end in the X-direction. Three wiring layers 10-0a, 10-0b, and 10-0c function as the select gate line SGD0. In an embodiment, for example, the Y-direction is a direction orthogonal to or substantially orthogonal to the X-direction.

The wiring layer 10-1a and a wiring layer 10-1b extending in the X-direction are connected using a second connecting section 10-1d extending in the Y-direction. The wiring layer 10-1a is located between the wiring layer 10-0a and the wiring layer 10-0b. The wiring layer 10-1b is located between the wiring layer 10-0b and the other one wiring layer (a wiring layer 10-2a). The second connecting section 10-1d is located at the other end opposite to the first connecting section 10-0d in the X-direction. Two wiring layers 10-1a and 10-1b function as the select gate line SGD1.

The wiring layer 10-2a and a wiring layer 10-2b extending in the X-direction are connected by a first connecting section 10-2d extending in the Y-direction. Similarly, a wiring layer 10-3a and a wiring layer 10-3b extending in the X-direction are connected by a second connecting section 10-3d extending in the Y-direction. The wiring layer 10-2a is located between the wiring layer 10-1b and the wiring layer 10-3a. The wiring layer 10-3a is located between the wiring layer 10-2a and the wiring layer 10-2b. The wiring layer 10-2b is located between the wiring layer 10-3a and the wiring layer 10-3b. The wiring layer 10-3b is located between the wiring layer 10-2b and the wiring layer 10-0c. The first connecting section 10-2d is located at one end on the same side as the first connecting section 10-0d in the X-direction. The second connecting section 10-3d is located at the other end opposite to the first connecting section 10-0d in the X-direction. Two wiring layers 10-2a, function as a select gate line SGD2. Two wiring layers 10-3a, function as a select gate line SGD3.

In the first embodiment, a configuration wherein each wiring layer is connected using the first connecting section 10-0d and the first connecting section 10-2d, or the second connecting section 10-1d and the second connecting section 10-3d is exemplified but is not limited to the configuration shown in the first embodiment. For example, each wiring layer is independent and may be controlled so that the same voltage is supplied to the wiring layer 10-0a, the wiring layer 10-0b, and the wiring layer 10-0c, the same voltage is supplied to the wiring layer a and the wiring layer 10-1b, the same voltage is supplied to the wiring layer 10-2a and the wiring layer 10-2b, and the same voltage is supplied to the wiring layer 10-3a and the wiring layer 10-3b.

The wiring layers 10 adjacent to each other in the Y-direction in the block BLK are insulated. An area that insulates the adjacent wiring layers 10 is referred to as a slit SLT2. In the slit SLT2, for example, an area from a plane parallel to the source wire layer to the layer where at least the wiring layer 10 is provided is embedded using an insulating film (not shown). In the memory cell array 21, for example, the plurality of blocks BLK shown in FIG. 3 is arranged in the Y-direction. Similar to the adjacent wiring layers 10 in the Y-direction in the block BLK, the space between the adjacent blocks BLK in the Y-direction is embedded using an insulating film (not shown). The space between the adjacent blocks BLK in the Y-direction are also insulated. An area for insulating the adjacent blocks BLK is referred to as a slit SLT1. Similar to the slit SLT2, in the slit SLT1, the insulating film embeds an area from the plane parallel to the source wire layer to the layer where at least the wiring layer 10 is provided.

A plurality of memory pillars MP (MP0 to MP15) is provided between the adjacent wiring layers 10 in the Y-direction. The plurality of memory pillars MP is provided in a memory cell. Each of the plurality of memory pillars MP is provided along the Z-direction. In the first embodiment, for example, the Z-direction is a direction orthogonal to or substantially orthogonal to the XY-direction, and orthogonal to or substantially orthogonal to the plane parallel to the source wire layer. In the first embodiment, the memory pillar MP may be referred to as a "semiconductor pillar", the X direction may be referred to as the "first direction", the Y direction may be referred to as the "second direction", and the Z direction may be referred to as the "third direction".

Specifically, the memory pillar MP4 and the memory pillar MP12 are provided between the wiring layer 10-0a and the wiring layer 10-1a. The memory pillar MP0 and the memory pillar MP8 are provided between the wiring layer 10-1a and the wiring layer 10-0b. The memory pillar MP5 and the memory pillar MP13 are provided between the wiring layers 10-1b. The memory pillar MP1 and the memory pillar MP9 are provided between the wiring layer 10-1b and the wiring layer 10-2a. The memory pillar MP6 and the memory pillar MP14 are provided between the wiring layer 10-2a and the wiring layer 10-3a. The memory pillar MP2 and the memory pillar MP10 are provided between the wiring layer 10-3a and the wiring layer 10-2b. The memory pillar MP7 and the memory pillar MP15 are provided between the wiring layer 10-2b and the wiring layer 10-3b. The memory pillar MP3 and the memory pillar MP11 are provided between the wiring layer 10-3b and the wiring layer 10-0c.

The memory pillar MP is a structure forming the select transistor ST1, the select transistor ST2, and the memory cell transistor MT. A detailed structure of the memory pillar MP will be described later.

The memory pillars MP0 to MP3 are arranged along the Y-direction. The memory pillars MP8 to MP11 are arranged along the Y-direction at positions adjacent to the memory pillars MP0 to MP3 in the X-direction. That is, the memory pillars MP0 to MP3 and the memory pillars MP8 to MP11 are arranged in parallel.

The respective memory pillars MP4 to MP7 and MP12 to MP15 are arranged along the Y-direction. The memory pillars MP4 to MP7 are located in the X-direction between the memory pillars MP0 to MP3 and the memory pillars MP8 to MP11. The memory pillars MP12 to MP15 are located in the X-direction so as to sandwich the memory pillars MP8 to MP11 together with the memory pillars MP4 to MP7. That is, the memory pillars MP4 to MP7 and the memory pillars MP12 to MP15 are arranged in parallel.

Two bit lines BL0 and BL1 are provided above the memory pillars MP0 to MP3. The bit line BL0 is commonly connected to the memory pillars MP1 and MP2. The bit line BL1 is commonly connected to the memory pillars MP0 and MP3. Two bit lines BL2 and BL3 are provided above the memory pillars MP4 to MP7. The bit line BL2 is commonly connected to the memory pillars MP4 and MP5. The bit line BL3 is commonly connected to the memory pillars MP6 and MP7.

Above the memory pillars MP8 to MP11, two bit lines BL4 and BL5 are provided. The bit line BL4 is commonly connected to the memory pillars MP9 and MP10. Above the memory pillars MP12 to MP15, two bit lines BL6 and BL7 are provided. The bit line BL6 is commonly connected to the memory pillars MP12 and MP13. The bit line BL7 is commonly connected to the memory pillars MP14 and MP15.

As described above, the memory pillar MP is provided at the position straddling the two wiring layers 10 in the Y-direction. The memory pillar MP is provided so as to be embedded in a part of one slit SLT2 of the plurality of slits SL2. One slit SLT2 is provided between the memory pillars MP adjacent to each other in the Y-direction.

The memory pillar MP is not provided between the wiring layer 10-0a and the wiring layer 10-0b adjacent to each other with the slit SLT1 sandwiched therebetween.

Figure 4:
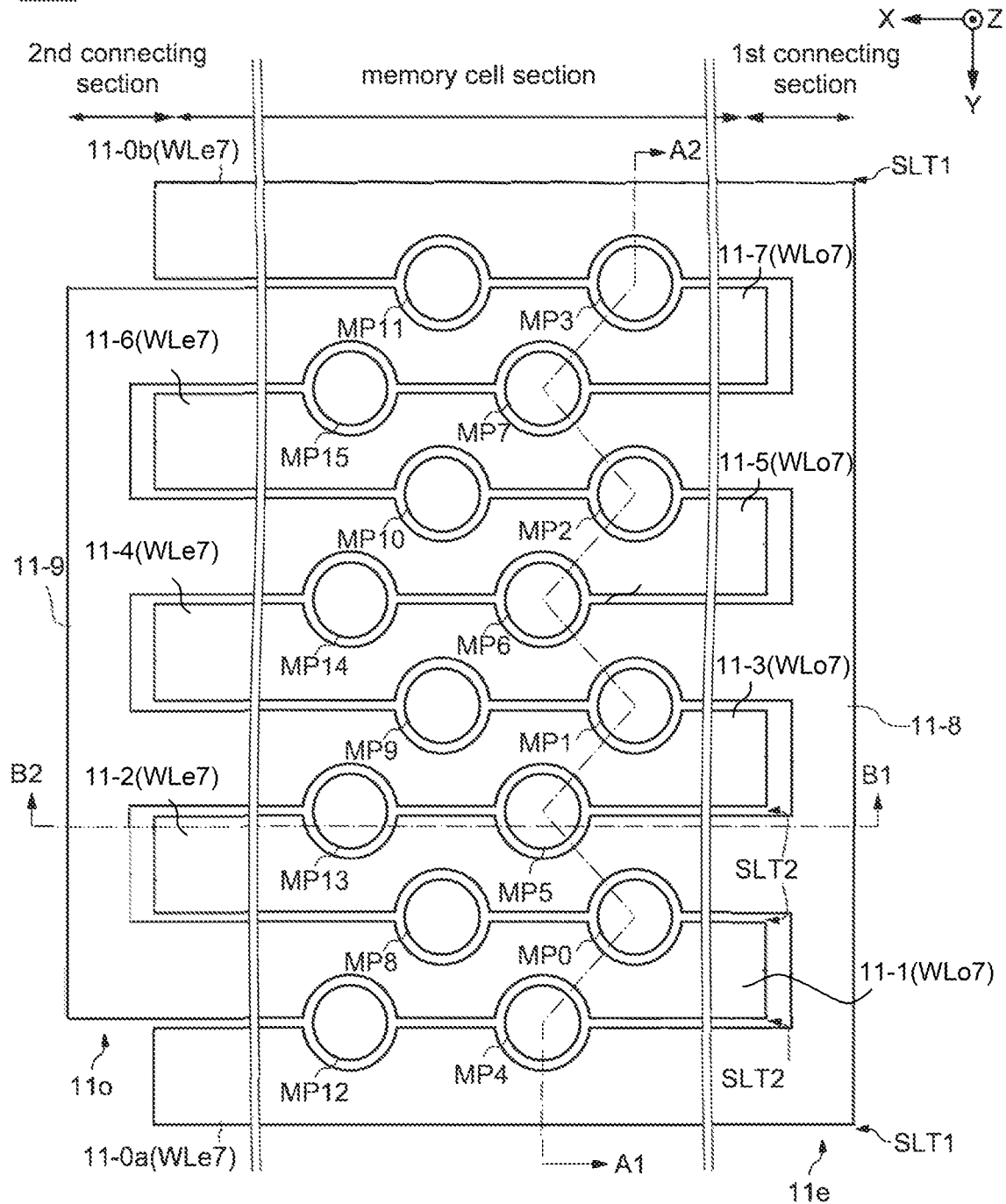
FIG. 4 is a diagram showing a planar layout of a word line and a memory pillar according to the first embodiment.

FIG. 4 is a diagram showing a planar layout of the word lines WL in the X-Y plane. The layout shown in FIG. 4 corresponds to the layout of an area for one block in FIG. 3 and is a layout of a wiring layer 11 provided in a lower layer than the wiring layer 10 shown in FIG. 3. In the example of the plane layout shown in FIG. 3 and FIG. 4, although only eight bit lines (bit lines BL0 to BL7) are shown, for example, a number of bit lines corresponding to a data length of 4 kByte, a data length of 8 kByte, or a data length of 16 kByte may be provided, and the number of bit lines is not particularly limited. In the description of FIG. 4, descriptions of the same or similar components as those of FIGS. 1 to 3 may be omitted.

As shown in FIG. 4, nine wiring layers 11 (wiring layers 11-0 to wiring layer 11-7, where the wiring layer 11-0 includes a wiring layer 11-0a and a wiring layer 11-0b) extending in the X-direction are arranged along the Y-direction. Each wiring layer 11-0 to 11-7 is arranged in the below layer of each wiring layer 10-0 to 10-7 in the Z-direction. Insulating films are provided between the wiring layers 11-0 to 11-7 and the wiring layers 10-0 to 10-7. The wiring layers 11-0 to 11-7 and the wiring layers 10-0 to 10-7 are insulated from each other.

The wiring layer 11 functions as a word line WL7. Other word lines WL0 to WL6 have the same configuration and function as the word line WL7. In the example shown in FIG. 4, the wiring layer 11-0a, the wiring layer 11-2, the wiring layer 11-4, the wiring layer 11-6, and the wiring layer 11-0b function as the word line WLe7. The wiring layer 11-0a, the wiring layer 11-2, the wiring layer 11-4, the wiring layer 11-6, and the wiring layer 11-0b are connected using a first connect 11-8 extending in the Y-direction. The first connect 11-8 is provided at one end in the X-direction. In the first connect 11-8, the wiring layer 11-0a, the wiring layer 11-2, the wiring layer 11-4, the wiring layer 11-6, and the wiring layer 11-0b are connected to the row decoder 29. In an embodiment, the first connect 11-8 and the wiring layer 11-0a, the wiring layer 11-2, the wiring layer 11-4, the wiring layer 11-6, and the wiring layer 11-0b may be collectively referred to as a wiring layer 11e.

The wiring layer 11-1, the wiring layer 11-3, the wiring layer 11-5, and the wiring layer 11-7 function as the word line WLo7. The wiring layer 11-1, the wiring layer 11-3, the wiring layer 11-5, and the wiring layer 11-7 are connected using a second connect 11-9 extending in the Y-direction. The second connect 11-9 is provided on the other end opposite to the first connect 11-8 in the X-direction. In the second connect 11-9, the wiring layer 11-1, the wiring layer 11-3, the wiring layer 11-5, the wiring layer 11-7 are connected to the row decoder 29. In an embodiment, the second connect 11-9 and the wiring layer 11-1, the wiring layer 11-3, the wiring layer 11-5, and the wiring later 11-7 may be collectively referred to as a wiring layer 11o.

A memory cell is provided between the first connect 11-8 and the second connect 11-9. In the memory cell, the wiring layers 11 adjacent to each other in the Y-direction are isolated by the slit SLT2 shown in FIG. 3. The wiring layers 11 between the blocks BLK adjacent to each other in the Y-direction are isolated by the slit SLT1, as is the slit SLT2. The memory cell portion includes the memory pillars MP0 to MP15 as in FIG. 3.

The select gate line SGS and the word lines WL0 to WL6 have the same configuration as the word line WL7 shown in FIG. 4.

1-1-5. Structure of End of a Cutting Area of Memory Cell Array

Figure 5:
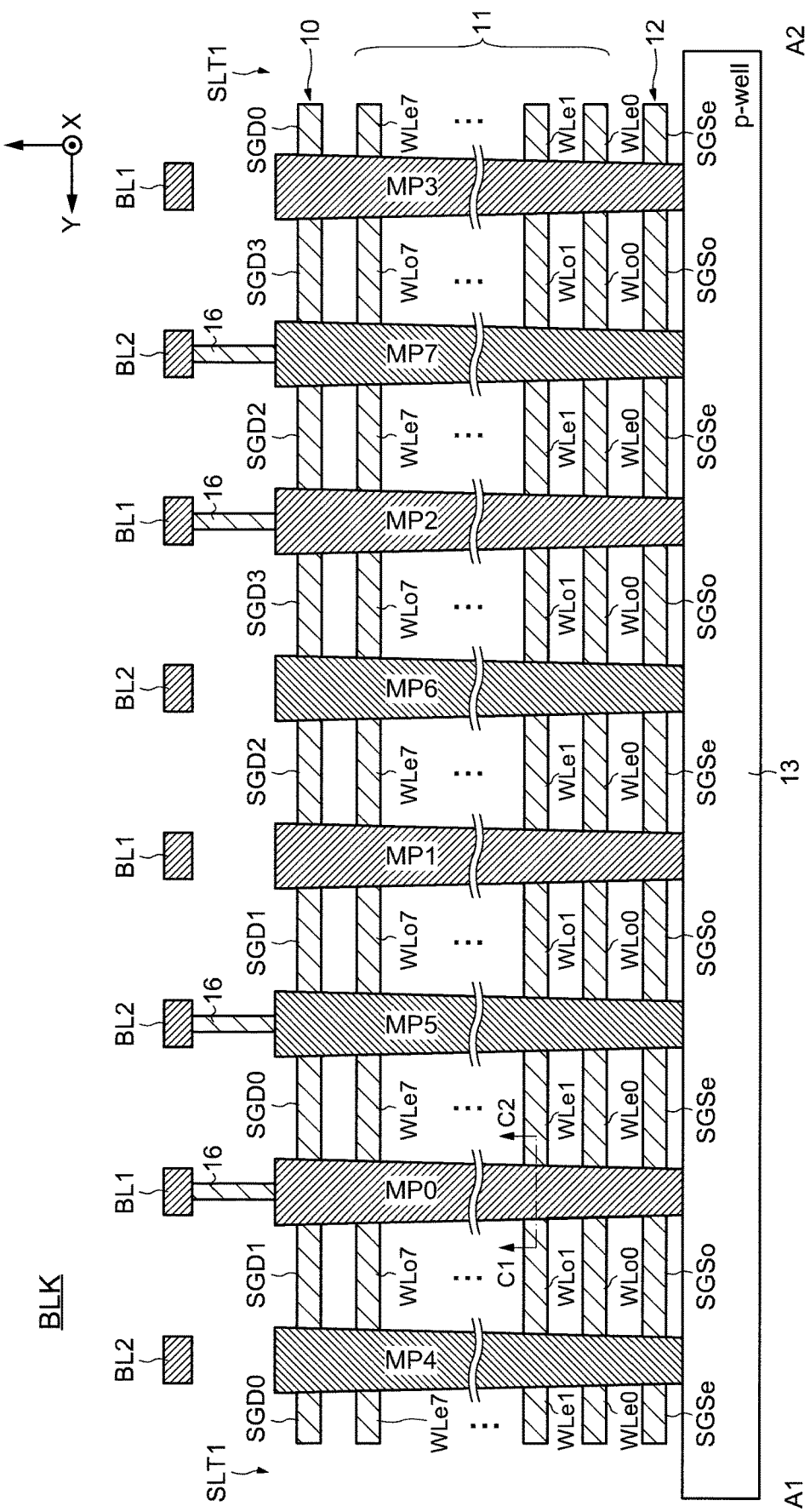
FIG. 5 is a cut end view along A1-A2 of a semiconductor memory device shown in FIG. 4.

FIG. 5 is a diagram showing an end view of a cutting area A1-A2 shown in FIG. 4. In the description of FIG. 5, descriptions of the same or similar components as those of FIGS. 1 to 4 may be omitted.

As shown in FIG. 5, a wiring layer 12 is provided above a p type-well area (p-well) of a semiconductor substrate 13 along the Z-direction. The semiconductor substrate 13 functions as the source line SL. The wiring layer 12 functions as the select gate line SGS. Eight wiring layers 11 are laminated over the wiring layer 12 along the Z-direction. The wiring layer 11 functions as the word line WL. Eight wiring layers 11 correspond one-to-one to the word lines WL0 to WL7. FIG. 4 is a diagram showing a planar layout of the wiring layer 11 functioning as the word line WL, FIG. 3 is a diagram showing a planar layout of the wiring layer 10 functioning as the select gate line SGD. A planar layout of the wiring layer 12 functioning as the select gate line SGS, for example, is a layout that the wiring layer 10 functioning as the select gate line SGD shown in FIG. 3 is replaced with the wiring layer 12 functioning as the select gate line SGS.

The wiring layer 12 functions as the even select gate line SGSe or the odd select gate line SGSo. The even select gate line SGSe and the odd select gate line SGSo are alternately arranged in the Y-direction through a slit SY2. The memory pillar MP is provided between the even select gate line SGSe and the odd select gate line SGSo which are adjacent to each other in the Y-direction.

The wiring layer 11 functions as an even word line WLe or an odd word line WLo. The even word line WLe and the odd word line WLo are alternately arranged in the Y-direction through the slit SY2. The memory pillar MP is provided between the even word line WLe and the odd word line WLo adjacent to each other in the Y-direction. The Memory cells described later are provided between the memory pillar MP and the even word line WLe and between the memory pillar MP and the odd word line WLo.

The slit SLT1 is provided between the blocks BLK adjacent to each other in the Y-direction. The slit SLT1 is provided with, for example, an insulation layer. A width of the slit SLT1 along the Y-direction is substantially the same as a width of the slit SLT2 along the Y-direction.

In the semiconductor memory device 1, the source line SL is provided on a main surface of the semiconductor substrate 13. The source line SL may have a configuration in which an unpatterned conductive layer extends over an area of the memory cell array 21, and may have a configuration in which a linearly patterned conductive layer extends over the area. In other words, the source line SL extends in the X-direction and the Y-direction.

As shown in FIGS. 3 and 4, the memory pillar MP is electrically connected to the bit line BL. For example, the memory pillar MP0 and the bit line BL1 are connected via a contact plug 16. The memory pillar MP1 and the bit line BL0 are connected via the contact plug 16, the memory pillar MP2 and the bit line BL1 are connected via the contact plug 16, and the memory pillar MP3 and the bit line BL0 are connected via the contact plug 16. Similar to each of the memory pillars MP0 to MP3, each of the memory pillars MP4 to MP7 is connected to the bit line BL2 or BL3, the memory pillars MP8 to MP11 are connected to the bit line BL4 or BL5, and the memory pillars MP12 to MP15 are connected to the bit line BL6 or BL7.

Figure 6:
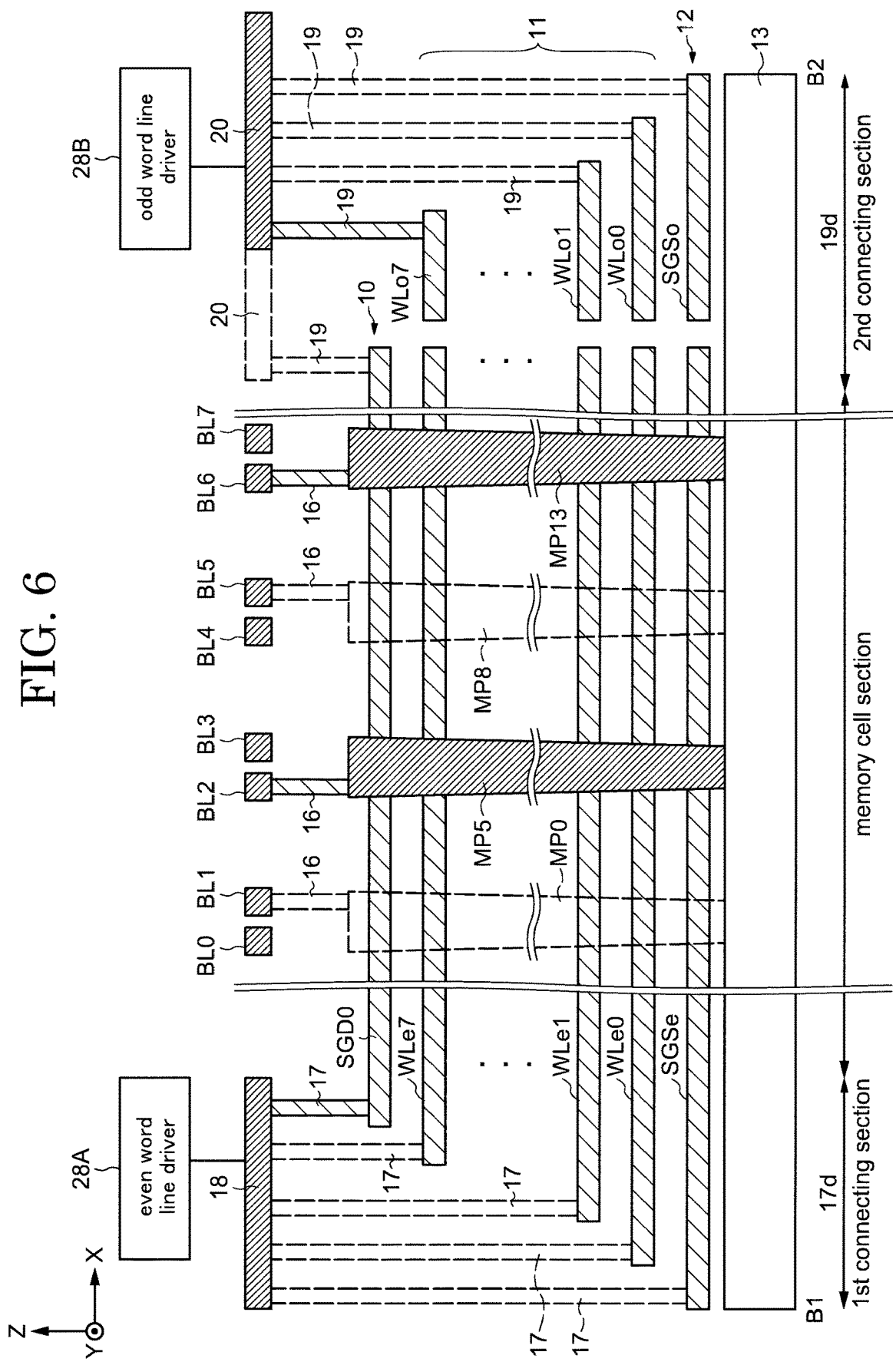
FIG. 6 is a cut end view along B1-B2 of a semiconductor memory device shown in FIG. 4.

FIG. 6 is a diagram showing an end view of a cutting area B1-B2 of the semiconductor memory device shown in FIG. 4. In the description of FIG. 6, descriptions of the same or similar components as those of FIGS. 1 to 5 may be omitted. Since the configuration of a stacked structure and the memory cell of the source line layer 13, the wiring layer 12, the wiring layer 11, and the wiring layer 10 is as described with reference to FIG. 5, a description thereof will be omitted. In FIG. 6, the configuration existing in the depth direction of the end view of a cutting area B1-B2 is drawn by a dotted line.

As shown in FIG. 6, in the first connecting section 17d, the wiring layer 10, the wiring layer 11, and the wiring layer 12 are provided, for example, in a stepped shape and are drawn from the source line layer 13. That is, when viewed in the X-Y plane, the upper surfaces of each end portion of the wiring layer 10, the eight wiring layers 11, and the wiring layer 12 are exposed in the first connecting section 17d. Contact plugs 17 are provided on the upper surfaces of each end portion of the wiring layer 10, eight wiring layers 11, and the wiring layer 12 exposed in the first connecting section 17d. The contact plug 17 is connected to a metal wiring layer 18. For example, by using the metal wiring layer 18, the wiring layer 10 functioning as the even-numbered select gate lines SGD0 and SGD2, the wiring layer 11 functioning as the even word line WLe, and the wiring layer 12 functioning as the even select gate line SGSe are electrically connected to the even word line driver 28A via the row decoder 29 (FIG. 1).

Similar to the first connecting section 17d, in a second connecting section 19d, the wiring layer 10, the wiring layer 11, and the wiring layer 12 are provided, for example, in a stepped shape and are drawn from the source line layer 13. When viewed in the X-Y plane, the upper surfaces of each end portion of the wiring layer 10, eight wiring layers 11, and the wiring layer 12 are exposed in the second connecting section 19d. A contact plug 19 is provided on the upper surface of the end portion of the wiring layer 10 exposed in the second connecting section 19d, and on the upper surfaces of each end portion of the eight wiring layers 11 and the wiring layer 12, and the contact plug 19 is connected to a metal wiring layer 20. For example, by using the metal wiring layer 20, the odd-numbered select gate lines SGD1 and SGD3, the wiring layer 11 functioning as the odd word line WLo, and the wiring layer 12 functioning as the odd select gate line SGSo are electrically connected to the odd word line driver 28B via the row decoder 29 (FIG. 1).

The wiring layer 10 may be electrically connected to the row decoder 29 or the even word line driver 28A and the odd word line driver 28B via the second connecting section 19d instead of the first connecting section 17d. The wiring layer 10 may also be electrically connected to the row decoder 29 or the even word line driver 28A and the odd word line driver 28B via both the first connecting section 17d and the second connecting section 19d.

FIG. 7 is a diagram for explaining an electrical connection of the voltage generation circuit 27, the driver set 28, the select gate line SGD, or the word line WL according to the first embodiment. In the description of FIG. 7, descriptions of the same or similar components as those of FIGS. 1 to 6 may be omitted.

As shown in FIG. 7, the wiring layer 11 functioning as the even word line WLe may be connected to the even word line driver 28A, and the wiring layer 11 functioning as the odd word line WLo may be electrically connected to the odd word line driver 28B. As described above, the even word line driver 28A and the odd word line driver 28B are included in the driver set 28. The driver set 28 is electrically connected to the voltage generation circuit 27. The even word line driver 28A and the odd word line driver 28B may generate various voltages using voltages supplied from the voltage generation circuit 27. The even word line driver 28A may supply the generated voltage to the even word line WLe, and the odd word line driver 28B may supply the generated voltage to the odd word line WLo.

Figure 8:
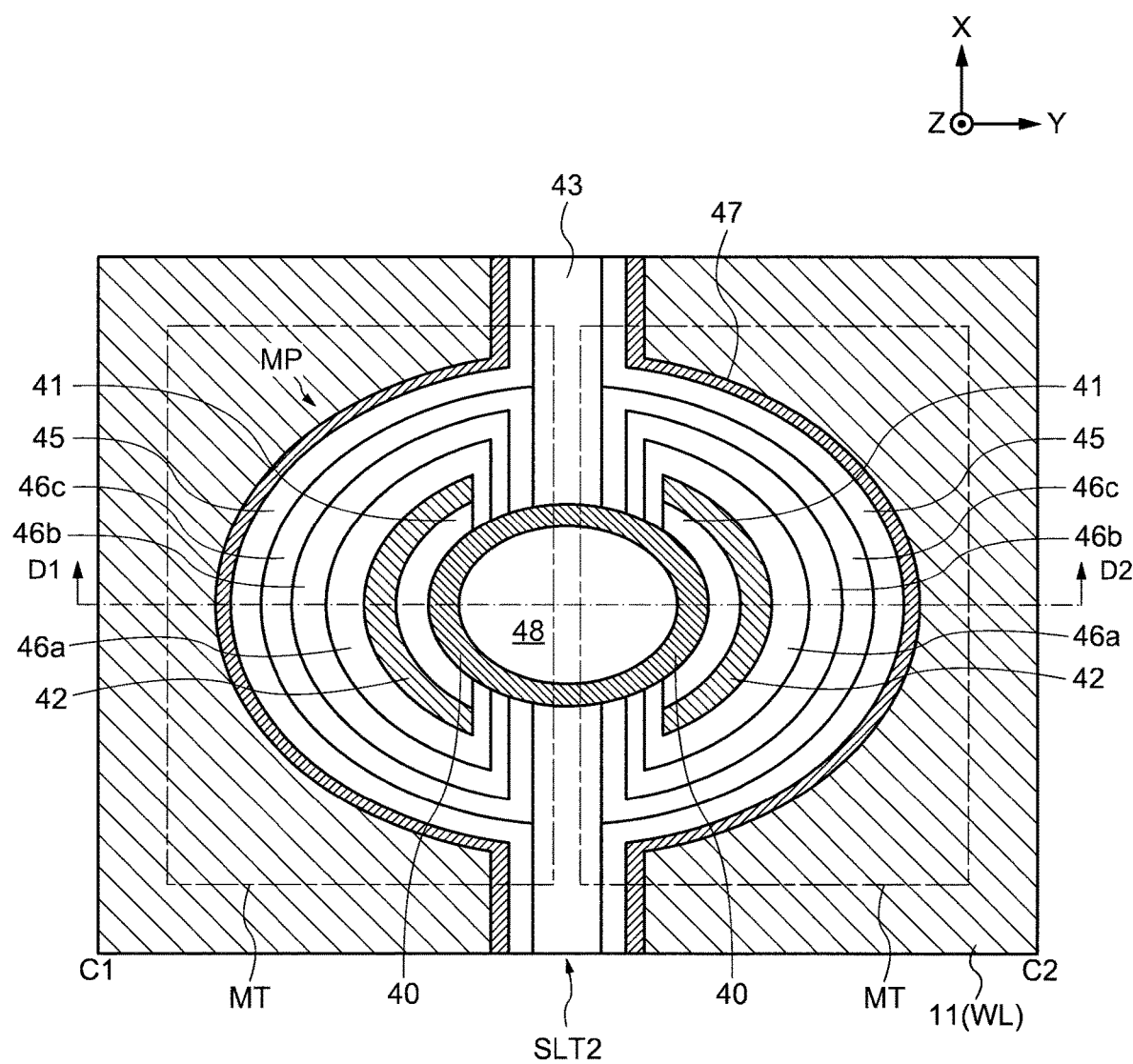
FIG. 8 is a cut end view along C1-C2 of a memory cell transistor shown in FIG. 5 in a first example.
Figure 9:
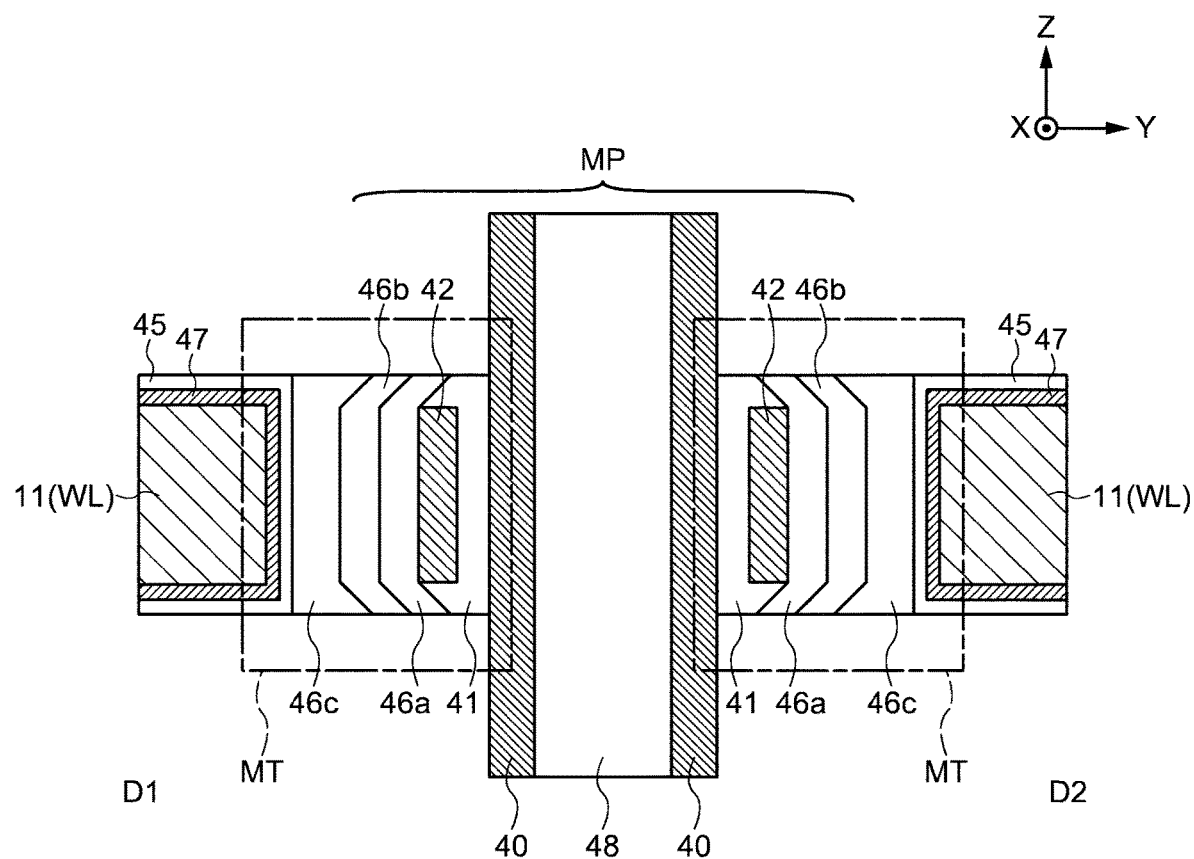
FIG. 9 is a cut end view along D1-D2 of a memory cell transistor shown in FIG. 8.

1-1-6. Structure of End of Cutting Area of Memory Pillar MP and Memory Cell Transistor MT 1-1-6-1. First Example As a structure of the memory cell transistor MT, a structure of the first example shown in FIGS. 8 and 9 is used. FIG. 8 is a diagram showing an end view of a cutting area C1-C2 of a memory cell transistor shown in FIG. 5, and FIG. 9 is a diagram showing an end view of a cutting area D1-D2 of the memory cell transistor shown in FIG. 8. FIGS. 8 and 9 are end views of a cutting area showing an area including two memory cell transistors MT. In the first example, the charge storage layer included in the memory cell transistor MT is a conductive film. In the first example, the memory cell transistor MT is a floating gate type memory cell transistor MT. In the descriptions of FIGS. 8 and 9, descriptions of the same or similar components as those of FIGS. 1 to 7 may be omitted.

As shown in FIGS. 8 and 9, the memory pillar MP includes an insulation layer 48 and a semiconductor layer 43, a semiconductor layer an insulation layer 41, a conductive layer 42, and insulation layers 46a to 46c provided along the Z-direction. The insulation layer 48 is formed using, for example, a silicon oxide film. The semiconductor layer 40 is provided to surround the periphery of the insulation layer 48. The semiconductor layer 40 functions as an area where the channel of the memory cell transistor MT is formed. The semiconductor layer 40 is formed using, for example, a polycrystalline silicon layer. The semiconductor layer 40 is not separated between the memory cell transistors MT in the same memory pillar MP but is provided continuously. Therefore, the channels formed in each of the two memory cell transistors MT share a part of the memory pillar MP.

As described above, the semiconductor layer 40 is continuous between two facing memory cell transistors MT. Therefore, the channels formed in each of the two facing memory cell transistors MT share a part of the memory pillar MP. Specifically, in FIGS. 8 and 9, in the memory cell transistor MT on the left side (a first memory cell) and the memory cell transistor MT on the right side (the second memory cell) facing each other, the channel formed in the first memory cell (a first channel) and the channel formed in the second memory cell (a second channel) share a part of the memory pillar MP. The two channels share a part of the memory pillar MP means that the two channels are formed by the same memory pillar MP and that the two channels are partially overlapped. In an embodiment, the above configuration may be referred to as a structure in which the two memory cell transistors MT are sharing the channels or the two memory cell transistors MT are facing each other.

The insulation layer 41 is provided around the semiconductor layer 40 and functions as a gate insulation film of each memory cell transistors MT. The insulation layer 41 is separated into two areas in the X-Y plane shown in FIG. 8. Each of the insulation layers 41 separated into two areas functions as the gate insulation film of the two memory cell transistors MT in the same memory pillar MP. The insulation layer 41 is formed using, for example, a stacked structure of the silicon oxide film and the silicon nitride film.

The conductive layer 42 is provided around the insulation layer 41 and is separated into two areas along the Y-direction by the insulation layer 43. Each of the conductive layers 42 separated into two areas functions as the charge storage layer of each of the two memory cell transistors MT. The conductive layer 42 is formed using, for example, a polycrystalline silicon layer.

The insulation layer 43 is formed using, for example, a silicon oxide film. The insulation layer 46a, the insulation layer 46b, and the insulation layer 46c are provided sequentially around the conductive layer 42 from the side closer to the conductive layer 42. The insulation layers 46a and 46c are formed using, for example, a silicon oxide film, and the insulation layer 46b is formed using, for example, a silicon nitride film. The insulation layer 46a, the insulation layer 46b, and the insulation layer 46c function as the block insulation film of the memory cell transistor MT. The insulation layer 46a, the insulation layer 46b, and the insulation layer 46c are separated into two areas along the Y-direction. The insulation layer 43 is provided between the insulation layer 46c which is separated into two areas. Also, the insulation layer 43 is embedded in the slit SLT2. The insulation layer 43 is formed using, for example, a silicon oxide film.

An AlO layer 45 is provided around the first example of the memory pillar MP according to the first embodiment, for example. A barrier metal layer 47 is provided around the AlO layer 45, for example. The barrier metal layer 47 is formed using, for example, a TiN film. The wiring layer 11 functioning as the word line WL is provided around the barrier metal layer 47. The wiring layer 11 of the second example of the memory pillar MP according to the first embodiment is formed using, for example, a film made of tungsten.

In the configurations of the memory cell transistors MT shown in FIGS. 8 and 9, one memory pillar MP includes two memory cell transistors MT along the Y-direction and includes two select transistors ST1 and ST2 along the Y-direction. Although not shown, an insulation layer is provided between the adjacent memory cell transistors in the Z-direction. The insulation layer, the insulation layer 43, and the insulation layer 46 provided between adjacent memory cell transistors in the Z-direction insulate the conductive layer 42 for each individual memory cell transistor.

1-1-6-2. Second Example

Figure 10:
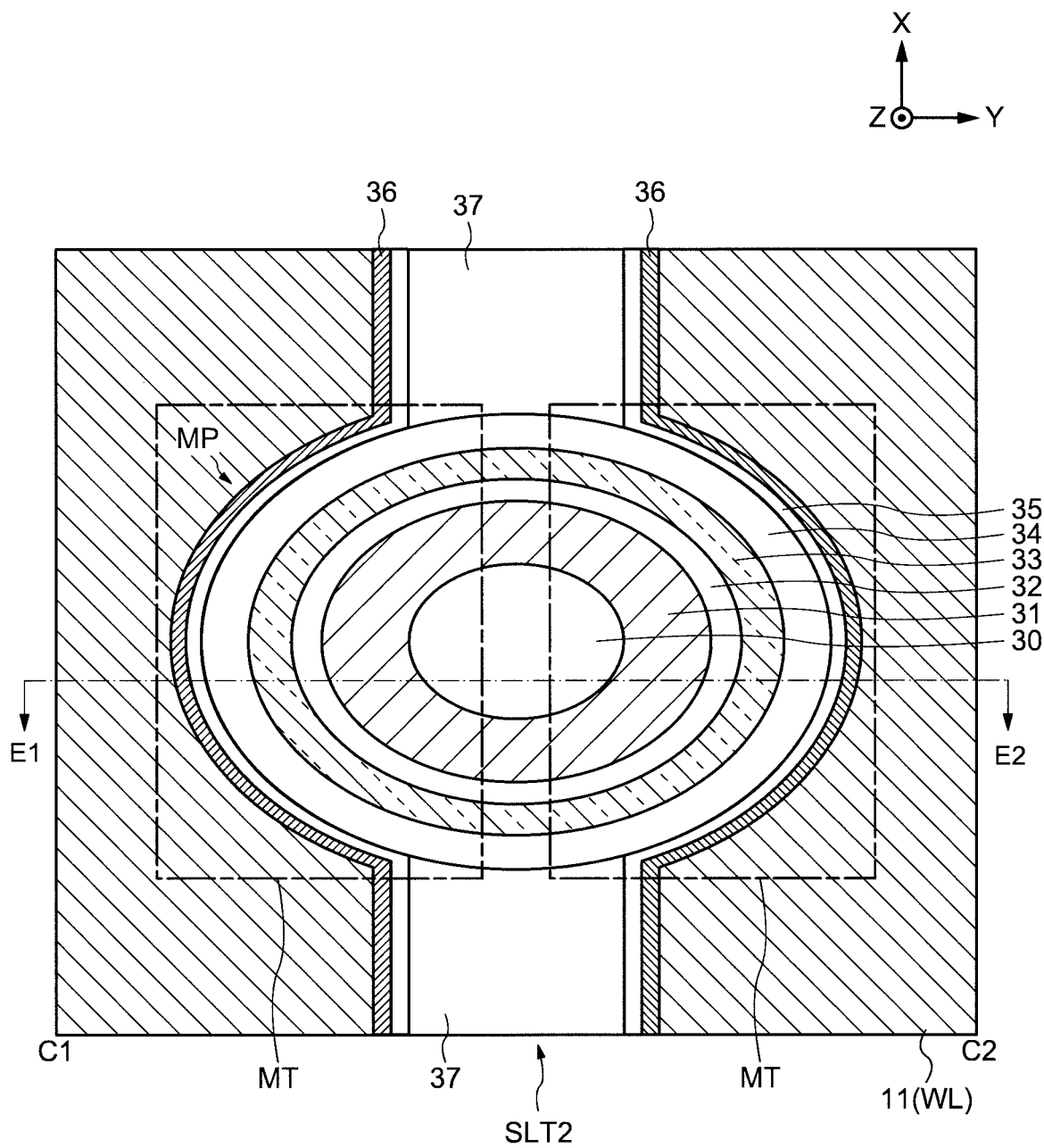
FIG. 10 is a cut end view along C1-C2 of a memory cell transistor shown in FIG. 5 in a second example.
Figure 11:
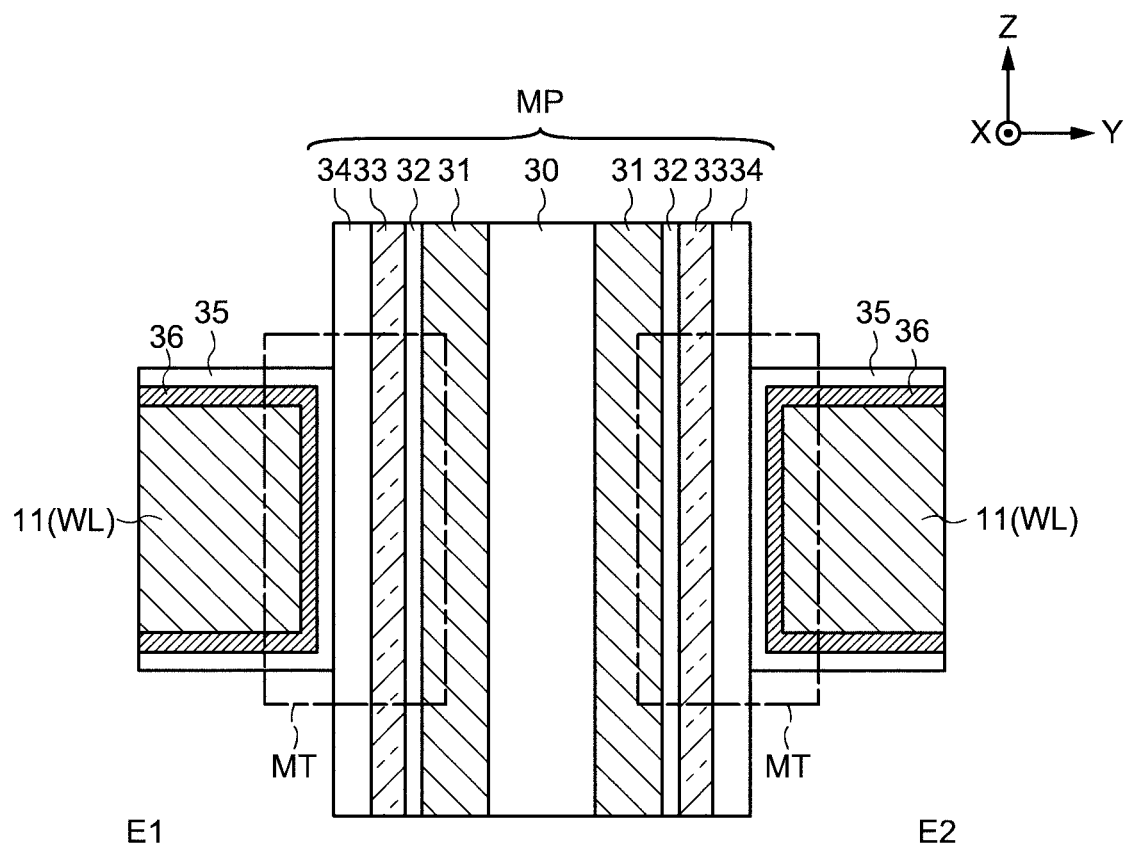
FIG. 11 is a cut end view along C1-C2 of a memory cell transistor shown in FIG. 10.

As a structure of the memory cell transistor MT, a structure of the second example shown in FIGS. 10 and 11 may be used. FIG. 10 is a diagram showing an end view of a cutting area C1-C2 of a memory cell transistor shown in FIG. 5, and FIG. 11 is a diagram showing an end view of a cutting area E1-E2 of the memory cell transistor shown in FIG. FIGS. 10 and 11 are end views of a cutting area showing an area including two memory cell transistors MT. In the second example, the charge storage layer included in the memory cell transistor MT is an insulating film. In the second example, the memory cell transistor MT is a MONOS type memory cell transistor MT. In the descriptions of FIGS. 10 and 11, descriptions of the same or similar components as those of FIGS. 1 to 9 may be omitted.

As shown in FIGS. 10 and 11, the memory pillar MP includes an insulation layer 30, a semiconductor layer 31, insulation layer 32, insulation layer 33 and insulation layer 34 provided along the Z-direction. The insulation layer 30 is formed using, for example, a silicon oxide film. The semiconductor layer 31 is provided to surround the periphery of the insulation layer 30 and functions as an area in which a channel of the memory cell transistor MT is formed. The semiconductor layer 31 is formed using, for example, a polycrystalline silicon layer. The semiconductor layer 31 is not separated between the memory cell transistors MT in the same memory pillar MP but is provided continuously. Therefore, the channels formed in each of the two memory cell transistors MT share a part of the memory pillar MP.

The insulation layer 32 is provided to surround the periphery of the semiconductor layer 31, and functions as a gate insulation film of the memory cell transistor MT. the insulation layer 32 is formed using, for example, a stacked structure of a silicon oxide film and a silicon nitride film. The insulation layer 33 is provided to surround the periphery of the semiconductor layer 31 and functions as the charge storage layer of the memory cell transistor MT. The insulation layer 33 is formed using, for example, a silicon nitride film. The insulation layer 34 is provided to surround the periphery of the insulation layer 33 and functions as a block insulation film of the memory cell transistor MT. The insulation layer 34 is formed using, for example, a silicon oxide film. An insulation layer 37 is embedded in the slit SLT2 except for the memory pillar MP. The insulation layer 37 is formed using, for example, a silicon oxide film.

An AlO layer 35 is provided around the memory pillar MP according to the second example, for example. A barrier metal layer 36 is provided around the AlO layer 35, for example. The barrier metal layer 36 is formed using, for example, a TiN film. The wiring layer 11 functioning as the word line WL is provided around the barrier metal layer 36. The wiring layer 11 is formed using, for example, a film made of tungsten.

Similar to the first example, one memory pillar MP according to the second example includes two memory cell transistors MT along the Y-direction. Similar to one memory pillar MP, the select transistors ST1 and ST2 also include two transistors along the Y-direction.

1-1-7. Equivalent Circuit of a String

Figure 12:
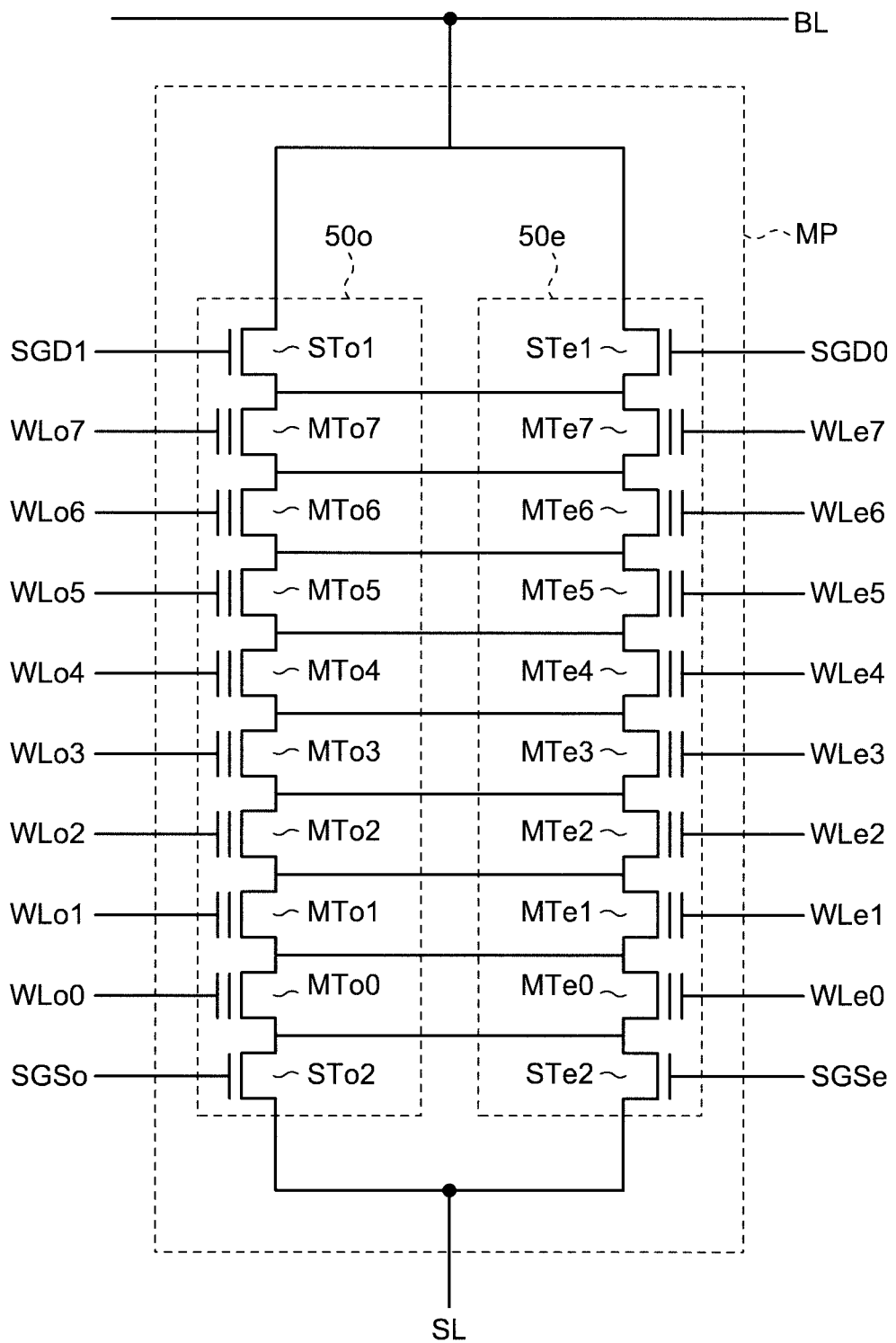
FIG. 12 is a diagram showing an equivalent circuit of adjacent strings in a semiconductor memory device according to the first embodiment.

FIG. 12 is an equivalent circuit diagram of adjacent strings in the semiconductor memory device 1. In the description of FIG. 12, descriptions of the same or similar components as those of FIGS. 1 to 11 may be omitted.

As shown in FIG. 12, the two NAND strings 50e and 50o are formed in one memory pillar MP. Specifically, the NAND string 50o is provided on the first side (third side) of the memory pillar MP. The NAND string 50e is provided on the second side (fourth side) of the memory pillar MP.

The NAND string 50o has a select transistor STo1, a memory cell transistors MTo of i (i is an integer of 2 or more) and a select transistor STo2. The select transistor STo1, the i memory cell transistors MTo and the select transistor STo2 are electrically connected in series. In the first embodiment, the integer i is 8. The eight memory cell transistors MTo0 to MTo7 are electrically connected between the select transistor STo1 and the select transistor STo2. Further, the NAND string 50e has a select transistor STe1, a memory cell transistors MTe of i and a select transistor STe2. The select transistor STe1, the i memory cell transistors MTe and the select transistor STe2 are electrically connected in series. The eight memory cell transistors MTe0 to MTe7 are electrically connected between the select transistor STe1 and the select transistor STe1.

The NAND string 50e and the NAND string 50o are provided so as to face each other. Therefore, the select transistor STe1, the memory cell transistors MTe0 to MTe7 and the select transistor STe2 included in the NAND string 50e, the select transistor STo1, the memory cell transistors MTo0 to MT7 and the select transistor STo2 included in the NAND string 50o are provided so as to face each other one-to-one.

One layer odd select gate line SGSo, even select gate line SGSe, i-layer odd word lines WLo, i-layer even word lines WLe, one-layer select gate line SGD0 and one-layer select gate line SGD1 is provided in the Z direction with respect to the source line SL. In the first embodiment, the integer i is 8, and the semiconductor memory device 1 has the odd word lines WLo0 to WLo7 and even word lines WLe0 to WLe7.

In the first embodiment, for example, when it is not necessary to distinguish the NAND strings 50o and 50e, it may be simply called "NAND string 50". The member included in the NAND string 50 and the wiring connected to the member are also expressed in the same manner as in the case of distinguishing the NAND strings 50o and 50e. For example, when it is not necessary to distinguish between the memory cell transistors MTo and MTe, it may be simply called "memory cell transistor MT".

In the following description, mainly, an example including two memory pillars MP of the first memory pillar MP (e.g., MP0 in FIG. 4) and the second memory pillar MP (e.g., MP5 in FIG. 4) is described. The second memory pillar MP is adjacent to the first memory pillar MP. The first memory pillar MP may be referred to as a "first semiconductor pillar", the NAND string 50o provided in the first memory pillar MP may be referred to as a "first string", the memory cell transistors MTo0 to MTo7 included in the first string may be referred to as the "first memory cell", the side provided with the first string may be referred to as the "first side", the NAND string 50e provided in the first memory pillar MP may be referred to as a "second string", the memory cell transistors MTe0 to MTe7 included in the second string may be referred to as the "second memory cell", and the side provided with the second string may be referred to as the "second side". Similar to the first memory pillar MP, the second memory pillar MP may be referred to as the "second semiconductor pillar", the NAND string 50o provided in the second memory pillar MP may be referred to as a "third string", the memory cell transistors MTo0 to MTo7 included in the third string may be referred to as a "third memory cell", the side provided with the third string may be referred to as the "third side", the NAND string 50e provided in the third memory pillar MP may be referred to as a "fourth string", the memory cell transistor MTe0 to MTe7 included in the fourth string may be referred to as a "fourth memory cell", and the side provided with the fourth string may be referred to as the "fourth side". The second side is the opposite side of the first side in the first memory pillar MP, and the fourth side is the opposite side of the third side in the second memory pillar MP. The first side and the third side face each other.

The select transistor STo1 of the NAND string 50o is connected to, for example, the select gate line SGD1. The select transistor STe1 of the NAND string 50e is connected to, for example, the select gate line SGD0. The select transistors STo1 and STe1 are connected to any one of the 2n select gate lines SGD0 to SGD3.

The memory cell transistors MTo0 to MTo7 of the NAND string 50o are electrically connected in series, arranged along the Z direction, and connected to the odd word lines WLo0 to WLo7 of the i layer, respectively. The memory cell transistors MTe0 to MTe7 of the NAND string 50e are electrically connected in series, arranged along the Z direction, and connected to the even word lines WLe0 to WLe7 of the i layer, respectively. The select transistor STo2 of the NAND string 50o is connected to, for example, the odd select gate line SGSo. The select transistor STe2 of the NAND string 50e is connected to, for example, the even select gate line SGSe. In the first memory pillar MP, i memory cell transistors MTo0 to MTo7 (first memory cell), i memory cell transistors MTe0 to MTe7 (second memory cell), select transistors STo1 and STe1 and select transistors STo2 and STe2 share a semiconductor layer. Similar to the first memory pillar MP, in the second memory pillar MP, i memory cell transistors MTo0 to MTo7 (third memory cell) and i memory cell transistors MTe0 to MTe7 (fourth memory cell), the select transistors STo1 and STe1 and the select transistors STo2 and STe2 share a semiconductor layer.

The odd word lines WLo0 to WLo7 connected to the memory cell transistors MT0 to MT7 (the first memory cell and the third memory cell) included in the NAND string 50o (the first string and the third string) may be referred to as a "first word line", and the even word lines WLe0 to WLe7 connected to the memory cell transistors MT0 to MT7 (the second memory cell and the fourth memory cell) included in the NAND string 50e (the second string and the fourth string) may be referred to as a "second word line".

In the NAND string 50e and the NAND string 50o, the sources and drains of the select transistors STo1 and STe1 facing each other are electrically connected, the sources and drains of the memory cell transistors MTo0 to MTo7 and the memory cell transistors MTe0 to MTe7 facing each other are electrically connected to each other, and the sources and drains of the select transistors STo2 and Ste2 facing each other are electrically connected. The electrical connections described above are due to the channels formed in the facing transistors sharing a part of the memory pillar MP.

Two NAND strings, NAND string 50e and NAND string 50o, in the same memory pillar MP are connected to the same bit line BL and the same source line SL. For example, the memory pillar MP0 is connected to the bit line BL1 and the source line SL, and the memory pillar MP5 is connected to the bit line BL0 and the source line SL.

In the eight layers of odd word lines WLo0 to WLo7 (first word line), the position of the first odd word line WLo0 is closest to the position of the source line SL and farthest from the position of the bit line BL, the position of the eighth odd word line WLo7 is the farthest from the position of the source line SL and the closest to the position of the bit line BL. Similarly to the eight layers of odd word lines WLo0 to WLo7, in the eight layers of even word lines WLe0 to WLe7 (second word line), the position of the first even word line WLe0 is closest to the position of the source line SL and farthest from the position of the bit line BL, the position of the eighth even word line WLe7 is the farthest from the position of the source line SL and the closest to the position of the bit line BL.

1-1-8. Circuit Configuration of Sense Amplifier Unit SAU

Figure 13:
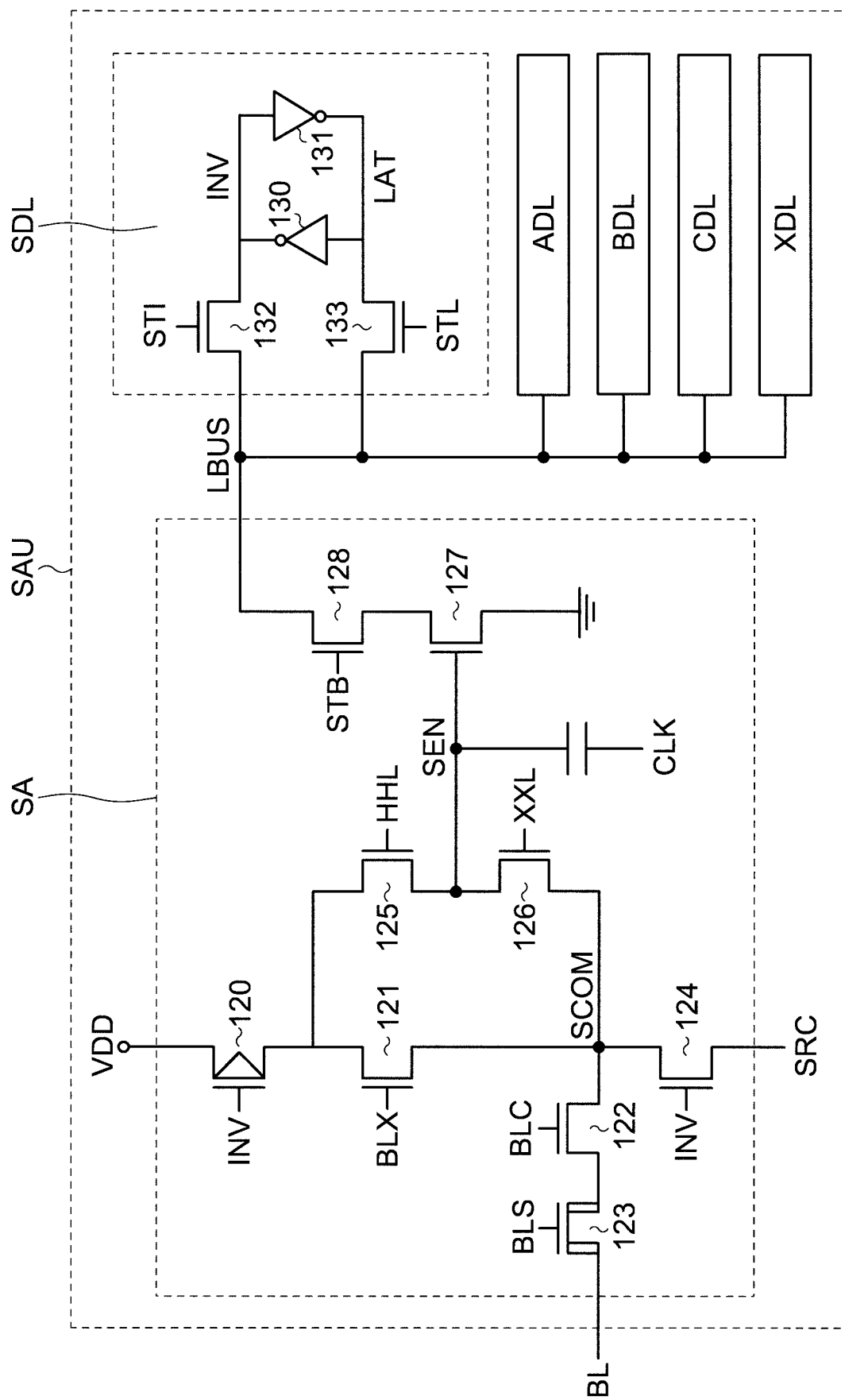
FIG. 13 is a circuit diagram showing an example of a circuit configuration of a sense amplifier unit according to the first embodiment.

FIG. 13 is a circuit diagram showing an example of a circuit configuration of the sense amplifier unit SAU according to the first embodiment. Descriptions of the same or similar components as those of FIG. 1 to FIG. 13 may be omitted.

The sense amplifier 70 includes a plurality of sense amplifier units SAU respectively associated with the bit lines BL0 to BL (L-1). FIG. 13 shows the circuit configuration of one sense amplifier unit SAU. The sense amplifier unit SAU can temporarily hold the data corresponding to the threshold voltage read out to the corresponding bit line BL, for example. The sense amplifier unit SAU can perform a logical operation using the temporarily stored data. As will be described in detail later, the semiconductor memory device 1 can execute the read operation and the write operation by using the sense amplifier unit SAU.

As shown in FIG. 13, the sense amplifier unit SAU includes a sense amplifier unit SA, a latch circuit SDL, a latch circuit ADL, a latch circuit BDL, a latch circuit CDL, and a latch circuit XDL. The sense amplifier unit SA, the latch circuit SDL, the latch circuit ADL, the latch circuit BDL, the latch circuit CDL, and the latch circuit XDL are connected by a bus LBUS so that data can be transmitted and received to each other. The sense amplifier unit SA is connected between a power line and a node SRC. The node SRC is supplied with a voltage less than the voltage supplied to the power line. The power line is a voltage-supplying line that supplies a high-level (High Level) voltage to the sense amplifier unit SA. The node SRC is a node that provide a low-level (Low Level) voltage to the sense amplifier unit SA. The sense amplifier unit SA is supplied with a voltage to the power line and the node SRC to operate. The power line and the node SRC may be configured to supply a voltage to elements other than the sense amplifier unit SA in the sense amplifier unit SAU. The high level voltage is, for example, a voltage VDD, and the low level voltage is, for example, a voltage VSS. The power line may be referred to as a "high voltage supply line", "voltage supply terminal", or "high voltage supply terminal", and the node SRC may be referred to as a "voltage supply terminal" or "low voltage supply terminal".

For example, in the read operation, the sense amplifier SA senses the data (threshold voltage) read to the corresponding bit line BL, and determines whether the data corresponding to the read threshold voltage is "0" or "1". The sense amplifier unit SA includes, for example, a p-channel MOS transistor 120, n-channel MOS transistors 121 to 128, and a capacitor 129.

One end of the transistor 120 is connected to the power line and the gate of the transistor 120 is connected to a node INV in the latch circuit SDL. One end of the transistor 121 is connected to the other end of the transistor 120, the other end of the transistor 121 is connected to a node SCOM, and a control signal BLX is input to the gate of the transistor 121. One end of the transistor 122 is connected to the node SCOM, and a control signal BLC is input to the gate of the transistor 122. The transistor 123 is a MOS transistor having a high withstand voltage, and one end of the transistor 123 is connected to the other end of the transistor 122, the other end of the transistor 123 is connected to the corresponding bit line BL, and a control signal BLS is input to the gate of the transistor 123. The transistor 128 may be referred to as a "control transistor".

One end of the transistor 124 is connected to the node SCOM, the other end of the transistor 124 is connected to the node SRC, and a gate of the transistor 124 is connected to the node INV. One end of the transistor 125 is connected to the other end of the transistor 120, the other end of the transistor 125 is connected to a node SEN, and a control signal HHL is input to the gate of the transistor 125. One end of the transistor 126 is connected to the node SEN, the other end of the transistor 126 is connected to the node SCOM, and a control signal XXL is input to a gate of the transistor 126.

One end of the transistor 127 is grounded and a gate of the transistor 127 is connected to the node SEN. One end of the transistor 128 is connected to the other end of the transistor 127, the other end of the transistor 128 is connected to the bus LBUS, and a control signal STB is input to a gate of the transistor 128. One end of the capacitor 129 is connected to the node SEN, and a clock CLK is input to the other end of the capacitor 129. For example, the voltage VSS is supplied to the clock CLK.

The control signal BLX, the control signal BLS, the control signal BLS, the control signal HHL, the control signal XXL, a control signal STI, a control signal STL and the control signal STB are generated, for example, by the sequencer 24. The power line connected to one end of the transistor 120 is supplied with the voltage VDD, which is, for example, an internal power supply voltage of the semiconductor memory device 1, and the node SRC is supplied with the voltage VSS, which is, for example, a ground voltage of the semiconductor memory device 1.

The latch circuit SDL, the latch circuit ADL, the latch circuit BDL, the latch circuit CDL, and the latch circuit XDL temporarily hold the read data. The latch circuit XDL is, for example, connected to the register is used for the input and output of data between the sense amplifier unit SAU and the input/output circuit 22.

The latch circuit SDL includes, for example, inverters 130 and 131 and n-channel MOS transistors 132 and 133. An input node of the inverter 130 is connected to a node LAT, and an output node of the inverter 130 is connected to the node INV. An input node of the inverter 131 is connected to the node INV, and an output node of the inverter 131 is connected to the node LAT. One end of the transistor 132 is connected to the node INV, the other end of the transistor 132 is connected to the bus LBUS, and the control signal STI is input to a gate of the transistor 132. One end of the transistor 133 is connected to the node LAT, the other end of the transistor 133 is connected to the bus LBUS, and the control signal STL is input to a gate of the transistor 133. For example, the data held in the node LAT corresponds to the data held in the latch circuit SDL, and the data held in the node INV corresponds to the inverted data of the data held in the node LAT. Circuit configurations of the latch circuit ADL, the latch circuit BDL, the latch circuit CDL, and the latch circuit XDL are the same as the circuit configuration of the latch circuit SDL, for example, a description thereof will be omitted.

In the sense amplifier unit SAU, the timing at which each sense amplifier unit SAU determines the data corresponding to the threshold voltage read to the bit line BL is based on the timing at which the control signal STB is asserted. In the first embodiment, the timing at which each sense amplifier unit SAU determines the data corresponding to the threshold voltage read to the bit line BL is, for example, referred to as sense operation. In the semiconductor memory device 1, "the sequencer 24 asserts the control signal STB" corresponds to the sequencer 24 changing the control signal STB from the "L" level to the "H" level.

The configuration of the sense amplifier unit SAU is not limited to the configuration and function described with reference to FIG. 13. For example, in the sense amplifier unit SAU, the transistor 128 to which the control signal STB is input to the gate may be constituted by the p-channel MOS transistor. In this case, "the sequencer 24 asserts the control signal STB" corresponds to the sequencer 24 changing the control signal STB from the "H" level to the "L" level.

The number of latch circuits included in the sense amplifier unit SAU can be designed to any number. In this case, the number of latch circuits is designed based on, for example, the number of bits of data held by one memory cell transistor MT. A plurality of bit lines BL may be connected to one sense amplifier unit SAU via a selector.

1-1-9. Threshold Distribution of Memory Cell Transistor MT

Figure 14:
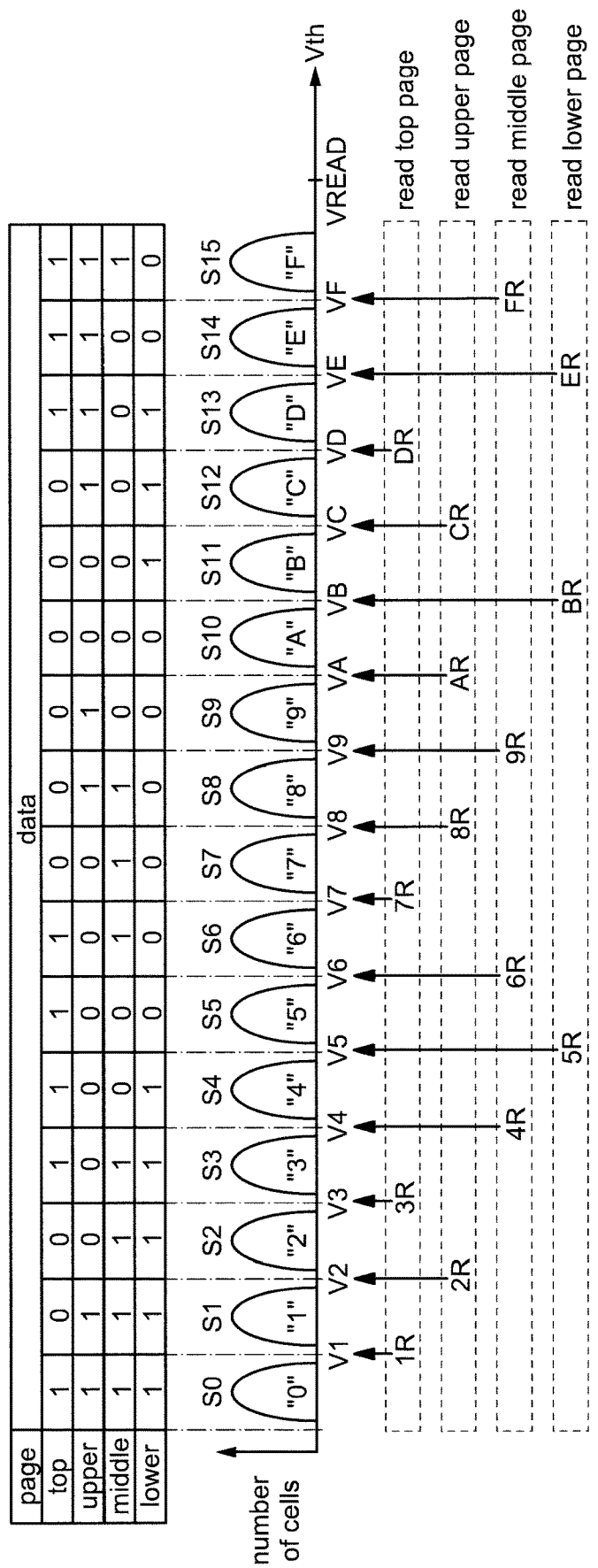
FIG. 14 is a diagram showing a threshold distribution of a memory cell transistor according to the first embodiment.

FIG. 14 is a diagram showing an example of a threshold distribution, a data allocation, a read voltage, and a verify voltage of each memory cell transistor MT. The vertical axis of the threshold distribution shown in FIG. 14 corresponds to the number of memory cell transistors MT (the number of cells), and the horizontal axis corresponds to a threshold voltage Vth of the memory cell transistor MT.

In the first embodiment, an example is shown in which the distribution of the threshold voltage of the memory cell transistor MT in the memory system 3 is Quad Level Cell (QLC) shown in FIG. 14. In the QLC method, the distribution of the threshold voltage of the plurality of memory cell transistors MT is divided into 16. The distribution of the threshold voltage of the memory cell transistor MT is not limited to 16. In the memory system 3, a Triple Level Cell (TLC) method in which the distribution of the threshold voltage is divided into 8 may be used, a Multi-Level Cell (MLC) method in which the distribution of the threshold voltage is divided into 4 may be used, and a Single Level Cell (SLC) method in which the distribution of the threshold voltage is divided into 2 may be used.

As shown in FIG. 14, the 16 threshold distributions in the QLC method are represented by, for example, "0" level, "1" level, "2" level, "3" level, "4" level, "5" level, "6" level, "7" level, "8" level, "9" level, "A" level, "B" level, "C" level, "D" level, "E" level, and "F" level in order from the lowest threshold voltage.

The "0" level in the above-described threshold distribution corresponds to an erased state (state S0) of the memory cell transistor MT. The "1" level corresponds to a state S1 of the memory cell transistor MT. The "2" level corresponds to a state S2 of the memory cell transistor MT. The "3" level corresponds to a state S3 of the memory cell transistor MT. The "4" level corresponds to a state S4 of the memory cell transistor MT. Similar to the "0" level to the "4" level, the "5" level to the "F" level correspond to states S5 to S15 shown in FIG. 14.

Different 4-bit data, for example, as shown below are allocated to the "0" level to the "F" level. The memory cell transistor MT included in the "0" level holds "1111" data. The memory cell transistor MT included in the "1" level holds "0111" data. The memory cell transistor MT included in the "2" level holds "0011" data. The memory cell transistor MT included in the "3" level holds "1011" data. The memory cell transistor MT included in the "4" level holds "1001" data. The memory cell transistor MT included in the "5" level holds "1000" data. The memory cell transistor MT included in the "6" level holds "1010" data. The memory cell transistor MT included in the "7" level holds "0010" data. The memory cell transistor MT included in the "8" level holds "0110" data. The memory cell transistor MT included in the "9" level holds "0100" data. The memory cell transistor MT included in the "A" level holds "0000" data. The memory cell transistor MT included in the "B" level holds "0001" data. The memory cell transistor MT included in the "C" level holds "0101" data. The memory cell transistor MT included in the "D" level holds "1101" data. The memory cell transistor MT included in the "E" level holds "1100" data. The memory cell transistor MT included in the "F" level holds "1110" data.

For example, the 4-bit data is called a lower bit, a middle bit, an upper bit, and a top bit in order from the lower bit. A set of lower bits held by the memory cell transistor MT connected to the same word line WL is called a lower page, a set of middle bits is called a middle page, a set of upper bits is called an upper page, and a set of top bits is called a top page. The data write operation and read operation are executed in the above page units.

Voltages used in each verify operation is set between the adjacent threshold distributions. For example, voltage V1, voltage V2, voltage V3, voltage V4, voltage V5, voltage V6, voltage V7, voltage V8, voltage V9, voltage VA, voltage VB, voltage VC, voltage VD, voltage VE, and voltage VF are set. As will be described later, the verify operation using the voltage V1, voltage V2, voltage V3, voltage V4, voltage V5, voltage V6, voltage V7, voltage V8, voltage V9, voltage VA, voltage VB, voltage VC, voltage VD, voltage VE, and voltage VF are referred to as verify operation 1VR, verify operation 2VR, verify operation 3VR, verify operation 4VR, verify operation 5VR, verify operation 6VR, verify operation 7VR, verify operation 8VR, verify operation 9VR, verify operation AVR, verify operation BVR, verify operation CVR, verify operation DVR, verify operation EVR, and verify operation FVR, respectively.

In the verify operation, by supplying the voltages V1 to VF to the word line WL and the target memory cell transistor MT is turned on, the threshold voltage of the target memory cell transistor MT is read, and it is determined that it has reached the threshold voltage corresponding to each state.

For example, the voltage V2 is set between the maximum threshold voltage of the "1" level and the minimum threshold voltage of the "2" level. When the voltage V2 is supplied to the memory cell transistor MT, the memory cell transistor MT in which threshold voltage is included in the "1" level is turned on, and the memory cell transistor MT in which threshold voltage is included in the threshold distribution of "2" level or higher is turned off. As a result, the memory system 3 can determine that the threshold voltage of the target memory cell transistor MT has reached the threshold voltage corresponding to the state S2 of "2" level.

Other voltage V1, voltage V3, voltage V4, voltage V5, voltage V6, voltage V7, voltage V8, voltage V9, voltage VA, voltage VB, voltage VC, voltage VD, voltage VE, and voltage VF are also set in the same manner as the voltage V2, and the state of the memory cell transistor MT supplied each voltage is supplied is also the same as the state of the memory cell transistor MT supplied the voltage V2 is supplied. For example, when the voltage V3 is set between the maximum threshold voltage of the "2" level and the minimum threshold voltage of the "3" level and the voltage V3 is supplied to the memory cell transistor MT, the memory cell transistor MT in which the threshold voltage is included in the "2" level is turned on, and the memory cell transistor MT in which the threshold voltage is included in the threshold distribution of the "3" level or higher is turned off. As a result, the memory system 3 can determine that the threshold voltage of the target memory cell transistor MT has reached the threshold voltage corresponding to the state S3 of the "3" level. For example, the verify voltage VF is set between the maximum threshold voltage of the "E" level and the minimum threshold voltage of the "F" level, and when the voltage VF is supplied to the memory cell transistor MT, the memory cell transistor MT in which threshold voltage is included in the "E" level is turned on, and the memory cell transistor MT in which threshold voltage is included in the threshold distribution of the "F" level or higher is turned off. As a result, the memory system 3 can determine that the threshold voltage of the target memory cell transistor MT has reached the threshold voltage corresponding to the state S15 of the "F" level.

The read voltage used in each read operation is set between adjacent threshold distributions. In the first embodiment, for simplifying the description, for example, voltage V1, voltage V2, voltage V3, voltage V4, voltage V5, voltage V6, voltage V7, voltage V8, voltage V9, voltage VA, voltage VB, voltage VC, voltage VD, voltage VE, and voltage VF used in the verify operation are used as the read voltage. The read operation using the voltage V1, voltage V2, voltage V3, voltage V4, voltage V5, voltage V6, voltage V7, voltage V8, voltage V9, voltage VA, voltage VB, voltage VC, voltage VD, voltage VE, and voltage VF are referred to as read operation 1R, read operation 2R, read operation 3R, read operation 4R, read operation 5R, read operation 6R, read operation 7R, read operation 8R, read operation 9R, read operation AR, read operation BR, read operation CR, read operation DR, read operation ER, and read operation FR, respectively. In the read operation 1R, the memory system 3 determines whether the threshold voltage of the memory cell transistor is included in the "0" level or the threshold voltage is included in the "1" level or more.

In the other read operations 2R to FR, similar to the read operation 1R, the memory system 3 determines the threshold voltage of the level corresponding to each read operation. For example, in the read operation 2R, the memory system 3 determines whether the threshold voltage is included in the "1" level or the threshold voltage is included in the "2" level. In the read operation FR, the memory system 3 determines whether the threshold voltage is included in the "E" level or the threshold voltage is included in the "F" level.

In addition, a voltage VREAD is set to a voltage value higher than the maximum threshold voltage (VF) of the highest threshold distribution (e.g., "F" level). For example, the voltage VREAD is a voltage supplied to an unselected word line USEL-WL at the time of the read operation. The voltage VREAD may be a voltage supplied to a selected word line SEL-WL, the select gate line SGD, or the select gate line SGS. The memory cell transistor MT to which the voltage VREAD is applied to the gate electrode is turned on regardless of the data to be stored.

When reading out the data allocated as described above, the data on the lower page is determined by the read operation 5R, the read operation BR, and the read operation ER. The data on the middle page is determined by the read operation 4R, the read operation 6R, the read operation 9R, and the read operation FR. The data on the upper page is determined by the read operation 2R, the read operation 8R, the read operation AR, and the read operation CR. The data on the top page is determined by the read operation 1R, the read operation 3R, the read operation 7R, and the read operation DR. That is, the data on the lower page, middle page, upper page, and top page are determined by 3, 4, 4, and 4 times of read operation, respectively. Data allocation as described above is called, for example, "4-4-4-3 code" and "4-4-4-3 coding". According to the data allocated as described above, adjacent states are gray codes that are different by 1-bit.

1-2. Operation Example 1-2-1. Overview of Write Operation and Read Operation

Figure 15:
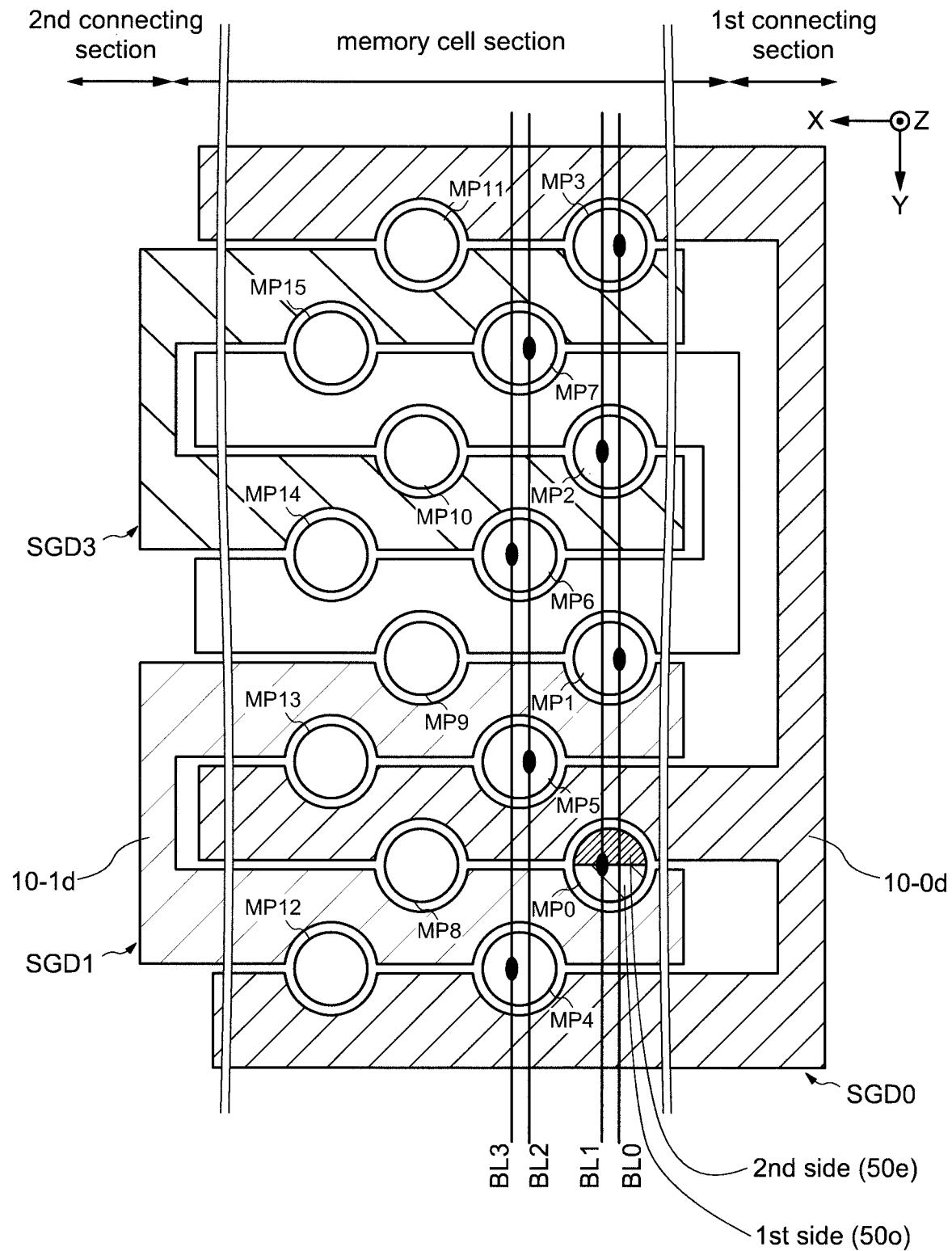
FIG. 15 is a diagram for explaining a state in which a select gate line is selected or unselected in a semiconductor memory device according to the first embodiment.

A state in which the select gate line SGD is selected or unselected in the write operation and the read operation of the semiconductor memory device 1 will be described with reference to FIG. 15. FIG. 15 is a diagram showing a state in which the select gate line SGD is selected in a planar layout shown in FIG. 3. For example, when a predetermined voltage (e.g., the voltage VREAD) is supplied to a wiring layer 10-1d, the select gate line SGD1 is selected, and the eight select transistors STo1 provided on the first sides of the memory pillar MP0, the memory pillar MP1, the memory pillar MP4, the memory pillar MP5, the memory pillar MP8, the memory pillar MP9, the memory pillar MP12, and the memory pillar MP13 are turned on. At this time, a predetermined voltage (e.g., the voltage VSS) is supplied to a wiring layer 10-0d, and the eight select transistors STe1 provided on the second sides of the memory pillars MP0, MP1, the memory pillar MP4, the memory pillar MP5, the memory pillar MP8, the memory pillar MP9, the memory pillar MP12, and the memory pillar MP13 are turned off.

Figure 16:
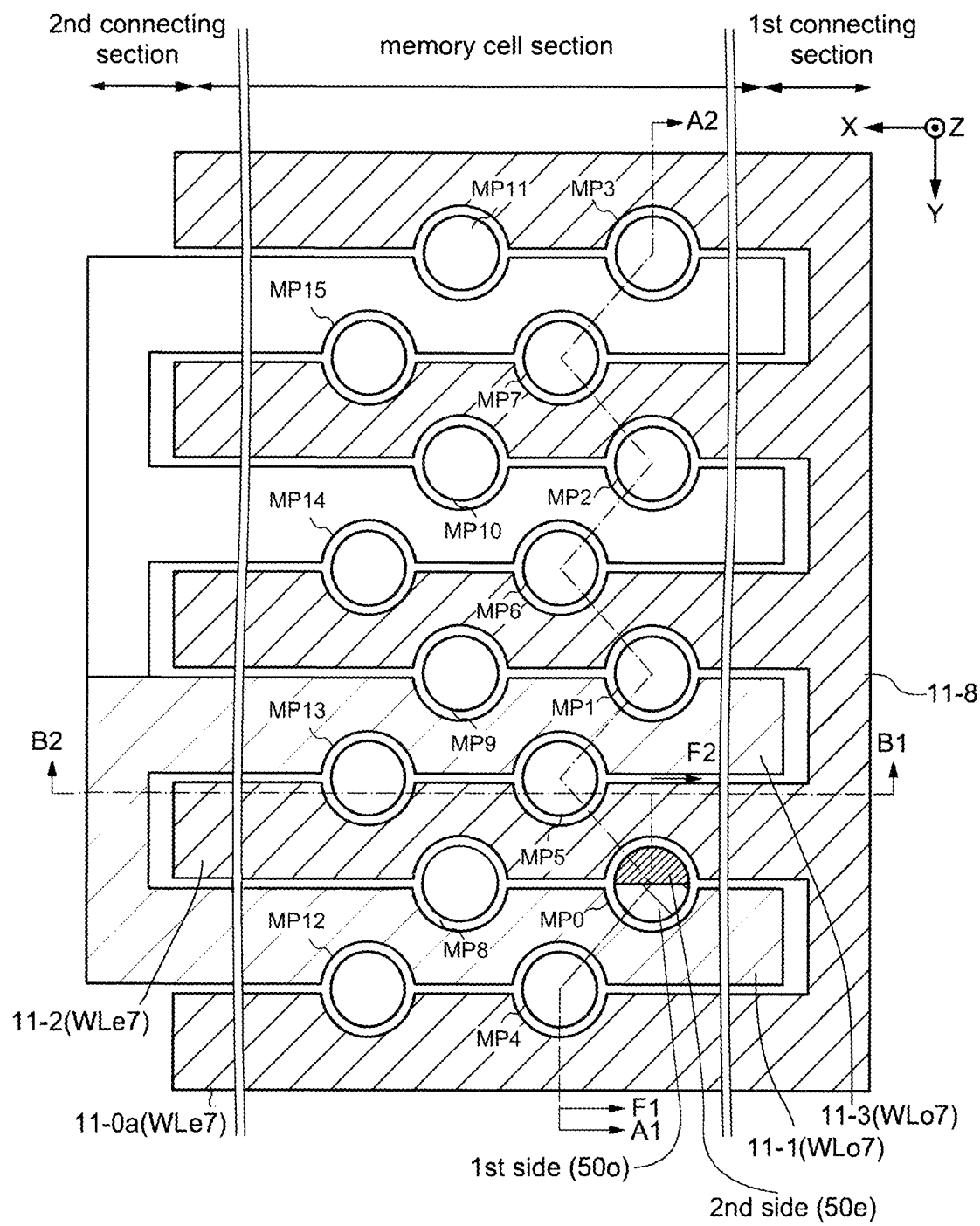
FIG. 16 is a diagram for explaining a state in which a word line is selected or unselected in a semiconductor memory device according to the first embodiment.
Figure 17:
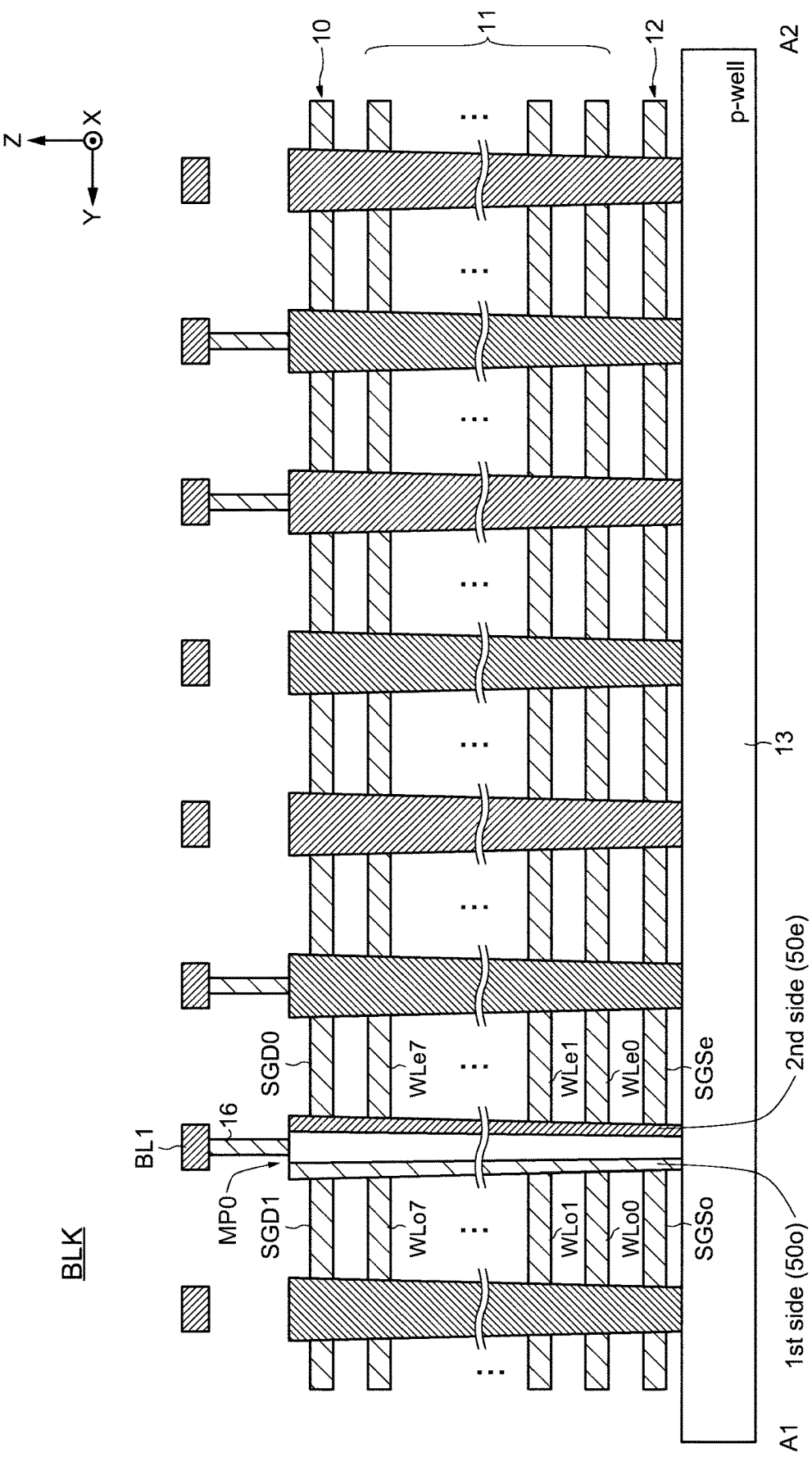
FIG. 17 is a cut end view along A1-A2 of a semiconductor memory device shown in FIG. 16 and is a diagram for explaining a state in which a select gate line and a word line are selected or unselected.
Figure 18:
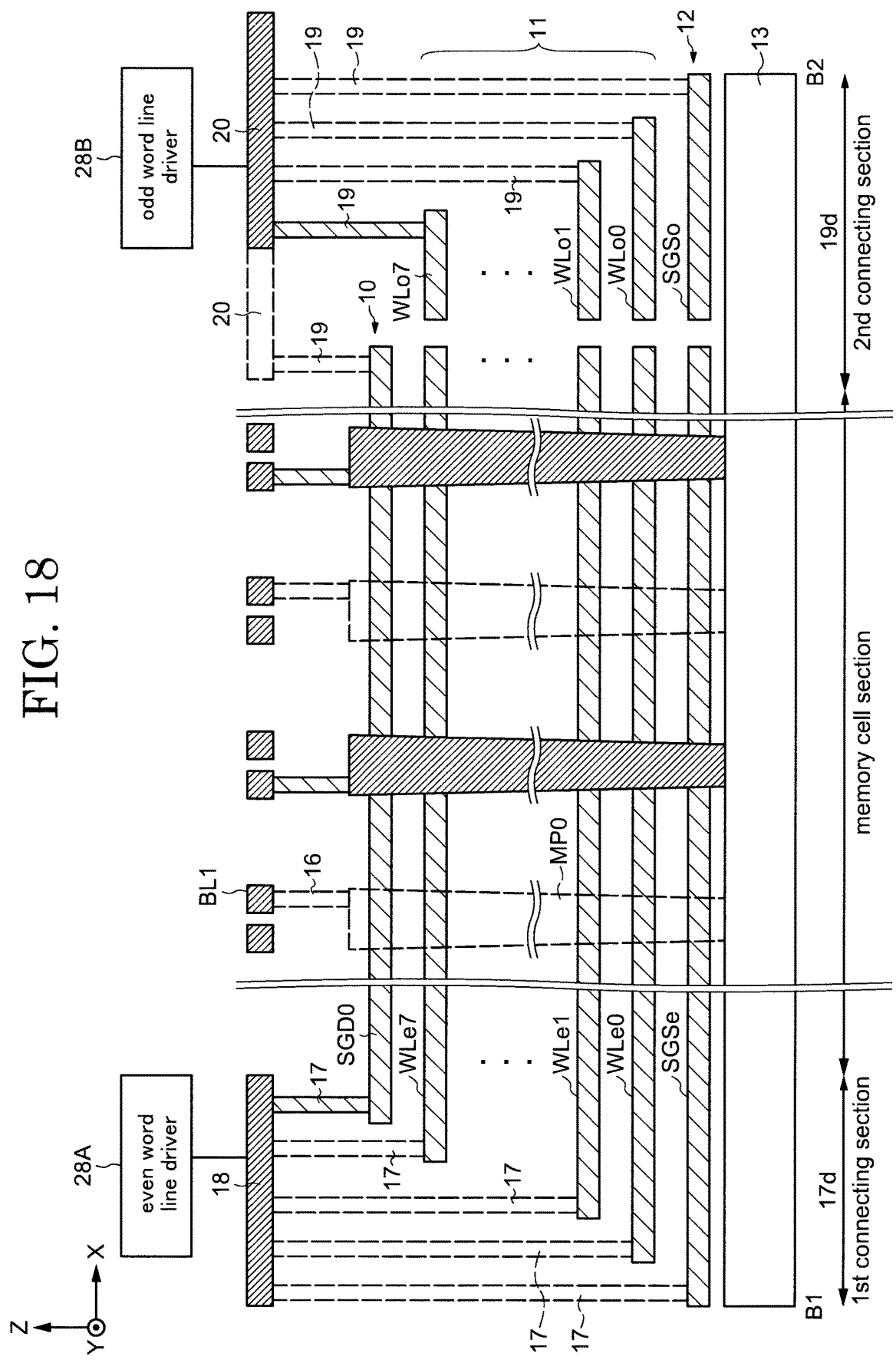
FIG. 18 is a cut end view along B1-B2 of a semiconductor memory device shown in FIG. 16 and is a diagram for explaining a state in which a select gate line and a word line are selected or unselected.

Next, a state in which the word line WL is selected or unselected will be described with reference to FIG. 16 to FIG. 18. FIG. 16 is a diagram showing a state in which the word line WL is selected or unselected in a planar layout shown in FIG. 4, and FIG. 17 and FIG. 18 are diagrams showing a state in which the select gate line and the word line are selected or unselected in an end portion cross-sectional view shown in FIG. 16.

For example, when a predetermined voltage (e.g., the voltage VREAD) is supplied to the wiring layer 11 including the wiring layers 11-1 and 11-3, the odd word lines WLo (WLo 0 to WLo7) provided on the first sides of the memory pillar MP0, the memory pillar MP1, the memory pillar MP4, the memory pillar MP5, the memory pillar MP8, the memory pillar MP9, the memory pillar MP12, and MP13 are turned on or off according to the supplied voltage. At this time, a predetermined voltage (e.g., the voltage VSS) is supplied to the wiring layer 11 including the wiring layer 11-0a, and the even word lines WLe (WLe0 to WLe7) provided on the second sides of the memory pillar MP0, the memory pillar MP1, the memory pillar MP4, the memory pillar MP5, the memory pillar MP8, the memory pillar MP9, the memory pillar MP12, and the memory pillar MP13 are turned on or off according to the supplied voltage.

As a result, the memory cell transistor MT belonging to the memory pillar corresponding to the select gate line SGD1 is selected in the block BLK. The memory group MG is formed by the memory cell transistor MT selected by each select gate line. One page is formed by the memory cell transistor MT corresponding to the selected word line WL in the memory group MG. Therefore, the block BLK includes the memory groups MG corresponding to the number of the select gate lines SGD, and each memory group MG includes the pages corresponding to the number of layers of the word line WL. Operation when a wiring layer other than the above wiring layers is selected is the same as described above, the explanation here is omitted.

Figure 19:
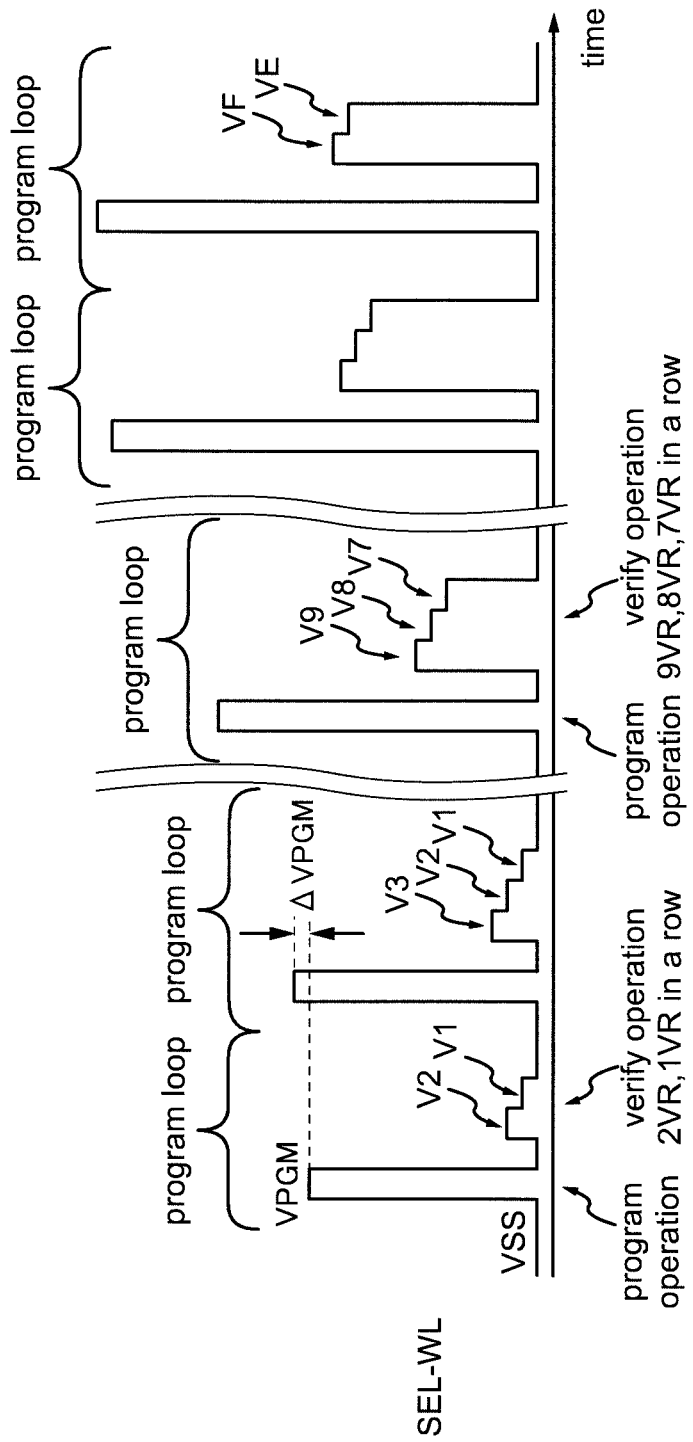
FIG. 19 is a diagram for explaining a program loop in a semiconductor memory device according to the first embodiment.

Next, a program loop included in the write operation will be described with reference to FIG. 19. For example, as shown in FIG. 19, the semiconductor memory device 1 executes a plurality of program loops (e.g., X times, X is an integer greater than or equal to 1) in the write operation. Each program loop contains at least one program operation and one or more subsequent verify operations (e.g., Y times, Y is an integer greater than or equal to 1). In the write operation, the program loop containing the program operation and the verify operation is executed a plurality of times. The verify operation may be omitted in each program loop.

In the program operation, electrons are injected into the charge storage layer of the memory cell transistor MT to be written, the threshold voltage increases, injection of electrons into the charge storage layer of the memory cell transistor MT to be non-written is prohibited, and the threshold voltage is maintained. In the program operation, for example, a voltage VPGM is supplied to the selected word line SEL-WL. As a result, a plurality of memory cell transistors MT connected to the selected word line SEL-WL is selected. The threshold voltage of each of the plurality of memory cell transistors MT increases or maintains based on the voltage supplied to the corresponding bit line BL. The voltage VPGM in the program operation included in a program loop is a voltage obtained by adding a voltage AVPGM to a voltage VPRG in the program operation included in the previous program loop. That is, the voltage VPRG in the program operation steps up as the program loop progresses.

The verify operation is an operation that is executed following the program operation and checks whether the threshold voltage of the selected memory cell transistor MT has reached the target level by performing reading using a predetermined voltage (e.g., the voltage VA). The memory cell transistor MT in which the threshold voltage has reached the target level is considered to have passed the verify operation, and then becomes a non-written target, and injection of electrons into the charge storage layer is prohibited.

An example of the order of the sense operation corresponding to the verify operation will be described with reference to FIG. 19 or FIG. 20. In the verify operation in the same program loop, the sense operation in the verify operation different from each other is continuously executed. Specifically, as shown in FIG. 19, when two times verify operations (the verify operation 2VR and the verify operation 1VR different from each other) are executed by the verify operation in the same program loop, the order of the sense operation is first the sense operation of the verify operation 2VR (verify of the threshold voltage of the state S2) and second the sense operation of the verify operation 1VR (verify of the threshold voltage of the state S1). Similarly, for example, when three times verify operations (the verify operation 3VR, the verify operation 2VR, and the verify operation 1VR) are executed, the order of the sense operation is first the sense operation of the verify operation 3VR (verify of the threshold voltage of the state S3), second the sense operation of the verify operation 2VR (verify of the threshold voltage of the state S2), and third the sense operation of the verify operation 1VR (verify of the threshold voltage of the state S1). When the three times verify operations (the verify operation 9VR, the verify operation 8VR, and the verify operation 7VR different from each other) are executed, the order of the sense operation is first the sense operation of the verify operation 9VR (verify of the threshold voltage of the state S9), second the sense operation 8VR of the verify operation 8VR (verify of the threshold voltage of the state S8), and third the sense operation of the verify operation 7VR (verify of the threshold voltage of the state S7).

In the verify operation, the order of the sense operation is different between different program loops, such as the verify operation 2VR or the verify operation 1VR. For example, as shown in FIG. 19, in the verify operation in the first program loop, the order of the sense operation of the verify operation 1VR (verify of the threshold voltage of the state S1) is the second, and in the verify operation in the next program loop, the order of the sense operation of the verify operation 1VR is the third. In the verify operation in the first program loop, the order of the sense operation of the verify operation 2VR (verify of the threshold voltage of the state S2) is first, and in the verify operation in the next program loop, the order of the sense operation of the verify operation 2VR is second. Similar to the verify operations 1VR and 2VR, the verify operations 3VR to EVR may have different sense operation orders between different program loops. For example, whether the threshold voltage of the selected memory cell transistor MT reaches the target level may be confirmed by executing the sense operation of the verify operation FVR once, as in the state S15 at the highest level (FIG. On the other hand, other than the state S15, the sense operation may be executed twice or six times to be confirmed. That is, the order of the sense operation from the verify operations 1VR to EVR may be all one to six times (FIG. 20). In the semiconductor memory device 1, in the sense operation of the verify operation in a program loop, if the threshold voltage of the selected memory cell transistor MT does not reach the target level, the selected memory cell transistor MT is considered not to have passed the verify operation. Therefore, the level of the selected memory cell transistor MT is the level to be verified, and the verify operation of the selected memory cell transistor MT is executed even in the subsequent programming loops.

For example, in the verify operation 2VR, the voltage V2 is supplied to the selected word line SEL-WL and the memory cell transistor MT connected to the selected word line SEL-WL is selected. At this time, whether the threshold voltage of the selected memory cell transistor MT has reached the voltage V2 (whether it is in the "2" level) is determined. That is, it is determined whether the selected memory cell transistor is in the state of the state S2. In the verify operation 7VR, the voltage V7 is supplied to the selected word line SEL-WL and the memory cell transistor MT connected to the selected word line SEL-WL is selected. At this time, whether the threshold voltage of the selected memory cell transistor MT has reached the voltage V7 (whether it is in the "7" level) is determined. That is, it is determined whether the selected memory cell transistor is in the state S7.

In the semiconductor memory device 1, the threshold voltage of the selected memory cell transistor MT increases to the target level by repeatedly executing the program loop containing the program operation and the verify operation. More specifically, in the semiconductor memory device 1, if the threshold voltage of the selected memory cell transistor MT does not reach the target level (e.g., the voltage VA), the selected memory cell transistor MT is considered not to have passed the verify operation. The semiconductor memory device 1 gradually raises the level of the predetermined voltage of the previous program loop until the threshold voltage of the selected memory cell transistor MT reaches the target level. When the threshold voltage of the selected memory cell transistor MT reaches the target level, it is considered to have passed the verify operation and is subsequently excluded from the target of the program operation. As a result, each of the threshold voltages of the plurality of memory cell transistors MT to be subjected to the write operation rises to the corresponding target level.

Figure 22:
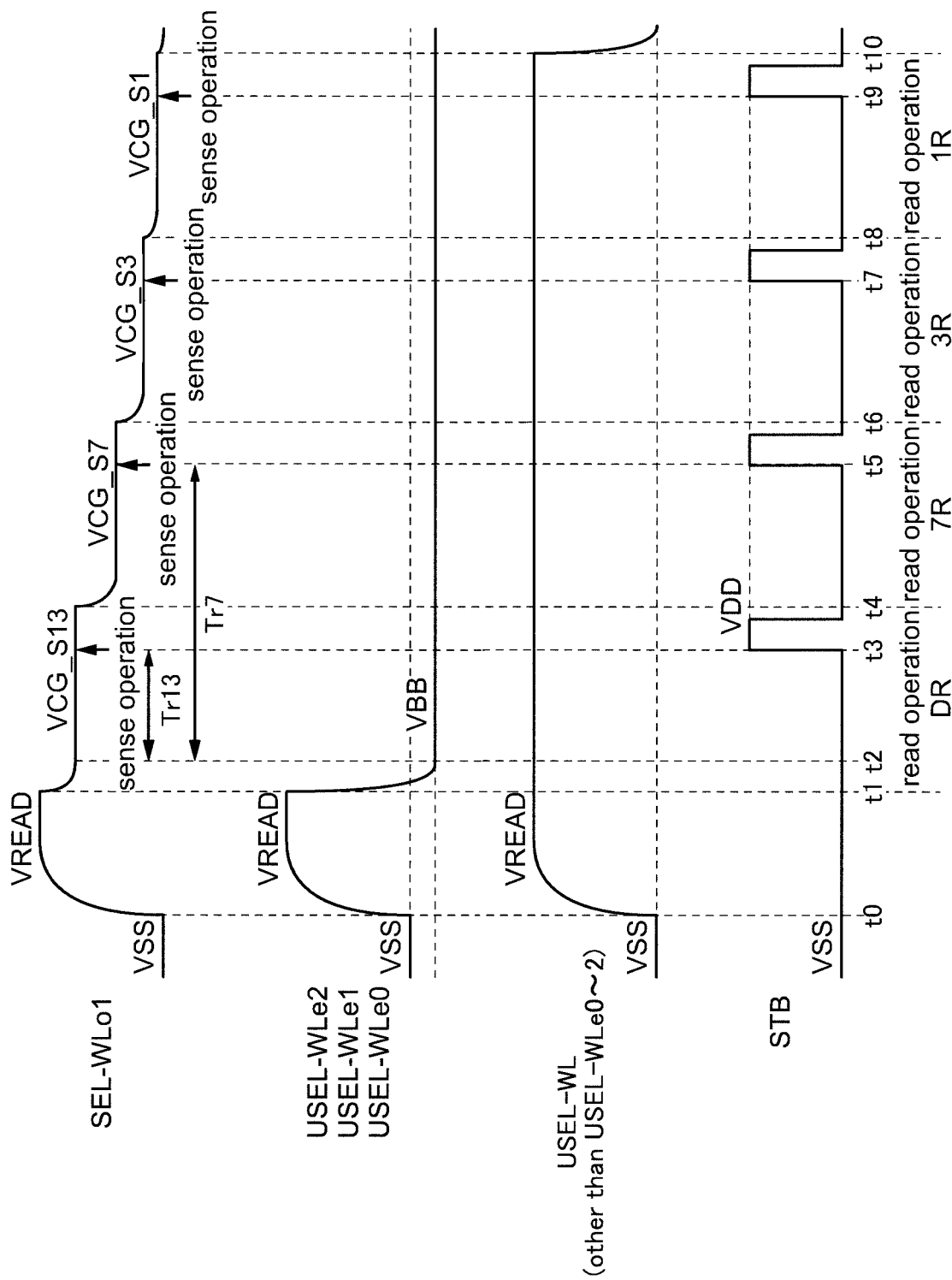
FIG. 22 is a diagram for explaining reading of the top page at the time of a read operation of a semiconductor memory device according to the first embodiment.

Next, a read operation of the semiconductor memory device 1 will be described with reference to FIG. 21 and FIG. 22. FIG. 21 is a diagram showing an example of an order of the sense operation corresponding to the read operation of the semiconductor memory device 1. FIG. 22 is a diagram for explaining the reading of the top page at the time of the read operation of the semiconductor memory device 1. In FIG. 22, a selected odd word line WLo1, an unselected even word line WLe1 facing the selected odd word line WLo1, an unselected even word line WLe0, an unselected even word line WLe2, and the control signal STB are shown, the select gate lines SGD and SGS, the source lines, etc. are omitted. In the semiconductor memory device 1, the read operation is executed after the write operation.

As shown in FIG. 21, the data of the top page is determined by reading the threshold voltages corresponding to each state of the state S13, the state S7, the state S3, and the state S1 in the order of the read operation DR, the read operation 7R, the read operation 3R, and the read operation 1R. That is, the order of the sense operation in the top page is first the sense operation of the read operation DR (reading of the threshold voltage in the state S13), second the sense operation of the read operation 7R (reading of the threshold voltage in the state S7), third the sense operation of the read operation 3R (reading of the threshold voltage in the state S3), and fourth the sense operation of the read operation 1R (reading of the threshold voltage in the state S1). Similar to the top page, the order of the sense operation in the upper page is first the sense operation of the read operation CR (reading of the threshold voltage in the state S12), second the sense operation of the read operation AR (reading of the threshold voltage in the state S10), third the sense operation of the read operation 8R (reading of the threshold voltage in the state S8), and fourth the sense operation of the read operation 2R (reading of the threshold voltage in the state S2). Similar to the top page and the upper page, the order of the sense operation in the middle page is first the sense operation of the read operation FR (reading of the threshold voltage in the state S15), second the sense operation of the read operation 9R (reading of the threshold voltage in the state S9), third the sense operation of the read operation 6R (reading of the threshold voltage in the state S6), and fourth the sense operation of the read operation 4R (reading of the threshold voltage in the state S4). The order of the sense operation in the lower page is first the sense operation of the read operation ER (reading of the threshold voltage in the state S14), second the sense operation of the read operation BR (reading of the threshold voltage in the state S11), and third the sense operation of the read operation 5R (reading of the threshold voltage in the state S5).

As shown in FIG. 22, in the read operation on the top page, up to time to, a selected odd word line SEL-WLo1 and unselected even word lines USEL-WLe0 to 2 (an unselected even word line USEL-WLe2, an unselected even word line USEL-WLe1, and the unselected even word line USEL-WLe0) are supplied with the voltage VSS. Each memory cell transistor MT is in the off state. Until time t3, the control signal STB is supplied with the voltage VSS. In the first embodiment, the voltage VSS is, for example, a voltage that can define other voltages with the voltage VSS as a reference, the voltage VSS may be referred to as a reference voltage, may be 0V, or may be ground.

At time t0 to time t1, the selected odd word line SEL-WLo1 and the unselected even word lines USEL-WLe0 to 2 are supplied with the voltage VREAD.

Subsequently, at time t1 to time t4, the read operation DR is executed. The selected odd word line SEL-WLo1 is supplied with a voltage VCG_S13. The voltage VCG_S13 is, for example, the voltage VD. The unselected even word lines USEL-WLe0 to 2 are supplied with a voltage VBB. At time t3 to time t4, the control signal STB is asserted and the voltage of the control signal STB changes from "H" level (VDD) to "L" level (VSS). As a result, the threshold voltage corresponding to the state 13 can be determined.

The voltage VBB is a voltage lower than the voltage VSS, is a negative voltage. The unselected even word line USEL-WLe1 faces the selected odd word line SEL-WLo1. The unselected even word line USEL-WLe0 and the unselected even word line USEL-WLe2 are adjacent to the unselected even word line USEL-WLe1. By supplying the voltage VBB (negative voltage) to the even word lines USEL-WLe0 to 2, the memory cell transistors MTe0 to 2 (MTe0, MTe1, and MTe2) connected to the even word lines USEL-WLe0 to 2 can be sufficiently turned off. As a result, since the current flowing through via the memory cell transistors MTe0 to 2 to the memory cell transistor MTo1 connected to the selected odd word line SEL-WLo1 can be suppressed, the fluctuation of the threshold of the memory cell transistor MTo1 can be suppressed, and erroneous reading can be suppressed. The unselected even word lines USEL-WLe0 to 2 are supplied with the voltage VREAD to the voltage VBB from time t4 to time t10.

The unselected even word line USEL-WLe to which the voltage VBB is supplied is not limited to the unselected even word lines USEL-WLe0 to 2. For example, the voltage VBB may be supplied to the unselected even word lines USEL-WLe0 to 4 (WLe0, WLe1, WLe2, WLe3, WLe4) and the voltage VBB may be supplied to the unselected even word lines USEL-WLe0 to 7 (WLe0, WLe1, WLe2, WLe3, WLe4, WLe5, WLe6, WLe7). The voltage VBB may be supplied to the unselected even word line USEL-WLe to the extent that the voltage VBB does not affect the selected odd word line SEL-WLo1.

Subsequently, at time t4 to time t6, the read operation 7R is executed. The selected odd word line SEL-WLo1 is supplied with a voltage VCG_S7. The voltage VCG_S7 is, for example, the voltage V7. At time t5 to time t6, the control signal STB is asserted, and similar to the state S13, a threshold voltage corresponding to the state S7 can be determined.

Subsequently, at time t6 to time t8, the read operation 3R is executed. The selected odd word line SEL-WLo1 is supplied with a voltage VCG_S3. The voltage VCG_S3 is, for example, the voltage V3. At time t7 to time t8, the control signal STB is asserted, and similar to the state S13, a threshold voltage corresponding to the state S3 can be determined.

Subsequently, at time t8 to time t10, the read operation 1R is executed. The selected odd word line SEL-WLo1 is supplied with a voltage VCG_S1. The voltage VCG_S1 is, for example, the voltage V1. At time t9 to time t10, the control signal STB is asserted, and similar to the state S13, a threshold voltage corresponding to the state S1 can be determined.

As described above, the read operation of the top page is completed. However, in the read operation, for example, time Tr13 from when the voltage VBB is supplied to the memory cell transistor MTe1 facing the selected memory cell transistor MTo1 (from time t2) until the sense operation (time t3) of the read operation DR is different from time Tr7 from when the voltage VBB is supplied to the memory cell transistor MTe1 facing the selected memory cell transistor MTo1 (from time t2) until the sense operation (time t5) of the read operation 7R. The time Tr13 is shorter than the time Tr7.

Figure 35:
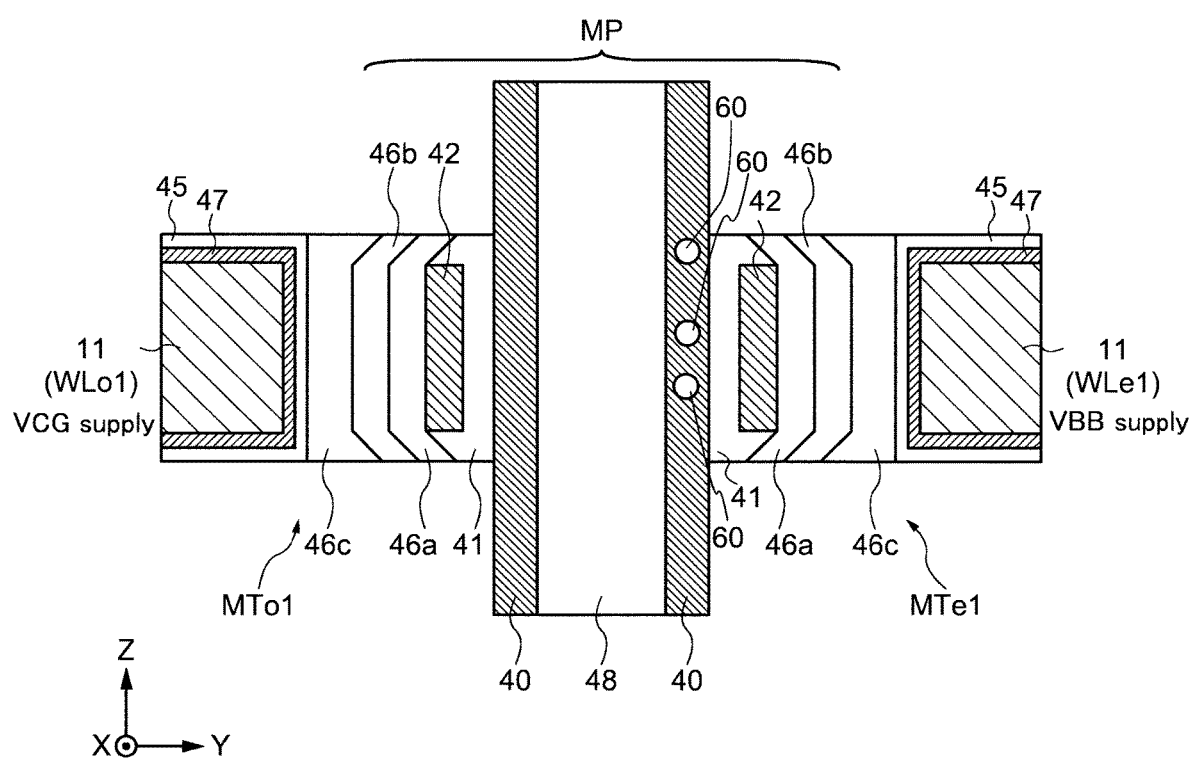
FIG. 35 is a diagram for explaining an operation related to inter-cell interference effects in a semiconductor memory device according to the first embodiment.
Figure 36:
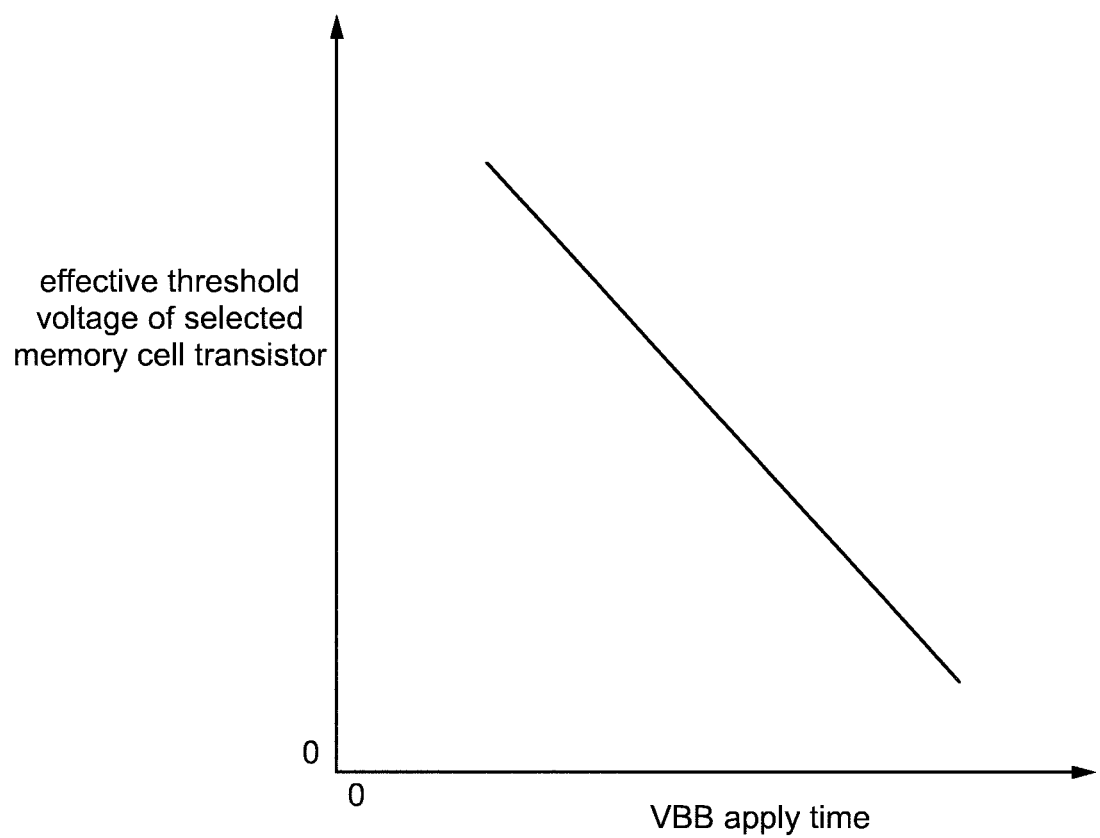
FIG. 36 is a diagram for explaining an operation related to inter-cell interference effects in a semiconductor memory device according to the first embodiment.

An operation related to inter-cell interference effects in the semiconductor memory device 1 will be described with reference to FIG. 8, FIG. 35, and FIG. 36. FIG. 35 is a diagram showing an example that a voltage is supplied to the word line shown in FIG. 9 and a positive hole is excited. FIG. 36 is a schematic diagram showing a relationship between the time when the voltage VBB is applied to the word line (VBB application time) and an effective threshold voltage of the selected memory cell transistor. In the description of the operation related to the inter-cell interference effects in the semiconductor memory device 1, the description of the same or similar configurations as those in FIG. 1 to FIG. 22 may be omitted. In FIG. 36, a relationship between the voltage VBB application time and the effective threshold voltage of the selected memory cell transistor is schematically shown. While FIG. 36 shows an example that the effective threshold voltage of the memory cell transistor selected for the voltage VBB varies linearly, the effective threshold voltage of the memory cell transistor selected for the voltage VBB may vary nonlinearly. In the semiconductor memory device 1 according to the first embodiment, for example, as shown in FIG. 8, two word lines WL are arranged facing each other via the memory pillar MP. Therefore, the conductive layer 42 (FIG. 35) included in the memory cell transistor (e.g., the memory cell transistor MTo) corresponding to one word line (e.g., the word line WLo) faces the conductive layer 42 (FIG. 35) included in the memory cell transistor (e.g., the memory cell transistor MTe) corresponding to the other word line (e.g., the word line WLe). That is, two memory cell transistors (e.g., the memory cell transistors MTo and MTe) are arranged to face each other. In this case, the threshold voltage of the selected memory cell transistor (e.g., the memory cell transistor MTo1) may vary due to the inter-cell interference effects received from the opposing memory cell transistor (e.g., the memory cell transistor MTe1). On the other hand, as shown in FIG. 35, when the voltage VCG is supplied to the selected memory cell transistor (the memory cell transistor MTo1) and the voltage VBB is supplied to the opposing memory cell transistor (the memory cell transistor MTe1), a positive hole 60 is induced. When the positive hole 60 is induced in the opposing memory cell transistor MTe1, it functions as a shield. Therefore, the inter-cell interference effects that the selected memory cell transistor MTo1 is affected by is reduced and the effective threshold voltage of the selected memory cell transistor MTo1 is reduced. The longer the voltage VBB is supplied to the opposing memory cell transistor (e.g., memory cell transistor MTe1), the more likely the positive hole 60 is induced. Therefore, over time, the inter-cell interference effects are reduced and the effective threshold voltage of the selected memory cell transistor (e.g., the memory cell transistor MTo1) decreases. That is, in the semiconductor memory device 1, as shown in FIG. 36, the longer the time the voltage VBB is supplied to the opposing memory cell transistor, the lower the effective threshold voltage of the selected memory cell transistor. In other words, if the time when the voltage VBB is supplied is short, the voltage to be applied to the selected word line (e.g., WLo1) in the read operation or verify operation becomes high, and if the time when the voltage VBB is supplied is long, the voltage to be applied to the selected word line (e.g., WLo1) in the read operation or verify operation becomes low. For example, as described above, the sense operation of the read operation 7R is less affected by the inter-cell interference effects than the sense operation of the read operation DR.

On the other hand, in each state, even when the order of the sense operation in the verify operation differs from the order of the sense operation in the read operation, the time that the voltage VBB is supplied is different. Therefore, in each state, even when the order of the sense operation in the verify operation is different from the order of the sense operation in the read operation, the threshold voltage of the selected memory cell transistor changes due to the inter-cell interference effects received from the opposing memory cell transistor.

As will be described in detail later, in each state according to the semiconductor memory device 1, even when the order of the sense operation in the verify operation is different from the order of the sense operation in the read operations, by setting the voltage supplied to the selected word line at the time of the verify operation higher than or lower than the voltage supplied to the selected word line at the time of the read operation, the inter-cell interference effects received from the opposing memory cell transistor can be suppressed, and the erroneous reading can be suppressed.

1-2-2. Example of Verify Operation

In the following explanation according to the first embodiment, an example in which the sense operation on the top page is executed after the above-described three times verify operations (verify operation 9VR, verify operation 8VR, and verify operation 7VR) are executed will be described with reference to FIG. 23 to FIG. 30, and FIG. 37.

Figure 23:
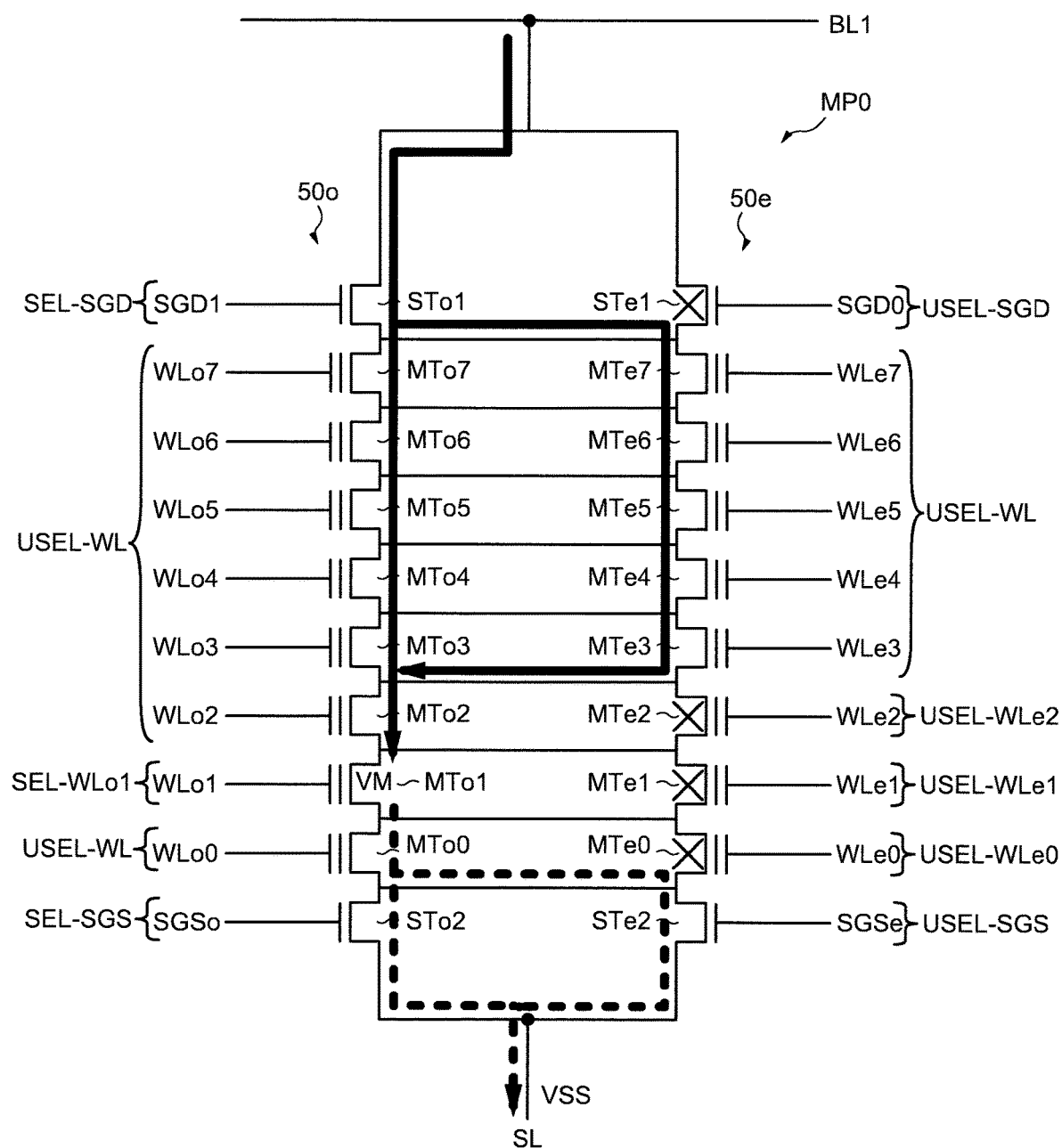
FIG. 23 is an example of a circuit diagram for explaining various signals and current paths at the time of a verify operation of a semiconductor memory device according to the first embodiment.

Various signals and current paths at the time of the verify operation in the semiconductor memory device 1 will be described with reference to FIG. 23. In the example of the verify operation in the semiconductor memory device 1, an example that the verify operation is executed in the memory pillar MP0 will be described. The odd word line WLo1 included in the NAND string 50o of the memory pillar MP0 is supplied with a predetermined voltage VM (e.g., VCG_S7), and the memory cell transistor MTo1 connected to the odd word line WLo1 is selected. When the memory cell transistor MTo1 is selected, the select gate lines SGD1 and SGSo are selected, and the odd word lines WLo0, 2 to 7 (WLo0, WLo2, WLo3, WLo4, WLo5, WLo6, WLo7) other than the odd word line SEL-WLo1 are unselected (not selected). When the memory cell transistor MTo1 is selected, the select gate lines SGD0 and SGSe and the even word lines WLe0 to 2 (WLe0, WLe1, WLe2) included in the NAND string 50e are unselected (not selected), and the even word lines WLe3 to 7 (WLe3, WLe4, WLe5, WLe6, WLe7) other than the even word lines SEL-WLe0 to 2 are unselected (not selected). As a result, a current flows in the path indicated by a bold arrow in FIG. 23, and based on the result that the threshold voltage corresponding to each state of the selected memory cell transistor MTo1 is determined by the sense operation in the verify operation, whether the current flows in the path indicated by a dashed arrow is determined. Specifically, it is determined whether a current flows from the bit line BL1 to the source line SL.

In the following explanation, in the NAND string 50o and the NAND string 50e, the word line WL connected to the selected memory cell transistor MT, which is the target of the verify operation, is referred to as the selected word line SEL-WL, the word line connected to the other memory cell transistors MT is referred to as the unselected word line USEL-WL, the select gate line electrically connected to the selected word line SEL-WL is referred to as a selected select gate line SEL-SGD or SEL-SGS, and the other select gate lines are referred to as an unselected select gate line USEL-SGD or USEL-SGS. In addition, "odd number" may be added to various signal lines included in the NAND string 500, and "even number" may be added to various signal lines included in the NAND string 50e. For example, the selected select gate line included in the NAND string 50o is referred to as a selected odd select gate line SEL-SGDo or SEL-SGSo, the selected word line is referred to as a selected odd word lines SEL-WLo0 to 7 (e.g., SEL-WLo1). Similar to the NAND string 500, the unselected select gate line included in the NAND string 50e is referred to as an unselected odd select gate line USEL-SGDe or USEL-SGSe, and the unselected word line is referred to as the unselected even word lines USEL-WLe1 to 7 (e.g., USEL-WLe1).

1-2-2-1. Example of Verify Operation Up to Time Tv0

Figure 24:
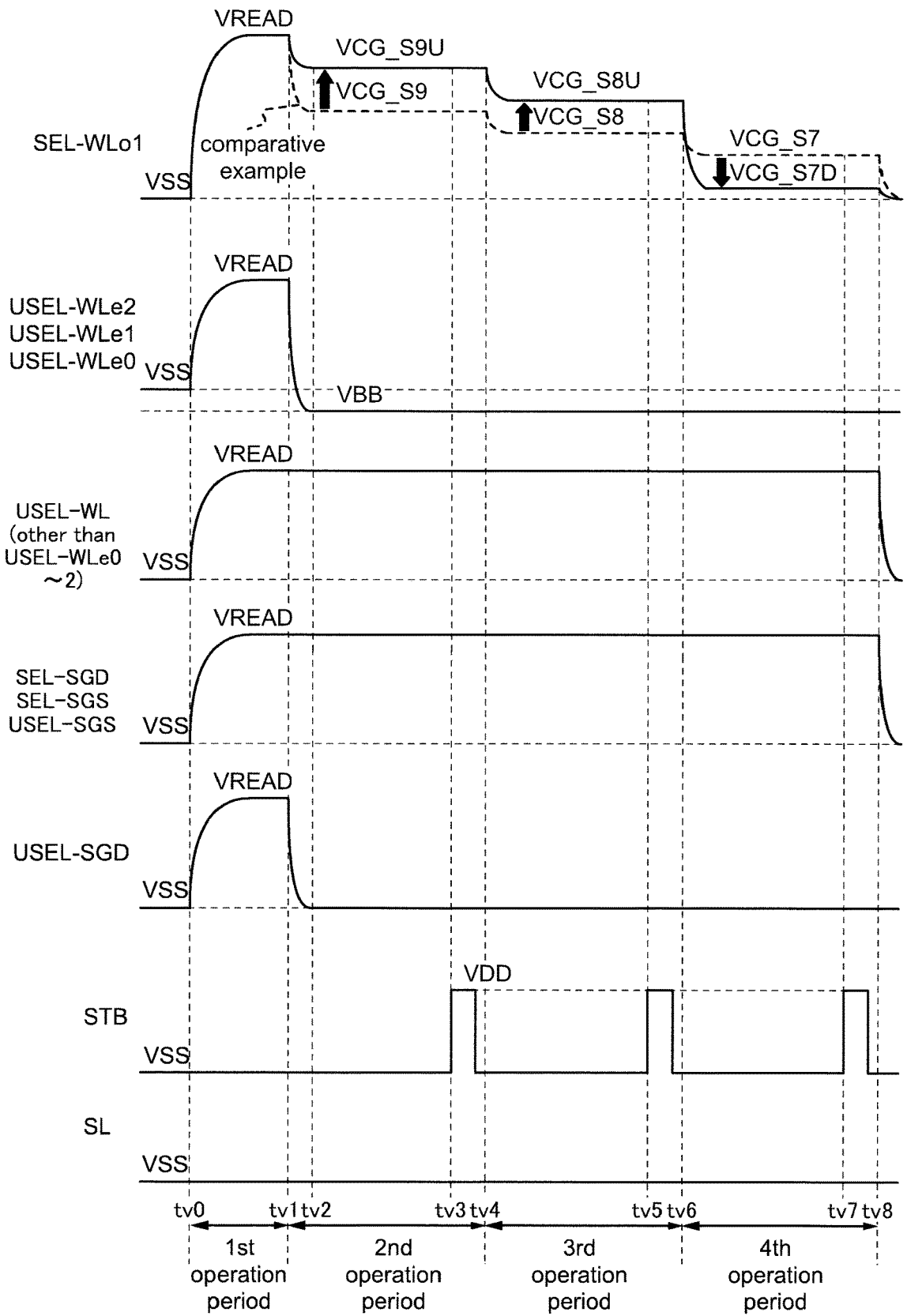
FIG. 24 is a diagram showing a timing chart of various signals at the time of a verify operation in a semiconductor memory device according to the first embodiment.

An example of executing a verify operation up to time tv0 will be described with reference to FIG. 24 and FIG. 25. FIG. 24 is a diagram showing a timing chart of various signals at the time of the verify operation in the semiconductor memory device 1, FIG. 25 is a diagram showing a timing chart of various signals at the time of the verify operation in a semiconductor memory device according to the comparative example.

Figure 25:
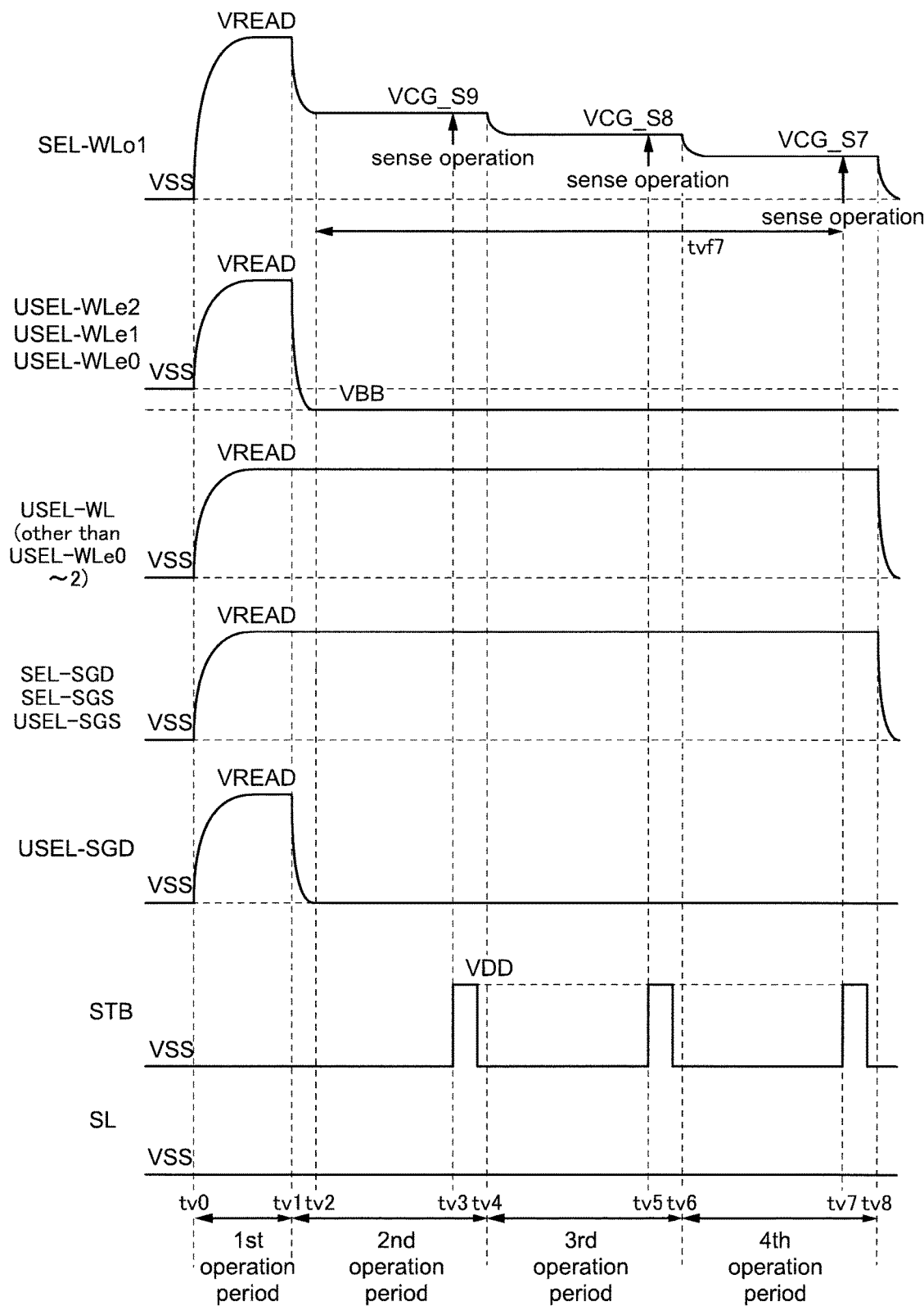
FIG. 25 is a diagram showing a timing chart of various signals at the time of a verify operation in a semiconductor memory device according to a comparative example.

As shown in FIG. 24 and FIG. 25, the verify operation up to time tv0 is, for example, an operation for setting the state of the semiconductor memory device 1 to the standby state. The standby state is, for example, a state of waiting whether to execute the verify operation. Until time tv0, the voltage VSS is supplied to the selected select gate lines SEL-SGD and SGS (the select gate lines SGD1 and SGSo), the unselected select gate line USEL-SGS (the select gate line SGSe), the unselected select gate line USEL-SGD (the select gate line SGD0), the selected odd word line SEL-WLo1, the unselected even word lines WLe0 to 2 (WLe0, WLe1, WLe2), the unselected word line USEL-WL other than the unselected even word lines WLe0 to the 2, the control signal STB, and the source line SL. Until time tv3, the control signal STB is supplied with the voltage VSS. At least until time tv8, the source line SL is supplied with the voltage VSS. Each select transistor ST1 and ST2 and each memory cell transistor MT are in the off state.

1-2-2-2. Example of Verify Operation in First Operation Period (from Time Tv0 to Time Tv1)

Figure 26:
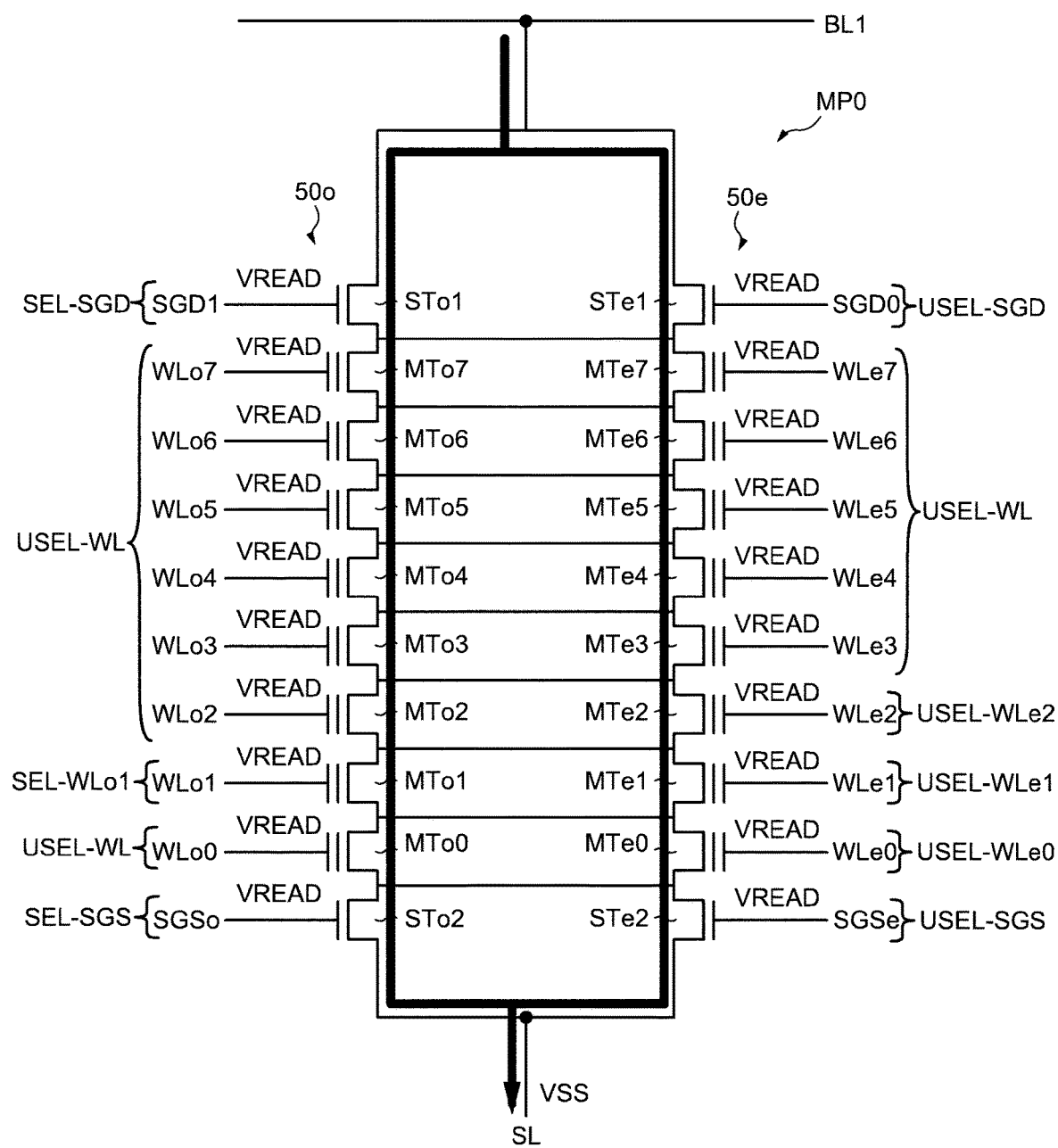
FIG. 26 is an example of a circuit diagram for explaining various signals and current paths in a first operation period shown in FIG. 24.

An example of executing the verify operation in a first operation period will be described with reference to FIG. 24 to FIG. 26. FIG. 26 is an example of a circuit diagram for explaining various signals and current paths in a first operation period shown in FIG. 24.

As shown in FIG. 24 and FIG. 25, the first operation period is, for example, a period for supplying the voltage VREAD to the selected odd word line SEL-WLo1. Specifically, the voltage VREAD is supplied to the selected select gate lines SEL-SGD and SGS, the unselected select gate line USEL-SGS, the unselected select gate line USEL-SGD, the selected odd word line SEL-WLo1, the unselected even word line WLe0-2, and the unselected even word line USEL-WL other than the unselected even word lines WLe0 to 2. Each select transistor ST1 and ST2 and each memory cell transistor MT are in the on state. Therefore, a current flows in a path (from the bit line BL1 to the source line SL) indicated by a bold arrow in FIG. 26. Until the time tv8, the voltage VREAD is supplied to the unselected word line USEL-WL other than the unselected even word lines WLe0 to 2, the selected select gate lines SEL-SGD and SGS, and the unselected select gate line USEL-SGS.

1-2-2-3. Example of Verify Operation in Second Operation Period (from Time Tv1 to Time Tv4)

Figure 27:
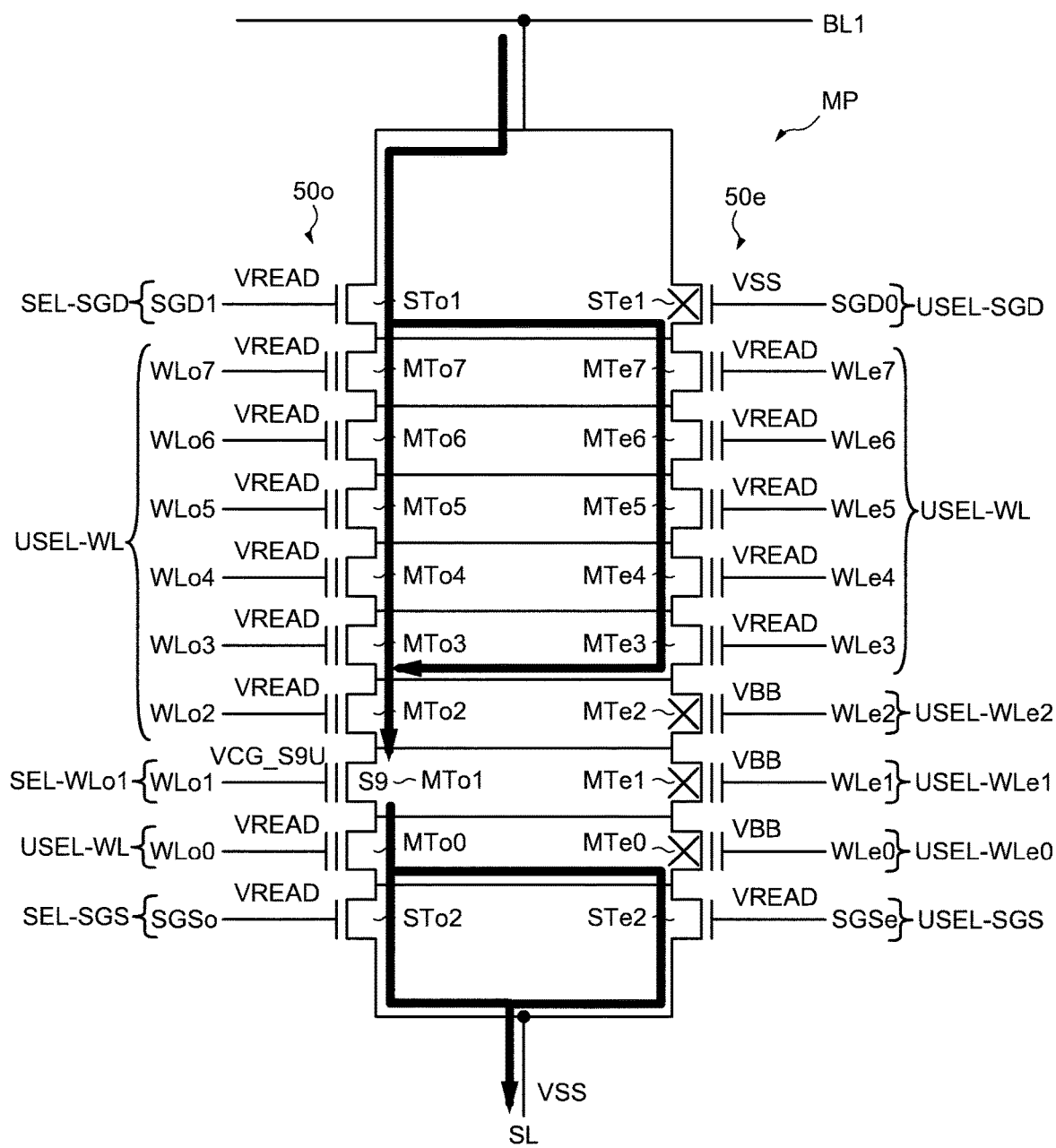
FIG. 27 is an example of a circuit diagram for explaining various signals and current paths in a second operation period shown in FIG. 24.

An example of executing the verify operation of a second operation period will be described with reference to FIG. 24, FIG. 25, and FIG. 27. FIG. 27 is an example of a circuit diagram for explaining various signals and current paths in a second operation period shown in FIG. 24. In the description of "1-2-2-3. Second operation period", the description of the same or similar configurations as those in FIG. 1 to FIG. 26 may be omitted.

As shown in FIG. 24 and FIG. 25, the second operation period is a period that the sense operation of the verify operation 9VR is executed. In the second operation period, the unselected even word lines USEL-WLe0 to 2 are supplied with the voltage VBB from the voltage VREAD, and the unselected select gate line USEL-SGD is supplied with the voltage VSS from the voltage VREAD. The selected odd word line SEL-WLo1 is supplied with a voltage VCG_S9U. The voltage VCG_S9U is a voltage higher than the voltage V9, and a voltage higher than the voltage VCG_S9 supplied to the word line in the semiconductor memory device according to the comparative example (FIG. 25). At time tv3 to time tv4, the control signal STB is asserted (the control signal STB is changed from the "L" level to the "H" level), and the semiconductor memory device 1 can determine a threshold voltage corresponding to the state S9.

As shown in FIG. 27, the select transistors STo1 and STo2, the memory cell transistor MTo0, the memory cell transistors MTo2 to 7 (MTo2, MTo3, MTo4, MTo5, MTo6, MTo7), the memory cell transistors MTe3 to 7 (MTe3, MTe4, MTe5, MTe6, MTe7), and the select transistor STe2 are in the on state, and the memory cell transistors MTe0 to 2 are in the off state. Therefore, from the bit line BL1 to the selected memory cell transistor MTo0, a current flows in a path indicated by a bold arrow in FIG. 27. A current flows in the path indicated by the bold arrow in FIG. 27 according to the result of determining the threshold voltage corresponding to the state S9. As a result, the semiconductor memory device 1 can determine the threshold voltage corresponding to the state S9.

In the verify operation at this time, the sense operation of the verify operation 9VR of the state S9 is executed first in the program loop (FIG. 20 and FIG. 24). On the other hand, in the read operation, the sense operation of the read operation 9R of the state S9 is the second of the sense operation of the middle page (FIG. 21). For example, when the order of the sense operation in the verify operation is earlier than the order of the sense operation in the read operation, the threshold voltage of the memory cell transistor appears to be high in the sense operation in the verify operation. Therefore, in the semiconductor memory device 1, when the order of the sense operation in the verify operation and the order of the sense operation in the read operation are different and the order of the sense operation in the verify operation is earlier than the order of the sense operation in the read operation, the voltage supplied to the selected word line (the word line corresponding to the selected memory cell transistor) at the time of the verify operation is set higher than the voltage supplied to the selected word line at the time of the read operation. As a result, in the semiconductor memory device 1, the fluctuation of the threshold voltage of the selected memory cell transistor can be suppressed to the minimum, and erroneous reading can be suppressed. In FIG. 24, although an example that the verify operation 9VR of the state S9 is executed first has been described, in later program loops, the verify operation 9VR of the state S9 may be executed second or third or later. In the program loop in which the verify operation 9VR of the state S9 is executed second, for example, the voltage supplied to the selected word at the time of the verify operation is set to be the same as the voltage supplied to the selected word at the time of the read operation. In the program loop in which the verify operation 9VR of the state S9 is executed after the third, for example, the voltage supplied to the selected word at the time of the verify operation is set lower than the voltage supplied to the selected word at the time of the read operation.

Similar to the read operation, the voltage VBB is a voltage lower than the voltage VSS and a negative voltage. At least until time tv2 to time tv8, the unselected select gate line USEL-SGD is supplied with the voltage VSS and the unselected even word lines USEL-WLe0 to 2 are supplied with the voltage VBB.

Similar to the time of the read operation, the memory cell transistors MTe0 to 2 (MTe0, MTe1, and MTe2) connected to the unselected even word lines USEL-WLe0 to 2 can be sufficiently turned off by supplying the voltage VBB (negative voltage) to the unselected even word lines USEL-WLe0 to 2 even at the time of the verify operation. As a result, since the current flowing through the memory cell transistor MTo1 connected to the selected odd word line SEL-WLo1 via the memory cell transistors MTe0 to 2 can be suppressed, the fluctuation of the threshold voltage of the memory cell transistor MTo1 can be suppressed, and erroneous reading can be suppressed.

1-2-2-4. Example of Verify Operation in Third Operation Period (from Time Tv4 to Time Tv6)

Figure 28:
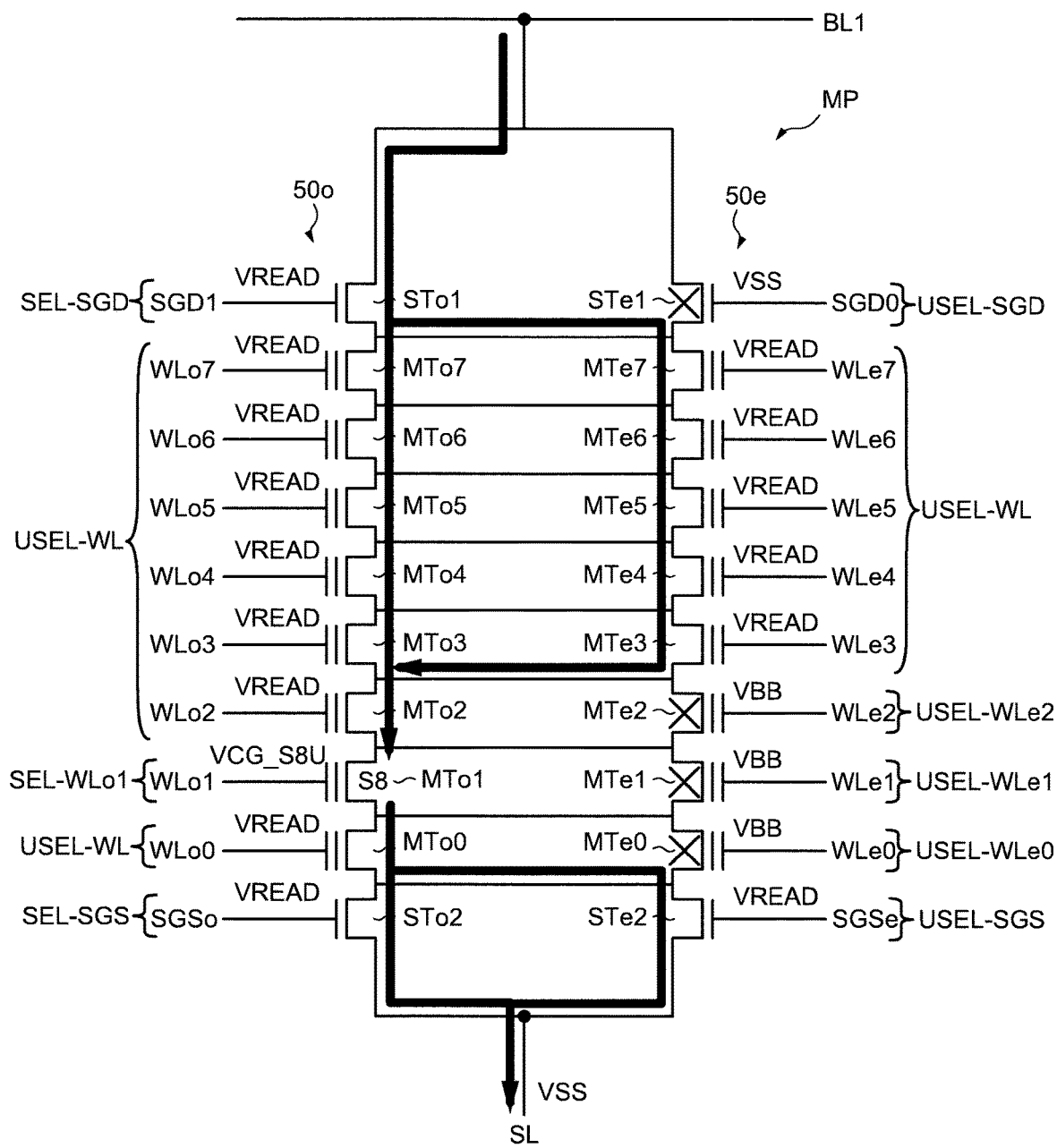
FIG. 28 is an example of a circuit diagram for explaining various signals and current paths in a third operation period shown in FIG. 24.

An example of executing the verify operation of the third operation will be described with reference to FIG. 24, FIG. 25, and FIG. 28. FIG. 28 is an example of a circuit diagram for explaining various signals and current paths in a third operation period shown in FIG. 24. In the description of "1-2-2-4. Third operation period", the description of the same or similar configurations as those in FIG. 1 to FIG. 27 may be omitted.

As shown in FIG. 24 and FIG. 25, the third operation period is a period that the sense operation of the verify operation 8VR is executed. In the third operation period, the selected odd word line SEL-WLo1 is supplied with a voltage VCG_S8U from the voltage VCG_S9U. The voltage supplied to the other signal line is similar to the voltage supplied at the time of time tv4 in the second operation period. The voltage VCG_S8U is, for example, a voltage higher than the voltage V8, and is a voltage higher than the voltage VCG_S8 supplied to the word line in the semiconductor memory device according to the comparative example (FIG. 25). At time tv5 to time tv6, the control signal STB is asserted (the control signal STB is changed from the "L" level to the "H" level), and the semiconductor memory device 1 can determine the threshold voltage corresponding to the state S8.

In the verify operation at this time, the sense operation of the verify operation 8VR of the state S8 is executed second in the program loop (FIG. 20). On the other hand, in the read operation, the sense operation of the read operation 8R of the state S8 is the third of the read operation of the upper page. Therefore, in the verify operation 8VR of the state S8, similar to the verify operation 9VR of the state S9, the voltage supplied to the selected word line at the time of the verify operation is set higher than the voltage supplied to the selected word line at the time of the read operation. As a result, even in the read operation 8R of the state S8, in the semiconductor memory device 1, the fluctuation of the threshold voltage of the selected memory cell transistor can be suppressed to the minimum, and erroneous reading can be suppressed.

Similar to FIG. 27, even in the third operation period, as shown in FIG. 28, the select transistors STo1 and STo2, the memory cell transistor MTo0, the memory cell transistors MTo2 to 7 (MTo2, MTo3, MTo4, MTo5, MTo6, MTo7), the memory cell transistors MTe3 to 7 (MTe3, MTe4, MTe5, MTe6, MTe7), and the select transistor STe2 are in the on state, and the memory cell transistors MTe0 to 2 are in the off state. Therefore, a current flows in a path indicated by a bold arrow in FIG. 28 from the bit line BL1 to the selected memory cell transistor MTo0. A current flows in the path indicated by the bold arrow in FIG. 28 according to the result of determining the threshold voltage corresponding to the state S8. As a result, the semiconductor memory device 1 can determine the threshold voltage corresponding to the state S8.

1-2-2-5. Example of Verify Operation in Fourth Operation Period (from Time Tv6 to Time Tv8)

Figure 29:
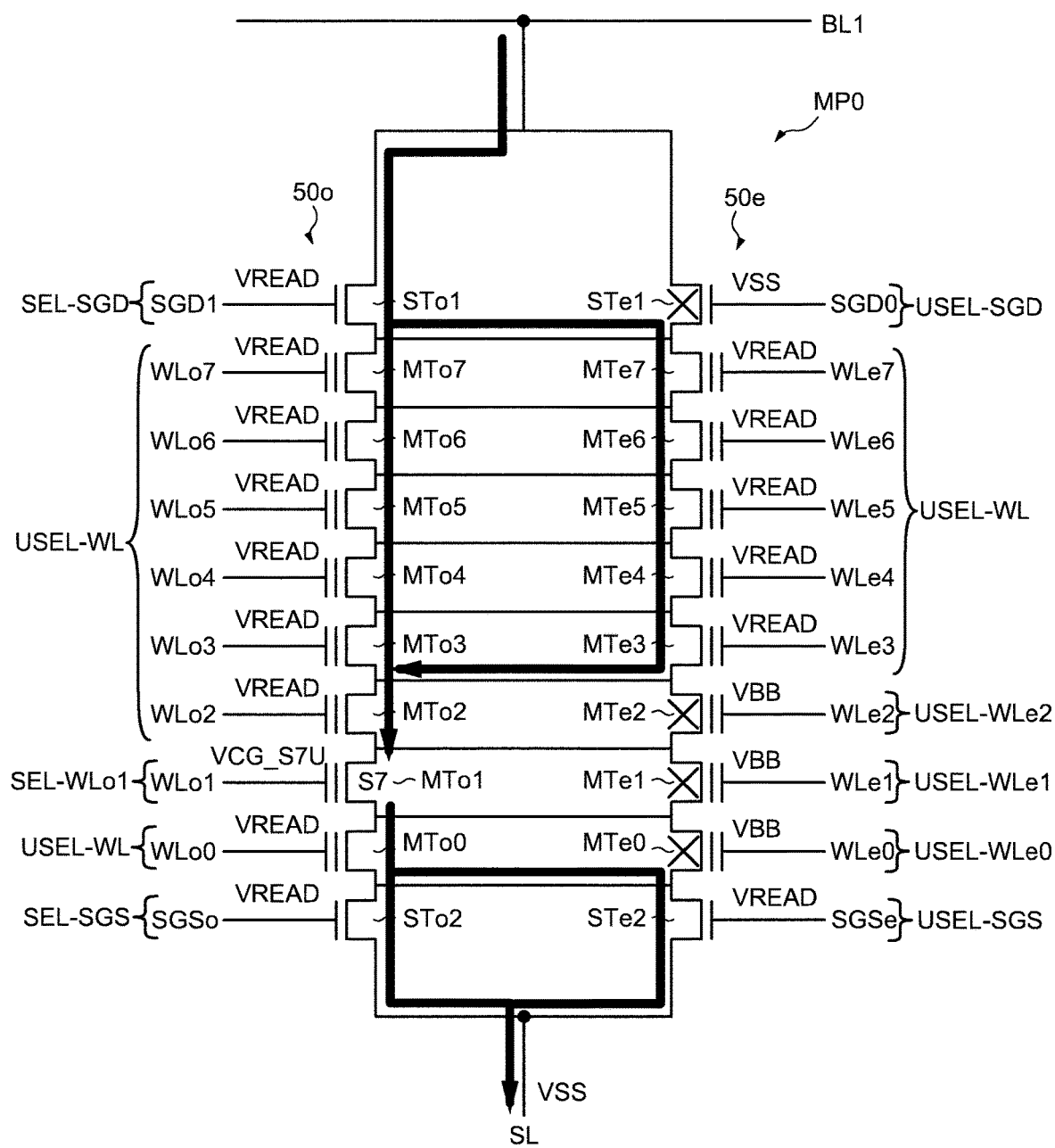
FIG. 29 is an example of a circuit diagram for explaining various signals and current paths in a fourth operation period shown in FIG. 24.

An example that the verify operation of a fourth operation period is executed will be described with reference to FIG. 24, FIG. 25, and FIG. 29. FIG. 29 is an example of a circuit diagram for explaining various signals and current paths in the fourth operation period shown in FIG. 24. In the description of "1-2-2-5. Fourth operation period", the description of the same or similar configurations as those in FIG. 1 to FIG. 27 may be omitted.

As shown in FIG. 24 and FIG. 25, the fourth operation period is a period that the sense operation of the verify operation 7VR is executed. In the fourth operation period, the selected odd word line SEL-WLo1 is supplied with a voltage VCG_S7D from the voltage VCG_S8U. The voltage supplied to the other signal lines is similar to the voltage supplied at the time of time tv6 in the second operation period. The voltage VCG_S7D is, for example, a voltage lower than the voltage V7, and is a voltage lower than the voltage VCG_S7 supplied to the word line in the semiconductor memory device according to the comparative example (FIG. 25). At time tv7 to time tv8, the control signal STB is asserted (the control signal STB is changed from the "L" level to the "H" level), and the semiconductor memory device 1 can determine the threshold voltage corresponding to the state S7.

In the verify operation at this time, the sense operation of the verify operation 7VR of the state S7 is executed second in the program loop (FIG. 20). On the other hand, in the read operation, the sense operation of the read operation 7R in the state S7 is the third of the read operation of the top page. For example, when the order of the sense operation in the verify operation is later than the order of the sense operation in the read operation, the threshold voltage of the memory cell transistor appears to be low in the sense operation in the verify operation. Therefore, in the semiconductor memory device 1, the order of the sense operation in the verify operation is different from the order of the sense operation in the read operation, when the order of the sense operation in the verify operation is later than the order of the sense operation in the read operation, the voltage supplied to the selected word line at the time of the verify operation is set lower than the voltage supplied to the selected word line at the time of the read operation. As a result, in the semiconductor memory device 1, the fluctuation of the threshold voltage of the selected memory cell transistor can be suppressed to the minimum, and erroneous reading can be suppressed.

Similar to FIG. 27 and FIG. 28, even in the fourth operation period, as shown in FIG. 29, the select transistors STo1 and STo2, the memory cell transistor MTo0, the memory cell transistors MTo2 to 7 (MTo2, MTo3, MTo4, MTo5, MTo6, MTo7), the memory cell transistors MTe3 to 7 (MTe3, MTe4, MTe5, MTe6, MTe7), and the select transistor STe2 are in the on state, and the memory cell transistors MTe0 to 2 are in the off state. Therefore, a current flows in a path indicated by a bold arrow in FIG. 29 from the bit line BL1 to the selected memory cell transistor MTo0. A current flows in the path indicated by the bold arrow in FIG. 29 according to the result of determining the threshold voltage corresponding to the state S7. As a result, the semiconductor memory device 1 can determine the threshold voltage corresponding to the state S8.

1-2-2-6. Example of Flow of Write Operation

Figure 30:
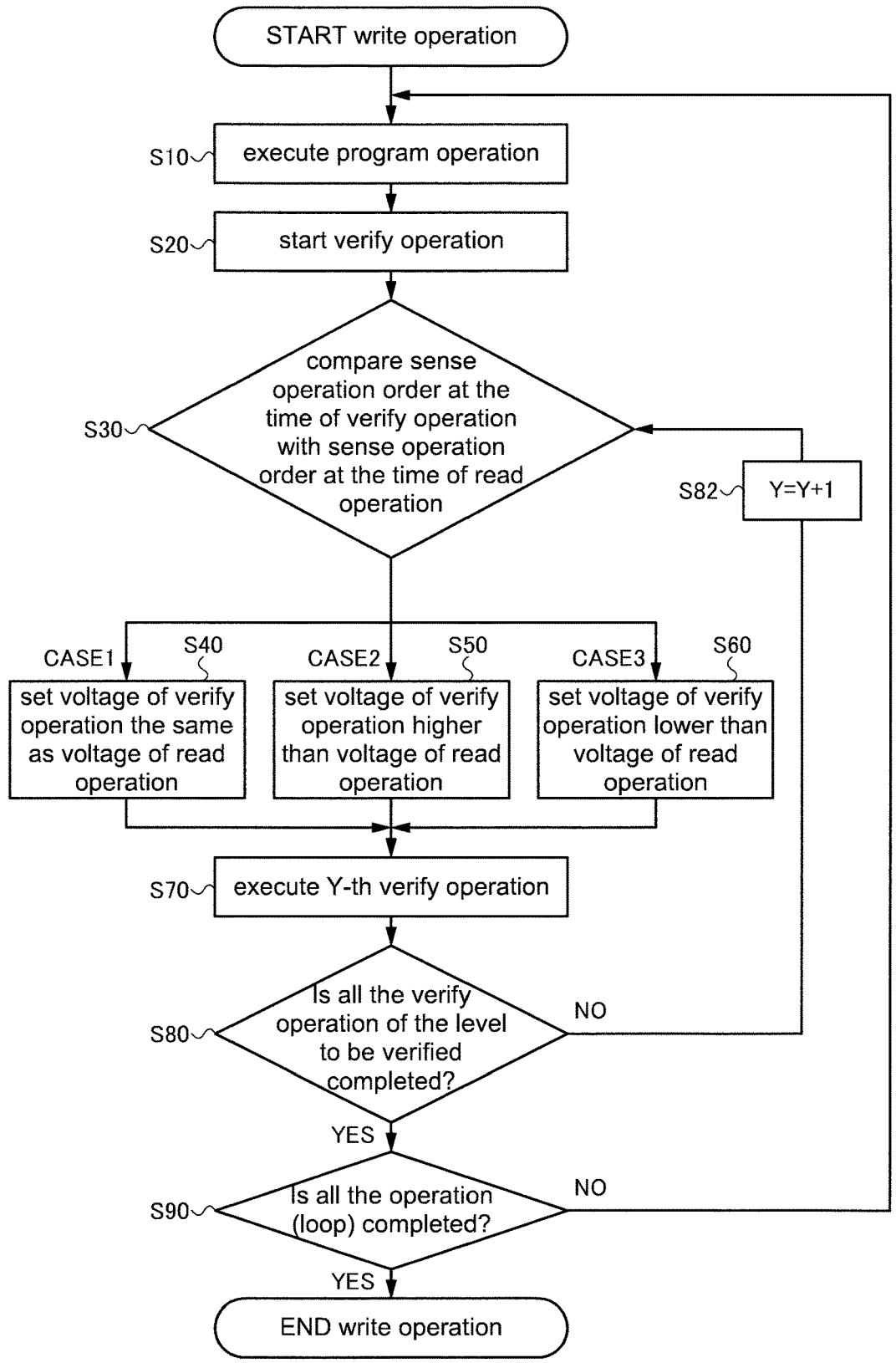
FIG. 30 is a diagram showing a flow chart of a verify operation in a semiconductor memory device according to the first embodiment.
Figure 37:
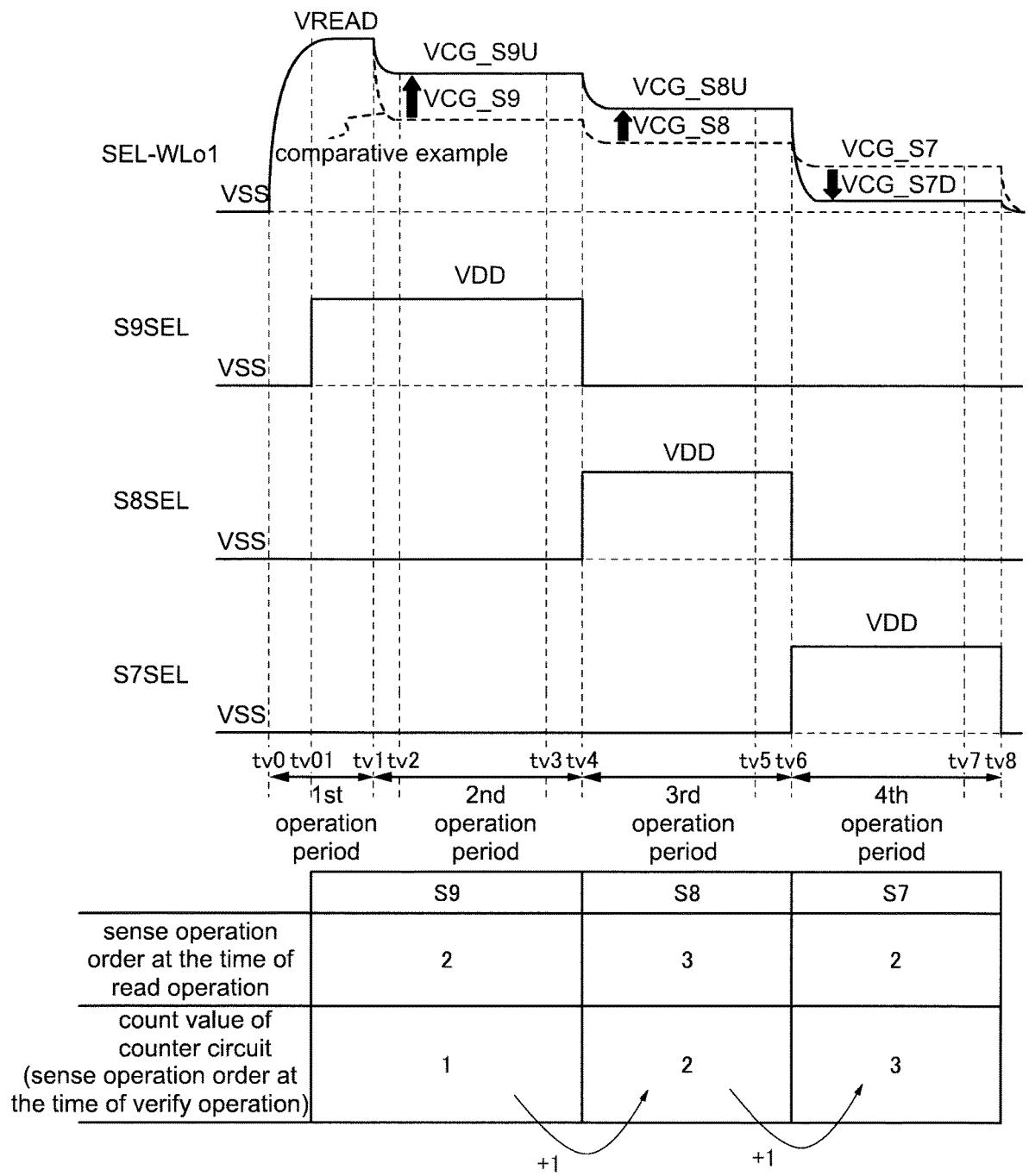
FIG. 37 is a diagram showing a timing chart of various signals at the time of a verify operation in a semiconductor memory device according to the first embodiment.

An example of a flow of the write operation will be described with reference to FIG. 30 and FIG. 37. FIG. 30 is a diagram showing a flow chart of the verify operation in the semiconductor memory device 1. FIG. 37 is a diagram showing a timing chart of various signals at the time of the verify operation of the semiconductor memory device 1. In the description of "1-2-2-6. Example of flow of write operation", the description of the same or similar configurations as those in FIG. 1 to FIG. 29, FIG. 35, and FIG. 36 may be omitted. The selected odd number word line SEL-WLo1 shown in FIG. 37 is similar to the selected odd number word line SEL-WLo1 described with reference to FIG. 24, and the description of the selected odd number word line SEL-WLo1 shown in FIG. 37 is omitted here.

In the semiconductor memory device 1, when the write operation is started, in step S10, the sequencer 24 controls the sense amplifier 70, the row decoder 29, the voltage generation circuit 27, and the driver set 28, etc., to execute the program operation.

In step S20 following step S10, the sequencer 24 controls the sense amplifier 70, the row decoder 29, the voltage generation circuit 27, and the driver set 28, etc., to start the verify operation.

Subsequently, in step S30, the sequencer 24 compares the sense operation order at the time of the verify operation with the sense operation order at the time of the read operation, generates a comparison result, and determines the relationship between the sense operation order at the time of the verify operation and the sense operation order at the time of the read operation using the comparison result.

For example, the sequencer 24 has a table in which each state is associated with the voltage in the read operation or verify operation as shown in FIG. 14, a table in which each state is associated with the read operation as shown in FIG. 21, and a memory device for storing a table in which each state is associated with the verify operation as shown in FIG. 20. The sequencer 24 uses the counter circuit 24A (FIG. 1) to count a count value of the counter circuit as shown in FIG. 37 (the sense operation order at the time of the verify operation) for each program loop. In addition, the sequencer 24 uses the internal signal generated in the sequencer 24 (e.g., a state S9 selection signal S9SEL, a state S8 selection signal S8SEL, and a state S7 selection signal S7SEL shown in FIG. 37), and a table as shown in FIG. 21 to recognize the order of the state and the verify operation started at that time.

In step S30, the sequencer 24 uses the internal signal to recognize the state of the verify operation started at that time. In addition, the sequencer 24 compares the sense operation order at the time of the read operation of the state with the count value in the counter circuit (the sense operation order at the time of the verify operation) to generate a comparison result. The count value of the counter circuit 24A (the sense operation order at the time of the verify operation) is set to 1. For example, as shown in FIG. 37, from time tv01 in the first operation period to time tv4 in the second operation period, the state S9 selection signal S9SEL is supplied with VDD, the state S8 selection signal S8SEL, and the state S7 selection signal S7SEL are supplied with VSS. From time tv01 to time tv4, the sequencer 24 recognizes that the verify operation 9VR of the state S9 has started. The order of the sense operation at the time of the read operation of the state S9 of the started verify operation 9VR is the second. The sequencer 24 compares the order (second) of the sense operation at the time of the read operation of the state S9 with the count value of the counter circuit (the sense operation order at the time of the verify operation, first) to generate the comparison result.

Similar to time tv01 to time tv4, as shown in FIG. 37, from time tv4 to time tv6, the state S8 selection signal S8SEL is supplied with VDD, the state S9 selection signal S9SEL and the state S7 selection signal S7SEL are supplied with VSS. From time tv4 to time tv6, the sequencer 24 recognizes that the verify operation VR8 of the state S8 has started. Also, the sequencer 24 adds (counts up) 1 to the count value of the counter circuit 24A (the sense operation order in the verify operation) and sets the count value to 2. The sense operation order at the time of the read operation of the state S8 of the started verify operation 8VR is the third. The sequencer 24 compares the order (third) of the sense operation at the time of the read operation with the count value of the counter circuit (the sense operation order at the time of the verify operation, second) to generate the compare result.

Similar to time tv4 to time tv6, as shown in FIG. 37, from time tv6 to time tv8, the state S7 selection signal S7SEL is supplied with VDD, the state S8 selection signal S8SEL and the state S9 selection signal S9SEL are supplied with VSS. From time tv6 to time tv8, the sequencer 24 recognizes that the verify operation 7VR of the state S7 has started. Also, the sequencer 24 adds (counts up) 1 to the count value of the counter circuit 24A (the sense operation order at the time of the verify operation) and sets the count value to 3. The order of the sense operation at the time of the read operation of the state S7 of the started verify operation 7VR is the second. The sequencer 24 compares the order (second) of the sense operation at the time of the read operation with the count value of the counter circuit (the sense operation order at the time of the verify operation, third) to generate the comparison result.

Subsequently, the sequencer 24 uses the comparison result to determine whether the sense operation order at the time of the verify operation is the same as the sense operation order at the time of the read operation, whether the sense operation order at the time of the verify operation is earlier than the sense operation order at the time of the read operation, or whether the sense operation order at the time of the verify operation is later than the sense operation order at the time of the read operation, and proceeds to step S40, step S50, or step S50 according to the determination result. A table in which each state is associated with a voltage in the read operation or verify operation as shown in FIG. 14, a table in which each state is associated with the read operation as shown in FIG. 21, and a table in which each state is associated with the verify operation as shown in FIG. 20 may be stored in the memory cell array 21. In this case, for example, the semiconductor memory device 1 may read information of the table from the memory cell array 21 at the time of power source input, and cause a register circuit (not shown) included in the sequencer 24 to hold the information.

As a result of the determination, when the sense operation order at the time of the verify operation is the same as the sense operation order at the time of the read operation, that is CASE1 in step S30, step S40 is executed. When the sense operation order at the time of verify operation is earlier than the sense operation order at the time of the read operation, that is CASE2 in step S30, step S50 is executed. When the sense operation order at the time of the verify operation is later than the sense operation order at the time of the read operation, that is CASE3 in step S30, step S60 is executed.

In step S40, for example, the sequencer 24 sets the voltage supplied to the selected word line at the time of the verify operation to be the same as the voltage supplied to the selected word line at the time of the read operation. In step S50, for example, the sequencer 24 sets the voltage supplied to the selected word line at the time of the verify operation higher than the voltage supplied to the selected word line at the time of the read operation. In step S60, for example, the sequencer 24 sets the voltage supplied to the selected word line at the time of the verify operation to be lower than the voltage supplied to the selected word line at the time of the read operation.

In this embodiment, although it is assumed that the reference value of the voltage supplied to the selected word line for the sense operation for a certain state at the time of the verify operation is the same as the voltage supplied to the selected word line for the sense operation for the corresponding state at the time of the read operation, it is not limited thereto. For example, the reference value of voltage supplied to the selected word line for the sense operation for a certain state at the time of the verify operation may be set higher than the voltage supplied to the selected word line for the sense operation for the state at the time of the read operation. In this case, in step S40, the sequencer 24 sets the voltage supplied to the selected word line at the time of the verify operation to be higher than the voltage supplied to the selected word line at the time of the read operation. In step S50, the sequencer 24 sets the voltage supplied to the selected word line at the time of the verify operation to be higher than the voltage set in step S40. Similarly, in step S60, the sequencer 24 sets the voltage supplied to the selected word line at the time of the verify operation to be lower than the voltage set in step S40.

Following step S40, step S50, or step S60, in step S70, the sequencer 24 controls the sense amplifier 70, the row decoder 29, the voltage generation circuit 27, and the driver set 28, and the like so that the voltage supplied to the selected word line executes the verify operation using the voltage in which the voltage supplied to the selected word line has set higher than the voltage at the time of the read operation. The semiconductor memory device 1 executes Y-th verify operation.

Subsequently, in step S80, for example, the sequencer 24 determines whether all the verify operation has been completed for the levels to be verified, which is the memory cell transistor MT that has not reached the target level. As a result of the determination, when all the verify operation has been completed, that is YES in step S80, step S90 is executed. If the verify operation has not been completed, that is NO in step S80, step S82 is executed.

In step S82, for example, the sequencer 24 counts up the numerical value Y by one to make it Y+1 and executes step S30. In step S30 after step S82, the sequencer 24 compares the sense operation order at the time of the verify operation with the sense operation order at the time of the read operation with respect to the verify operation in the numerical value Y+1st to generate a comparison result. Also, the sequencer 24 uses the comparison result to determine whether the sense operation order at the time of the verify operation is earlier than the sense operation order at the time of the read operation. Further, after step S40, step S50, or step S60, step S70 is executed.

Next, in step S90 following step S80, for example, the sequencer 24 determines whether all the write operation (program loop) has been completed, and generates a determination result. As a result of the determination, when all the write operation (program loop) have been completed, that is YES in Step S90, the write semiconductor memory device 1 ends the write operation. Also, as a result of the determination, when all the write operation (program loop) have not been completed, that is NO in step S90, the semiconductor memory device 1 returns to step S10, starts a different program loop, and executes the program operation corresponding to the different program loop.

For example, as described in "1-2-2-3. Second operation period" and the above step S30, when the sense operation of the verify operation 9VR of the state S9 is earlier than the sense operation of the read operation 9R of the state S9, the sequencer 24 compares the order (first) of the sense operation of the verify operation 9VR of the state S9 with the order (second) of the sense operation of the read operation 9R of the state S9 to generate a comparative result in a step S30. In addition, the sequencer 24 uses the comparison result to determine that the sense operation of the verify operation 9VR of the state S9 is earlier than the sense operation of the read operation 9R of the state S9, and generates a determination result including the determination that the sense operation of the verify operation 9VR of the state S9 is earlier than the sense operation of the read operation 9R of the state S9. Subsequently, in step S50, the sequencer 24 uses the determination result (that the sense operation of the verify operation 9VR of the state S9 is earlier than the sense operation of the read operation 9R of the state S9) to set the voltage used in the verify operation 9VR to the voltage VCG_S9U higher than the voltage VCG_S9 used in the read operation. Further, in step S70 following step S50, for example, as shown in FIG. 24 and FIG. 37, the sequencer 24 controls the sense amplifier 70, the row decoder 29, the voltage generation circuit 27, and the driver set 28 and the like to execute the first verify operation 9VR using the voltage VCG_S9U. The semiconductor memory device 1 executes the verify operation.

For example, in S70, the first verify operation 9VR is executed, and when the threshold voltage of the selected memory cell transistor MTo1 connected to the selected odd word line SEL-WLo1 reaches the target level, the first verify operation 9VR ends. The second verify operation 8VR and the third verify operation 7VR of the three times verify operations (verify operation 9VR, verify operation 8VR, and verify operation 7VR) have not been completed. Therefore, the sequencer 24 determines that all the verify operations have not been completed. The semiconductor memory device 1 executes step S82.

In step S82, the sequencer 24 counts up the numerical value Y (1 in this case) by 1 to make it 2 and executes step S30. In step S30 after step S82, the sequencer 24 compares the sense operation order at the time of the verify operation and the sense operation order at the time of the read operation with respect to the second verify operation 8VR, generates a comparison result, and determines whether the sense operation order at the time of the verify operation is earlier than the sense operation order at the time of the read operation using the comparison result. For example, as described in "1-2-2-4. Third operation period" and in step S30 described above, when the sense operation of the verify operation 8VR of the state S8 is earlier than the sense operation of the read operation 8R of the state S8, in step S30, the sequencer 24 compares the order (second) of the sense operation of the verify operation 8VR of the state S8 with the order (third) of the sense operation of the read operation 8R of the state S8 to generate a comparison result. Based on the comparison result, it is determined whether the sense operation of the verify operation 8VR of the state S8 is earlier than the sense operation of the read operation 8R of the state S8. More specifically, for example, a determination result including that the sense operation of the verify operation 8VR of the state S8 is earlier than the sense operation of the read operation 8R of the state S8 is generated. In this case, in step S50, using the determination result (that the sense operation of the verify operation 8VR of the state S8 is earlier than the sense operation of the read operation 8R of the state S8), the voltage used in the verify operation 8VR is set to the voltage VCG_S8U higher than the voltage VCG_S8 used in the read operation 8R. Further, in step S70 following step S50, as shown in FIG. 24 and FIG. 37, the sequencer 24 controls the sense amplifier 70, the row decoder 29, the voltage generation circuit 27, and the driver set 28 and the like to execute the second verify operation 8VR using the voltage VCG_S8U. The semiconductor memory device 1 executes the verify operation.

For example, in step S70, the second verify operation 8VR is executed, and when the threshold voltage of the selected memory cell transistor MTo1 connected to the selected odd word line SEL-WLo1 reaches the target level, the second verify operation 8VR ends. The third verify 7VR of the three time of verify operations (verify operation 9VR, verify operation, verify 8VR, and verify operation 7VR) has not been completed. Therefore, the sequencer 24 determines that all the verify operations have not been completed. The semiconductor memory device 1 executes step S82.

In step S82, the sequencer 24 counts up the numerical value Y (here, 2) by 1 to make it 3 and executes step S30. In step S30 after step S82, the sequencer 24 compares the sense operation order at the time of the verify operation and the sense operation order at the time of the read operation with respect to the third verify operation 7VR, generates a comparison result, and determines whether the sense operation order at the time of the verify operation is earlier than the sense operation order at the time of the read operation using the comparison result. For example, as described in "1-2-2-5. Fourth operation period" and in step S30 described above, when the sense operation of the verify operation 7VR of the state S7 is later than the sense operation of the read operation 7R of the state S7, in a step S30, the sequencer 24 compares the order (third) of the sense operation of the verify operation 7VR of the state S7 with the order (second) of the sense operation of the read operation 7R of the state S7 to generate a comparative result. Based on the compared result, it is determined whether the sense operation of the verify operation 7VR of the state S7 is earlier than the sense operation of the read operation 7R of the state S7. More specifically, for example, a determination result including that the sense operation of the verify operation 7VR of the state S7 is later than the sense operation of the read operation 7R in the state S7 is generated. In this case, in step S60, using the determination result (that the sense operation of the verify 7VR of the state S7 is later than the sense operation of the read operation 7R of the state S7), the voltage used in the verify operation 7VR is set to the voltage VCG_S7D lower than the voltage VCG_S7 used in the read operation 7R. Further, in step S70 following step S50, for example, as shown in FIG. 24 and FIG. 37, the sequencer 24 controls the sense amplifier 70, the row decoder 29, the voltage generation circuit 27, and the driver set 28 and the like to execute the third verify operation 7VR using the voltage VCG_S7D. The semiconductor memory device 1 executes the verify operation.

For example, in step S70, the third verify operation 7VR is executed, and when the threshold voltage of the selected memory cell transistor MTo1 connected to the selected odd word line SEL-WLo1 reaches the target level, the third verify operation 7VR ends. Therefore, in step S80 following step S70, the sequencer 24 determines that the above-described three times verify operations (the verify operation 9VR, the verify operation 8VR, and the verify operation 7VR which are different from each other) have been completed and that all the verify operations have been completed.

Following the step S80, in step S90, for example, the sequencer 24 determines whether all the write operation (program loop) has been completed, and generates a determination result. When all the write operation (program loop) have been completed, that is YES in step S90, the semiconductor memory device 1 ends the write operation. Also, as a result of the determination, when all the write operation (program loop) has not been completed, that is NO in step S90, the semiconductor memory device 1 returns to step S10, starts a different program loop, and executes the program operation corresponding to the different program loop.

Second Embodiment

In the semiconductor memory device 1 according to the second embodiment, an example of the verify operation different from the example of the verify operation according to the first embodiment will be described. In the voltage supplied to the selected odd word line SEL-WLo1 and the voltage supplied to the unselected even word lines WLe0 to WLe2 (WLe0, WLe1, WLe2), an example of the verify operation of the semiconductor memory device 1 according to the second embodiment is different from the example of the verify operation according to the first embodiment, and the other points are the same. In the semiconductor memory device 1 according to the second embodiment, the voltage supplied to the selected odd word line SEL-WLo1 and the voltage supplied to the unselected even word lines WLe0 to WLe2 (WLe0, WLe1, WLe2) will be mainly described.

Similar to the first embodiment, in the following explanation according to the second embodiment, an example in which the sense operation in the top page is executed after the three times verify operations (the verify operation 9VR, the verify operation 8VR, and the verify operation 7VR which are different from each other) described above are executed will be described with reference to FIG. 31 to FIG. 34. In an example of the verify operation in the semiconductor memory device 1 according to the second embodiment, similar to the first embodiment, an example in which the verify operation of the memory pillar MP0 is mainly executed will be described. In the description of the semiconductor memory device 1 according to the second embodiment, the description of the same or similar configurations as those in FIG. 1 to FIG. 30 and FIG. 35 to FIG. 37 may be omitted.

Similar to the first embodiment, in the following explanation according to the second embodiment, the word line WL to be subjected to the verify operation in the NAND string 50o and the NAND string 50e and connected to the selected memory cell transistor MT is referred to as the selected word line SEL-WL, the word line connected to the other memory cell transistors MT is referred to as the unselected word line USEL-WL, the select gate line electrically connected to the selected word line SEL-WL is referred to as the selected select gate line SEL-SGD or SEL-SGS, and the other select gate lines are referred to as the unselected select gate lines USEL-SGD or USEL-SGS. Various signal lines included in the NAND string 50o may be appended with "odd number" and various signal lines included in the NAND string 50e may be appended with "even number". For example, the select gate line included in the NAND string 50o is referred to as the selected odd select gate line SEL-SGDo or SEL-SGSo, and the selected word line is referred to as the selected odd word lines SEL-WLo0 to 7 (e.g., SEL-WLo1). Similar to the NAND string 50o, the unselected select gate line included in the NAND string 50e is referred to as the unselected odd select gate line USEL-SGDe or USEL-SGSe, and the unselected word line is referred to as the unselected even word lines USEL-WLe1 to 7 (e.g., USEL-WLe1).

Figure 31:
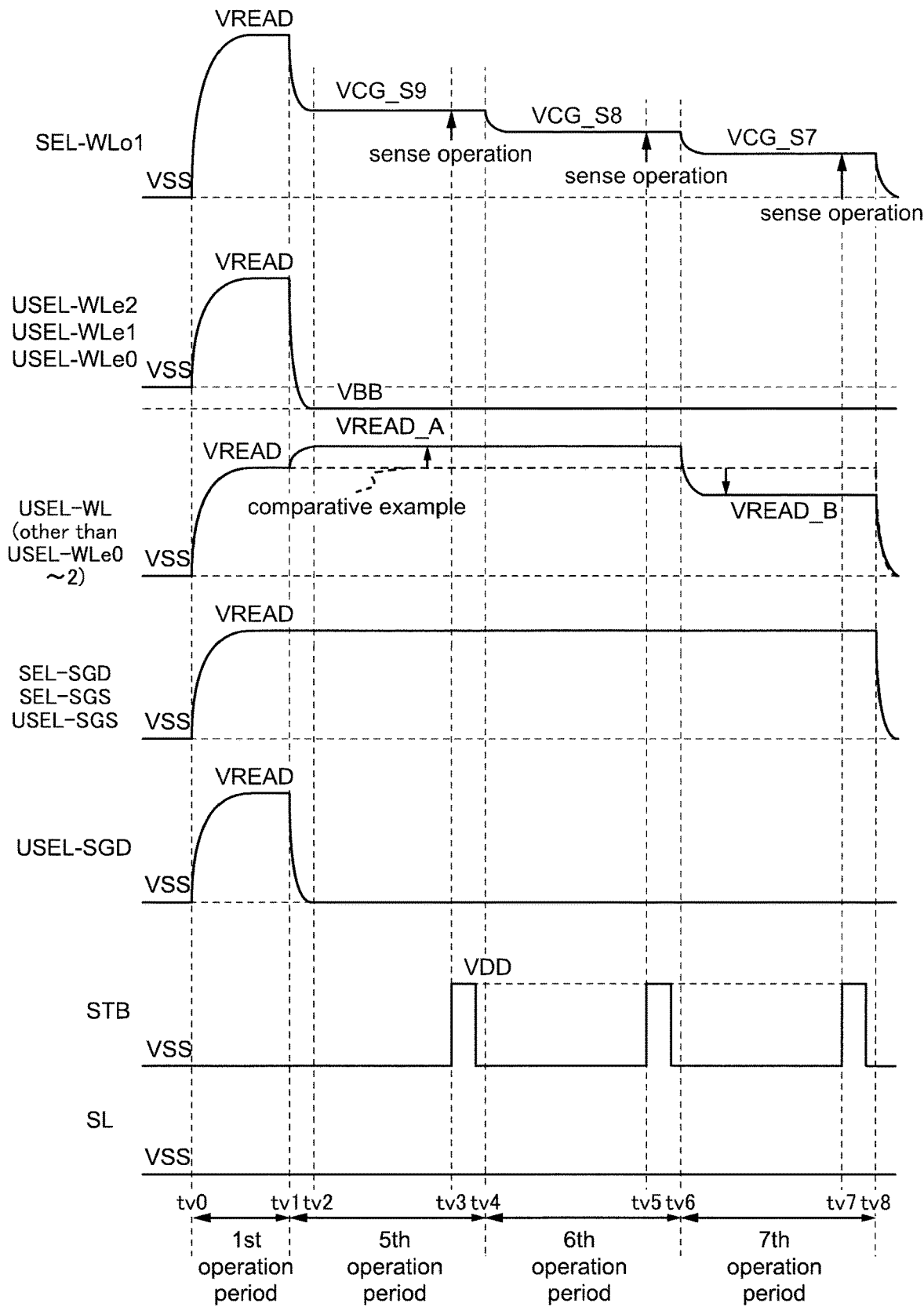
FIG. 31 is a diagram showing a timing chart of various signals at the time of a verify operation in a semiconductor memory device according to the second embodiment.

A timing chart of various signals at the time of the verify operation in the semiconductor memory device 1 according to the second embodiment will be described with reference to FIG. 31. The timing charts of the selected odd word line SEL-WLo1, the selected select gate lines SEL-SGD and SGS (the select gate lines SGD1 and SGSo), the unselected select gate line USEL-SGS (the select gate line SGSe), the unselected select gate line USEL-SGD (the select gate line SGD0), the unselected word line USEL-WL other than the unselected even word lines WLe0 to 2, the control signal STB, and the source line SL shown in FIG. 31 are the same as the timing charts of the verify operation according to the first embodiment described with reference to FIG. 24 or FIG. 25, and therefore, the timing charts are described here as needed.

Since the verify operation up to tv0 and the verify operation in the first operation period is the same as the operations described in "1-2-2-1. Example of verify operation up to time tv0" and "1-2-2-2. Example of verify operation in the first operation period (from time tv0 to time tv1)", the explanation here is omitted.

2-1. Example of Verify Operation in Fifth Operation Period (from Time Tv1 to Time Tv4)

Figure 32:
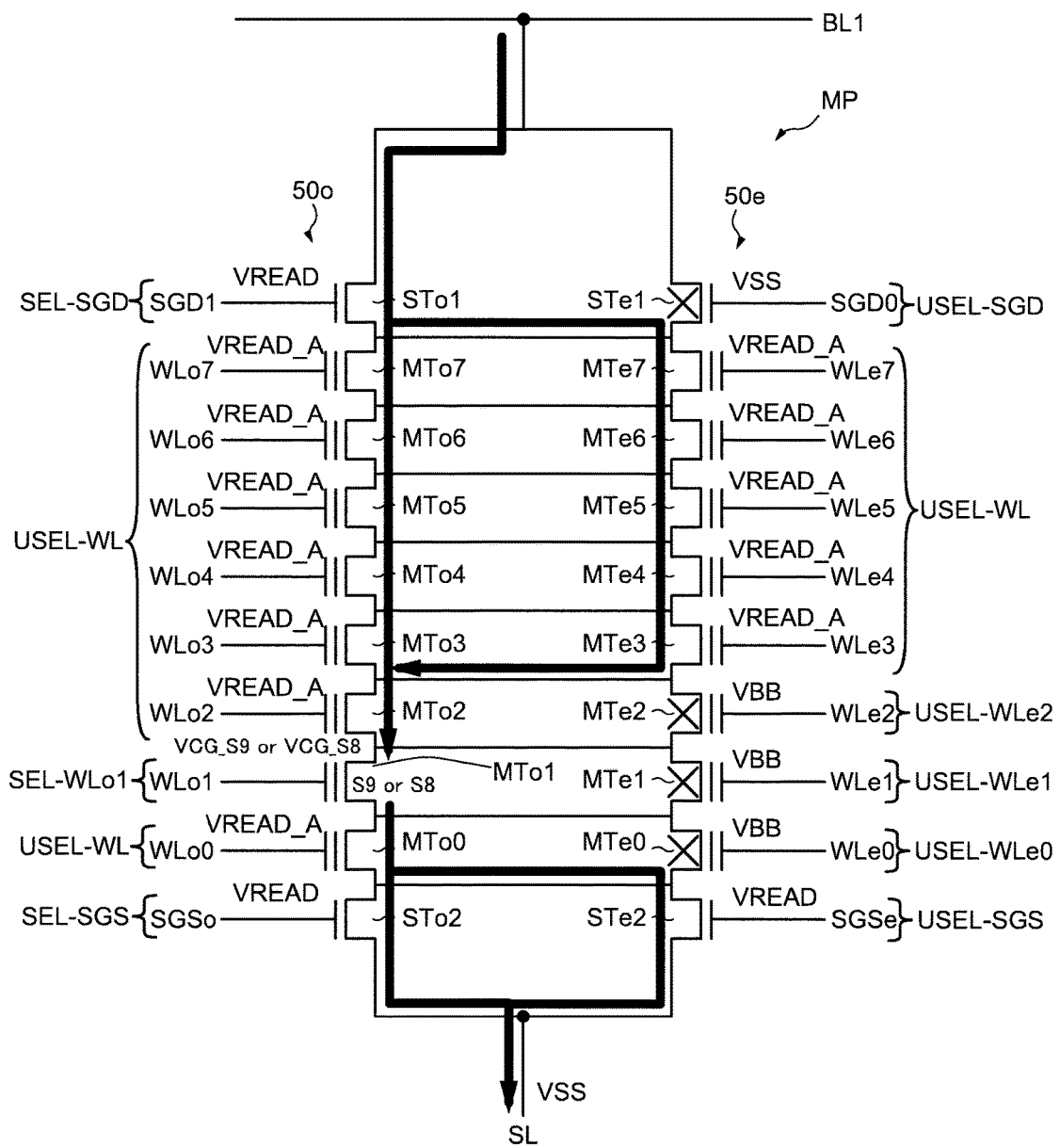
FIG. 32 is an example of a circuit diagram for explaining various signals and current paths in a fifth operation period and a sixth operation period shown in FIG. 31.

An example that a verify operation of a fifth operation period is executed will be described with reference to FIG. 31 and FIG. 32. FIG. 32 is an example of a circuit diagram for explaining various signals and current paths in a fifth operation period shown in FIG. 31.

As shown in FIG. 31, similar to the second operation period, the fifth operation period is a period that the sense operation of the verify operation 9VR is executed. In the fifth operation period, the unselected even word lines USEL-WLe0 to 2 are supplied with a voltage VREAD_A from the voltage VREAD. The voltage VREAD_A is a voltage higher than the voltage VREAD supplied to the unselected even word lines USEL-WLe0 to 2 in the semiconductor memory device according to the comparative example (FIG. 25). At time tv3 to time tv4, the control signal STB is asserted (the control signal STB is changed from the "L" level to the "H" level), and the semiconductor memory device 1 according to the second embodiment can determine the threshold voltage corresponding to the state S9.

As shown in FIG. 32, in the fifth operation period, the select transistors STo1 and STo2, the memory cell transistor MTo0, the memory cell transistors MTo2 to 7 (MTo2, MTo3, MTo4, MTo5, MTo6, MTo7), the memory cell transistors MTe3 to 7 (MTe3, MTe4, MTe5, MTe6, MTe7), and the select transistor STe2 are in the on state and the memory cell transistors MTe0 to 2 are in the off state. Therefore, a current flows from the bit line BL1 to the selected memory cell transistor MTo0 in a path indicated by a bold arrow in FIG. 32. A current flows in the path indicated by the bold arrow in FIG. 32 according to the result of determining the threshold voltage corresponding to the state S9. As a result, the semiconductor memory device 1 according to the second embodiment can determine the threshold voltage corresponding to the state S9.

Similar to the second operation period, the order of the sense operation of the verify operation 9VR of the state S9 is earlier than the order of the sense operation of the read operation 9R of the state S9. In the semiconductor memory device 1 according to the second embodiment, the order of the sense operation in the verify operation is different from the order of the sense operation in the read operation, when the order of the sense operation in the verify operation is earlier than the order of the sense operation in the read operation, the voltage supplied to the unselected word line in the verify operation is set higher than the voltage supplied to the unselected word line. As a result, in the semiconductor memory device 1 according to the second embodiment, by controlling the voltage supplied to the unselected word line, the fluctuation of the threshold voltage of the selected memory cell transistor can be suppressed to the minimum, and erroneous reading can be suppressed.

2-2. Example of Verify Operation in Sixth Operation Period (from Time Tv4 to Time Tv6)

An example in which a verify operation in a sixth operation is executed will be described with reference to FIG. 31 and FIG. 32.

As shown in FIG. 31, the sixth operation period is a period that the sense operation of the verify operation 8VR is executed. In the sixth operation period, as in the fifth operation period, the unselected even word lines USEL-WLe0 to 2 are supplied with the voltage VREAD_A from the voltage VREAD. In time tv4 to time tv6, the control signal STB is asserted (the control signal STB is changed from "L" level to "H" level), and the semiconductor memory device 1 according to the second embodiment can determine the threshold voltage corresponding to the state S8.

Even in the sixth operation period, similar to the fifth operation period shown in FIG. 32, a voltage is supplied to each signal, each transistor is controlled, from the bit line BL1 to the selected memory cell transistor MTo0, a current flows in the path indicated by a bold arrow in FIG. 32. A current flows in the path indicated by the bold arrow in FIG. 32 according to the result of determining the threshold voltage corresponding to the state S8. As a result, the semiconductor memory device 1 according to the second embodiment can determine the threshold voltage corresponding to the state S8.

In the verify operation at this time, the sense operation of the verify operation 8VR of the state S8 is executed second in the program loop (FIG. 20). On the other hand, in the read operation, the sense operation of the read operation 8R in the state S8 is the third of the read operation of the middle page (FIG. 21). Therefore, in the verify operation 8VR of the state S8, similar to the verify operation 9VR of the state S9, the voltage supplied to the selected word line at the time of the verify operation is set higher than the voltage supplied to the selected word line at the time of the read operation. As a result, even in the read operation 8R of the state S8, in the semiconductor memory device 1 according to the second embodiment, the fluctuation of the threshold voltage of the selected memory cell transistor can be suppressed to the minimum, and erroneous reading can be suppressed. The semiconductor memory device 1 according to the second embodiment can determine the threshold voltage corresponding to the state S8.

2-3. Example of Verify Operation in Seventh Operation Period (from Time Tv6 to Time Tv8)

Figure 33:
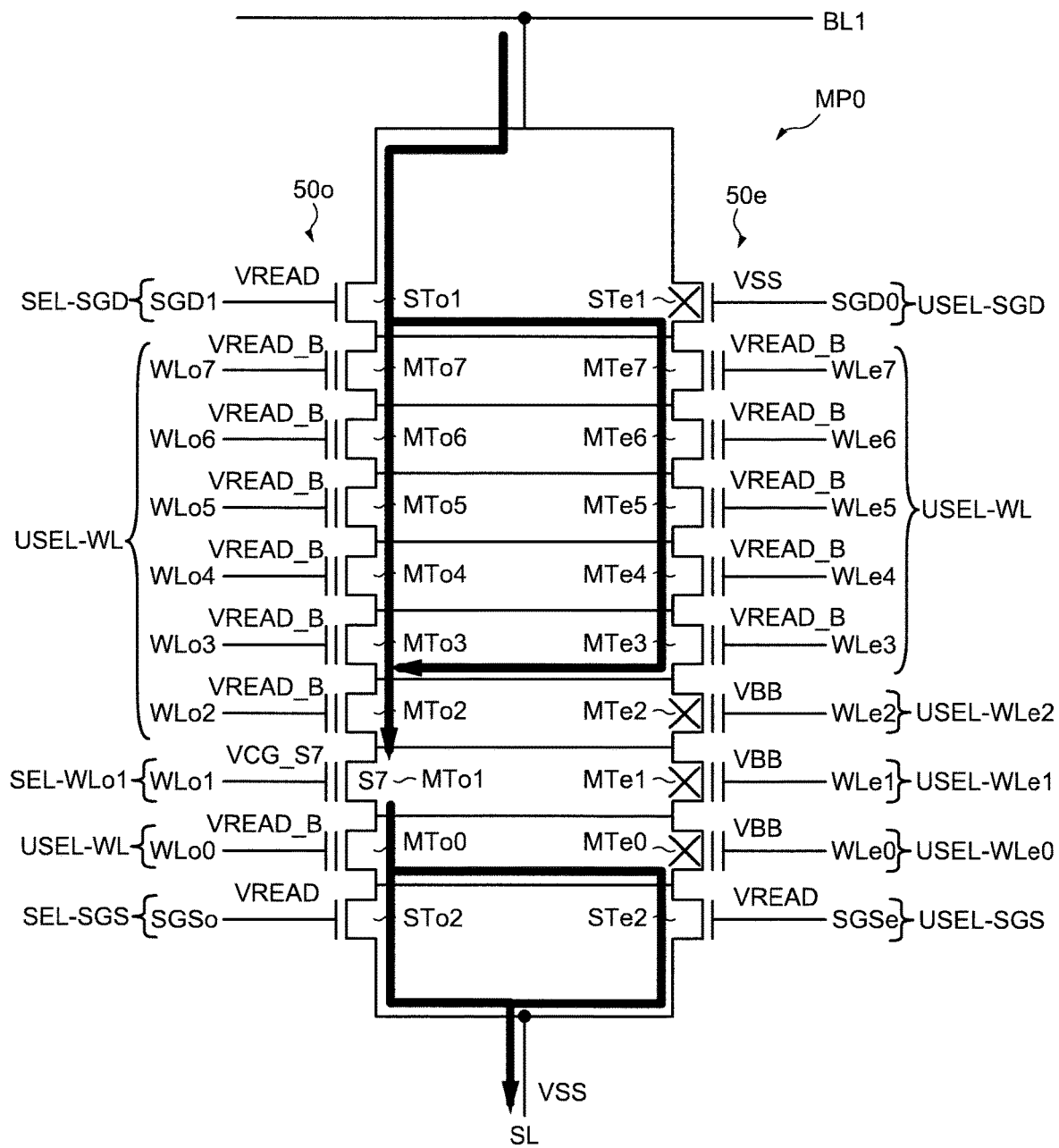
FIG. 33 is an example of a circuit diagram for explaining various signals and current paths in a seventh operation period shown in FIG. 31.

An example in which a verify operation in a seventh operation is executed will be described with reference to FIG. 31 and FIG. 33. FIG. 33 is an example of a circuit diagram for explaining various signals and current paths in a seventh operation period shown in FIG. 31.

As shown in FIG. 31, similar to the fourth operation period, the seventh operation period is a period that the sense operation of the verify operation 7VR is executed. In the seventh operation period, the unselected even word lines USEL-WLe0 to 2 are supplied with a voltage VREAD_B from the voltage VREAD. The voltage VREAD_B is a voltage lower than the voltage VREAD supplied to the unselected even word lines USEL-WLe0 to 2 in the semiconductor memory device according to the comparative example (FIG. 25). At time tv6 to time tv8, the control signal STB is asserted (the control signal STB is changed from the "L" level to the "H" level), and the semiconductor memory device 1 according to the second embodiment can determine the threshold voltage corresponding to the state S7.

As shown in FIG. 33, in the seventh operation period, the select transistors STo1 and STo2, the memory cell transistor MTo0, the memory cell transistors MTo2 to 7 (MTo2, MTo3, MTo4, MTo5, MTo6, MTo7), the memory cell transistors MTe3 to 7 (MTe3, MTe4, MTe5, MTe6, MTe7), and the select transistor STe2 are supplied with the voltage VREAD_B and in the on state, and the memory cell transistors MTe0 to 2 are supplied with the voltage VSS and are in the off state. Therefore, from the bit line BL1 to the selected memory cell transistor MTo0, a current flows in a path indicated by a bold arrow in FIG. 33. A current flows in the path indicated by the bold arrow in FIG. 33 according to the result of determining the threshold voltage corresponding to the state S7. As a result, the semiconductor memory device 1 according to the second embodiment can determine the threshold voltage corresponding to the state S7.

Similar to the second operation period, the order of the sense operation of the verify operation 7VR of the state S7 is later than the order of the sense operation of the read operation 7R of the state S7. In the semiconductor memory device 1 according to the second embodiment, the order of the sense operation in the verify operation is different from the order of the sense operation in the read operation, and when the order of the sense operation in the verify operation is later than the order of the sense operation in the read operation, the voltage supplied to the unselected word line in the verify operation is set lower than the voltage supplied to the unselected word line in the read operation. As a result, in the semiconductor memory device 1 according to the second embodiment, by controlling the voltage supplied to the unselected word line, the fluctuation of the threshold voltage of the selected memory cell transistor can be suppressed to the minimum, and erroneous reading can be suppressed.

2-4. Example of Flow of Write Operation

Figure 34:
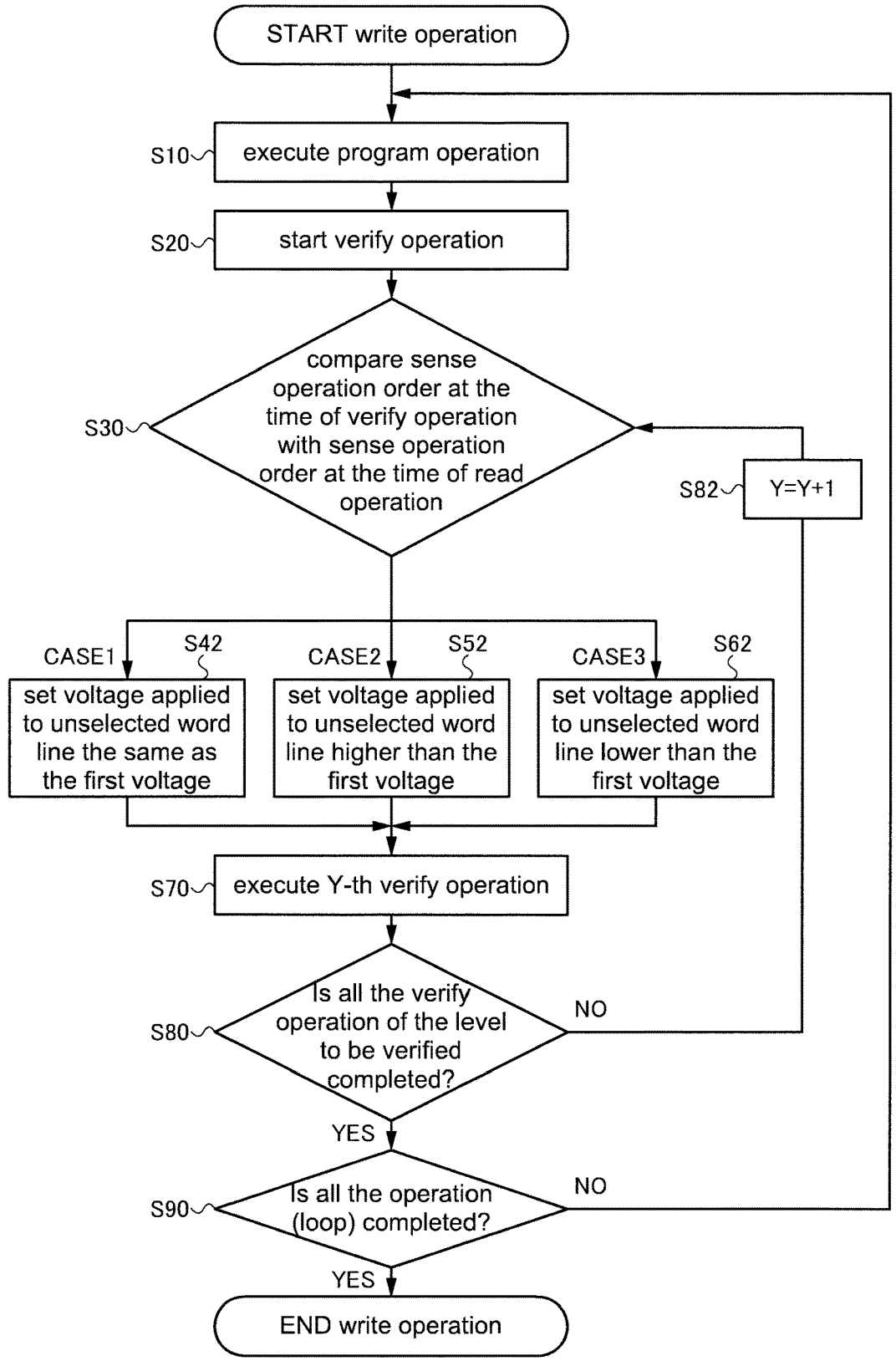
FIG. 34 is a diagram showing a flow chart of a verify operation in a semiconductor memory device according to the second embodiment.
Figure 38:
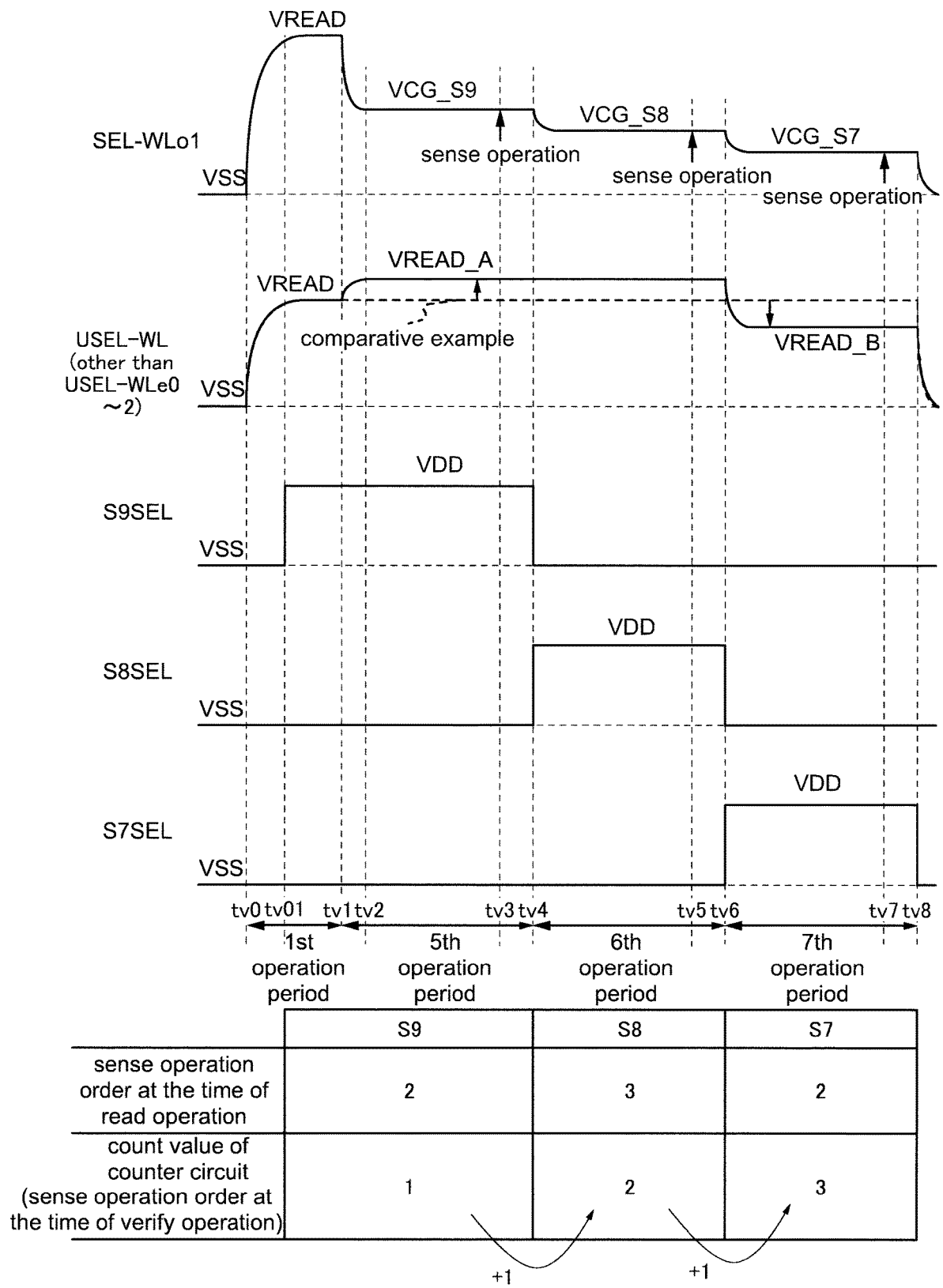
FIG. 38 is a diagram showing a timing chart of various signals at the time of a verify operation in a semiconductor memory device according to the second embodiment.

An example of a flow of the write operation according to the second embodiment will be described with reference to FIG. 34 and FIG. 38. FIG. 34 is a diagram showing a flow chart of the verify operation in the semiconductor memory device 1 according to the second embodiment. An example of the flow of the write operation according to the second embodiment is different in step S42, step S52, and step S62 from the example of the flow of the write operation according to the first embodiment, and the other points are the same. In an example of the flow of the write operation according to the second embodiment, points different from the example of the flow of the write operation according to the first embodiment will be mainly described. In addition, the selected odd word line SEL-WLo1 and the unselected even word line USEL-WL (other than unselected even word lines USEL-WLe0 to 2) shown in FIG. 38 are similar to the selected odd word line SEL-WLo1 and the unselected even word line USEL-WL (other than the unselected even word lines USEL-WLe0 to 2) described with reference to FIG. 31, and a description of the selected odd word line SEL-WLo1 shown in FIG. 38 is omitted here. The explanation of the state S8 selection signal S8SEL, the state S9 selection signal S9SEL, the sense operation order and counter circuit count values (the sense operation order at the time of the verify operation) during read operations excluding the selected odd word line SEL-WLo1 and the unselected even word line USEL-WL (other than the unselected even word lines USEL-WLe0 to WLe2) in the fifth operation period to the seventh operation period in FIG. 38 is the same as that with the second operation period to the fourth operation period replaced by the fifth operation period to the seventh operation period in the respective explanations in the second operation period to the fourth operation period in FIG. 31. Therefore, the detailed description here is omitted.

Similar to the first embodiment, in step S30, the sequencer 24 uses the internal signal to recognize the state of the verify operation started at that time. Subsequently, the sequencer 24 compares the sense operation order at the time of the read operation of the state of the started verify operation with the count value of the counter circuit (the sense operation order at the time of the verify operation) to generate a comparison result.

The sequencer 24 determines the relationship between the sense operation order in the verify operation and the sense operation order in the read operation using the comparison result.

As a result of the determination, when the sense operation order at the time of the verify operation is the same as the sense operation order at the time of the read operation, that is CASE1 in step S30, step S42 is executed. When the sense operation order at the time of the verify operation is earlier than the sense operation order at the time of the read operation, that is CASE2 in step S30, step S52 is executed. When the sense operation order at the time of the verify operation is later than the sense operation order at the time of the read operation, that is CASE3 in step S30, step S62 is executed.

In step S52, for example, the sequencer 24 sets the voltage supplied to the unselected word line at the time of the verify operation higher than the voltage supplied to the unselected word line at the time of the read operation. In step S52, the sense amplifier 70, the row decoder 29, the voltage generation circuit 27, and the driver set 28, and the like are controlled so as to execute the verify operation using a voltage set higher than the voltage supplied to the unselected word line at the time of the read operation. The semiconductor memory device 1 executes the verify operation.

For example, as described in step S30 of "2-1. Fifth operation period" and "1-2-2-6. Example of flow of write operation", when the sense operation of the verify operation 9VR of the state S9 is earlier than the sense operation of the read operation 9R of the state S9, in step S30, the sequencer 24 compares the order (first) of the sense operation of the verify operation 9VR of the state S9 with the order (second) of the sense operation of the read operation of the state S9 to generate a comparative result. Based on the comparative result, when it is determined that the sense operation of the verify operation 9VR of the state S9 is earlier than the sense operation of the read operation 9R of the state S9, a determination result including that the sense operation of the verify operation 9VR of the state S9 is earlier than the sense operation of the read operation 9R of the state S9 is generated. In step S52, by using the determination result (that the sense operation of the verify operation 9VR of the state S9 is earlier than the sense operation of the read operation 9R of the state S9), the sequencer 24 sets the voltage supplied to the unselected word line at the time of the read operation to the voltage VREAD_A higher than the voltage VREAD. Further, in step S70 following step S52, for example, as shown in FIG. 31 and FIG. 38, the sequencer 24 controls the sense amplifier 70, the row decoder 29, the voltage generator 27, and the driver set 28 and the like to execute the verify operation 9VR using the voltage VREAD_A. The semiconductor memory device 1 executes the verify operation.

In step S82, the sequencer 24 counts up the numerical value Y (1 in this case) by 1 to make it to the numerical value 2, and executes step S30. In step S30 after step S82, the sequencer 24 compares the sense operation order at the time of the verify operation and the sense operation order at the time of the read operation with respect to the second verify operation 8VR, and generates a comparison result. For example, as described in step S30 of "2-2. Sixth operation period" and "1-2-2-6. Example of flow of write operation", when the sense operation of the verify operation 8VR of the state S8 is earlier than the sense operation 8R of the state S8, in step S30, the sequencer 24 compares the order (second) of the sense operation of the verify operation 8VR of the state S8 with the order (third) of the sense operation of the read operation 8R of the state S8, and generates a comparative result. Based on the comparative result, when it is determined that the sense operation of the verify operation 8VR of the state S8 is earlier than the sense operation of the read operation 8R of the state S8, a determination result including that the sense operation of the verify operation 8VR of the state S8 is earlier than the sense operation of the read operation 8R of the state S8 is generated. Subsequently, in step S52, using the determination result (that the sense operation of the verify operation 8VR of the state S8 is earlier than the sense operation of the read operation 8R of the state S8), the sequencer 24 sets the voltage supplied to the unselected word line at the time of the read operation to the voltage VREAD_A higher than the voltage VREAD. Further, in step S70 following step S52, as shown in FIG. 31 and FIG. 38, the sequencer 24 controls the sense amplifier 70, the row decoder 29, the voltage generation circuit 27, and the driver set 28 and the like to execute the second verify operation 8VR using the voltage VCG_S8U. The semiconductor memory device 1 executes the verify operation.

For example, as described in step S30 of "2-3. Seventh operation period" and "1-2-2-6. Example of flow of write operation", when the sense operation of the verify operation 7VR of the state S7 is later than the sense operation of the read operation 7R of the state S7, in step S30, the sequencer 24 compares the order (third) of the sense operation of the verify operation 7VR of the state S7 with the order (second) of the sense operation of the read operation of the state S7, and generates a comparative result. Based on the comparative result, when it is determined that the sense operation of the verify operation 7VR of the state S7 is later than the sense operation of the read operation 7R of the state S7, a determination result including that the sense operation of the verify operation 7VR of the state S7 is later than the sense operation of the read operation 7R of the state S7 is generated. In step S62, by using the determination result (that the sense operation of the verify operation 7VR of the state S7 is later than the sense operation of the read operation 7R of the state S7), the sequencer 24 sets the voltage supplied to the unselected word line at the time of the read operation to the voltage VREAD_B lower than the voltage VREAD. Further, in step S70 following step S62, for example, as shown in FIG. 31 and FIG. 38, the sequencer 24 controls the sense amplifier 70, the row decoder 29, the voltage generator 27, and the driver set 28 and the like, to execute the third verify operation 7VR using the voltage VREAD_B. The semiconductor memory device 1 executes the verify operation.

Although not exemplified in FIG. 38, in step S42, for example, the sequencer 24 sets the voltage supplied to the unselected word line at the time of the verify operation the same voltage supplied to the unselected word line at the time of the read operation. In this case, in step S42, the sense amplifier 70, the row decoder 29, the voltage generation circuit 27, and the driver set 28 and the like are controlled to execute the verify operation using the voltage set identically to the voltage supplied to the unselected word line at the time of the read operation. The semiconductor memory device 1 executes the verify operation.

In this embodiment, although it is assumed that the reference value of the voltage supplied to the unselected word line at the time of the verify operation is the same as the voltage supplied to the unselected word line at the time of the read operation, it is not limited thereto. For example, the reference value of the voltage supplied to the unselected word line at the time of the verify operation may be set lower than the voltage supplied to the unselected word line at the time of the read operation. In this case, at the time of the verify operation in step S42, the sequencer 24 sets the voltage supplied to the unselected word line to be lower than the voltage supplied to the unselected word line at the time of the read operation. The sequencer 24 sets the voltage supplied to the unselected word line at the time of the verify operation in step S62 to be lower than the voltage set in step S42. Similarly, the sequencer 24 sets the voltage supplied to the unselected word line at the time of the verify operation in step S52 to be higher than the voltage set in step S42.

In the verify operation of the semiconductor memory device 1 according to the second embodiment, by controlling the voltage supplied to the unselected word line at the time of the read operation, the fluctuation of the threshold voltage of the selected memory cell transistor can be suppressed to the minimum, and erroneous reading can be suppressed.

In the first embodiment and the second embodiment, the expression of "connection" refers to an electrical connection. For example, in the electrical connection between a first element and a second element, it is not excluded that another element is provided between the first element and the second element.

While several embodiments of the present disclosure have been described above, these embodiments have been presented as examples and are not intended to limit the scope of the invention. These novel embodiments can be implemented in various other forms and may be implemented in combination as appropriate without departing from the spirit of the invention, and various omissions, substitutions, and modifications may be made. These embodiments and modifications thereof are included in the scope and gist of the invention and are also included in the scope of the invention described in the claims and the scope of equivalents thereof.

What is claimed is:

1. A semiconductor memory device comprising:
a plurality of bit lines arranged in first direction and each of the plurality of bit lines extending in second direction intersecting the first direction, the plurality of bit lines including a first bit line;
a first semiconductor pillar extending in third direction intersecting the first direction and the second direction, the first semiconductor pillar having
   i first memory cells (i is an integer of 4 or more) arranged along the third direction at one side of the first semiconductor pillar in the second direction, electrically connected to the first bit line, electrically connected in series and each capable of being set at a threshold voltage of m or more (m is an integer of 4 or more), and
   i second memory cells arranged along the third direction at the other side of the first semiconductor pillar in the second direction, electrically connected in series and each capable of being set at a threshold voltage of m or more;
i first word lines stacked in the third direction and extending in first direction to be electrically connected to the i first memory cells, respectively;
i second word lines stacked in the third direction and extending in first direction to be electrically connected to the i second memory, respectively;
a driver capable of supplying voltage to each of the i first word lines and each of the i second word lines; and
a logic control circuit capable of executing a write operation to the i first memory cells and the i second memory cells and a read operation to the i first memory cells and the i second memory cells;
wherein
the write operation includes a plurality of loops,
each loop includes a program operation and a verify operation,
on executing the write operation to the k-th first memory cell (k is an integer smaller than i and larger than 1), in each loop,
   when an order of performing a sense operation for determining whether or not the threshold voltage of the k-th first memory cell has reached a j-th threshold voltage (j is an integer of 1 or more and m or less) in the verify operation is different from an order of performing the sense operation for determining whether or not the threshold voltage of the k-th first memory cell exceeds the j-th threshold voltage in the read operation, a first voltage is applied to the k-th first word line during the sense operation for the j-th threshold, and
   when the order of performing the sense operation for determining whether or not the threshold voltage of the k-th first memory cell has reached the j-th threshold voltage in the verify operation is the same with the order of performing the sense operation for determining whether or not the threshold voltage of the k-th first memory cell exceeds the j-th threshold voltage in the read operation, a second voltage different from the first voltage is applied to the k-th first word line during the sense operation for the j-th threshold voltage.

2. The semiconductor memory device according to claim 1, wherein
when the order of performing the sense operation for determining whether or not the threshold voltage of the k-th first memory cell has reached the j-th threshold voltage in the verify operation is earlier than the order of performing the sense operation for determining whether or not the threshold voltage of the k-th first memory cell has reached the j-th threshold voltage in the read operation of the k-th first memory cell,
the first voltage is higher than a voltage applied to the k-th first word line in the read operation.

3. The semiconductor memory device according to claim 1, wherein
when the order of performing the sense operation for determining whether or not the threshold voltage of the k-th first memory cell has reached the j-th threshold voltage in the verify operation is earlier than the order of performing the sense operation for determining whether or not the threshold voltage of the k-th first memory cell has reached the j-th threshold voltage in the read operation of the k-th first memory cell,
the first voltage is lower than a voltage applied to the k-th first word line in the read operation.

4. The semiconductor memory device according to claim 2, wherein
the voltage applied to the k-th second word line connected to the k-th second memory cell is a negative voltage.

5. The semiconductor memory device according to claim 4, wherein
a voltage applied to the k+1st second word line connected to the k+1st second memory cell, and a voltage applied to the k−1st second word line connected to the k−1st second memory cell is a negative voltage.

6. The semiconductor memory device according to claim 5, wherein
the m threshold voltages are 16 threshold voltages.

7. The semiconductor memory device according to claim 6, wherein
the k-th first memory cell faces the k-th second memory cell, the k+1st first memory cell faces the k+1st second memory cell, and the k−1st first memory cell faces the k−1st second memory cell.

8. A semiconductor memory device comprising:

a plurality of bit lines arranged in first direction and each of the plurality of bit lines extending in second direction intersecting the first direction, the plurality of bit lines including a first bit line;

a first semiconductor pillar extending in third direction intersecting the first direction and the second direction, the first semiconductor pillar having i first memory cells (i is an integer of 4 or more) arranged along the third direction at one side of the first semiconductor pillar in the second direction, electrically connected to the first bit line, electrically connected in series and each capable of being set at a threshold voltage of m or more (m is an integer of 4 or more), and i second memory cells arranged along the third direction at the other side of the first semiconductor pillar in the second direction, electrically connected in series and each capable of being set at a threshold voltage of m or more;

i first word lines stacked in the third direction and extending in first direction to be electrically connected to the first memory cells, respectively;

i second word lines stacked in the third direction and extending in first direction to be electrically connected to the second memory cells, respectively;

a driver capable of supplying voltage to each of the i first word lines and each of the i second word lines; and a logic control circuit capable of executing a write operation to the i first memory cells and the i second memory cells and a read operation to the i first memory cells and the i second memory cells;

wherein the write operation includes a plurality of loops, each loop includes a program operation and a verify operation, on executing the write operation to the k-th first memory cell (k is an integer smaller than i and larger than 1), in each loop, when an order of performing a sense operation for determining whether or not the threshold voltage of the k-th first memory cell has reached a j-th threshold voltage (j is an integer of 1 or more and m or less) in the verify operation is different from an order of performing the sense operation for determining whether or not the threshold voltage of the k-th first memory cell exceeds the j-th threshold voltage in the read operation, a third voltage is applied to the k-th first word line during the sense operation for the j-th threshold and a fourth voltage is applied to the first word line other than the k-th first word line during the sense operation for the j-th threshold, and when the order of performing the sense operation for determining whether or not the threshold voltage of the k-th first memory cell has reached the j-th threshold voltage in the verify operation is the same with the order of performing the sense operation for determining whether or not the threshold voltage of the k-th first memory cell exceeds the j-th threshold voltage in the read operation, the third voltage is as same as the fourth voltage.

9. The semiconductor memory device according to claim 8, wherein when the order of performing the sense operation for determining whether or not the threshold voltage of the k-th first memory cell has reached the j-th threshold voltage in the verify operation is earlier than the order of performing the sense operation for determining whether or not the threshold voltage of the k-th first memory cell has reached the j-th threshold voltage in the read operation from the k-th first memory cell, the fourth voltage is higher than the third voltage.

10. The semiconductor memory device according to claim 9, wherein when the order of performing the sense operation for determining whether or not the threshold voltage of the k-th first memory cell has reached the j-th threshold voltage in the verify operation is later than the order of performing the sense operation for determining whether or not the threshold voltage of the k-th first memory cell has reached the j-th threshold voltage in the read operation from the k-th first memory cell, the fourth voltage is lower than the third voltage.

11. The semiconductor memory device according to claim 9, wherein the voltage applied to the k-th second word line connected to the k-th second memory cell is a negative voltage.

12. The semiconductor memory device according to claim 11, wherein a voltage applied to the k+1st second word line connected to the k+1st second memory cell, and a voltage applied to the k−1st second word line connected to the k−1st second memory cell is a negative voltage.

13. The semiconductor memory device according to claim 12, wherein the m threshold voltages are 16 threshold voltages.

14. The semiconductor memory device according to claim 13, wherein the k-th first memory cell faces the k-th second memory cell, the k+1st first memory cell faces the k+1st second memory cell, and the k−1st first memory cell faces the k−1st second memory cell.

* * * * *